(12) United States Patent
Hirobe et al.

(10) Patent No.: US 6,304,509 B1
(45) Date of Patent: Oct. 16, 2001

(54) SEMICONDUCTOR STORAGE UNIT

(75) Inventors: Atsunori Hirobe; Kyouichi Nagata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/443,624

(22) Filed: Nov. 19, 1999

(30) Foreign Application Priority Data

Nov. 20, 1998 (JP) .................................. 10-331793

(51) Int. Cl.$^7$ ...................................................... G11C 8/00
(52) U.S. Cl. ............................ 365/230.03; 365/230.06; 365/51; 365/63
(58) Field of Search ........................ 365/230.03, 230.06, 365/51, 52, 63

(56) References Cited

U.S. PATENT DOCUMENTS 5,949,732 * 9/1999 Kirihata ........................... 365/230.03

FOREIGN PATENT DOCUMENTS 11-14464   5/1999 (JP).

* cited by examiner

*Primary Examiner*—Huan Hoang
(74) *Attorney, Agent, or Firm*—Hutchins, Wheeler & Dittmar

(57) ABSTRACT

A semiconductor storage unit to be disclosed includes a bank block ($23_1$) having banks ($25_1$) and ($25_2$) with memory cell arrays ($31_1$) and ($31_2$), global I/O lines ($26_1$) and ($26_2$), I/O amplifier ($28_1$) and ($28_2$) and column decoder groups ($35_1$) and ($35_2$); and a bank selective circuit ($29_1$) provided in common with the bank blocks ($25_1$) and ($25_2$) that produces a column select signal $YS_0$ or $YS_1$ for activating the corresponding column decoder on the basis of bank select signals $BS_0$ to $BS_2$ and $/BS_0$ to $/BS_2$ and a column multi-select delay signal $YMD_0$ for activating the corresponding I/O amplifier ($28_1$) or ($28_2$). Thereby, it is possible to reduce the number of wiring lines in a semiconductor storage unit with a plurality of banks and to normally perform a test such as fault analysis or the like.

26 Claims, 29 Drawing Sheets

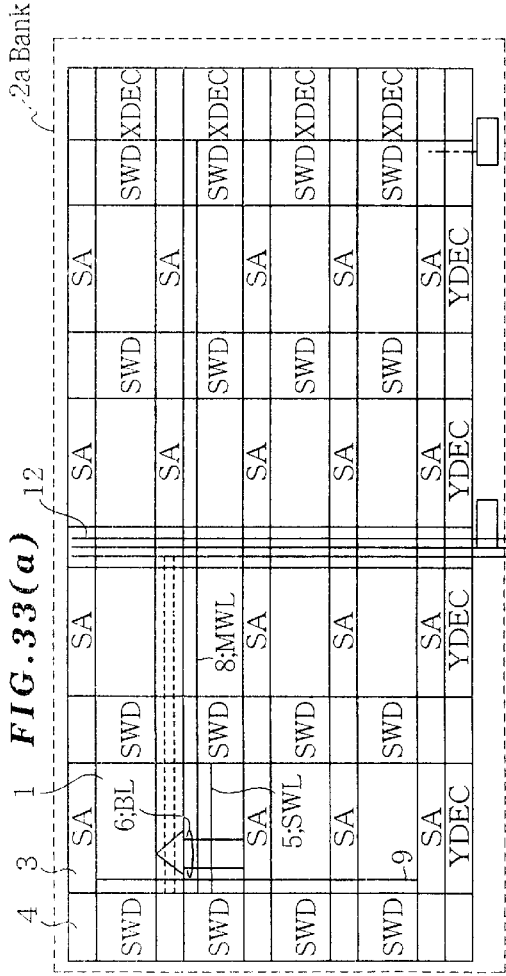
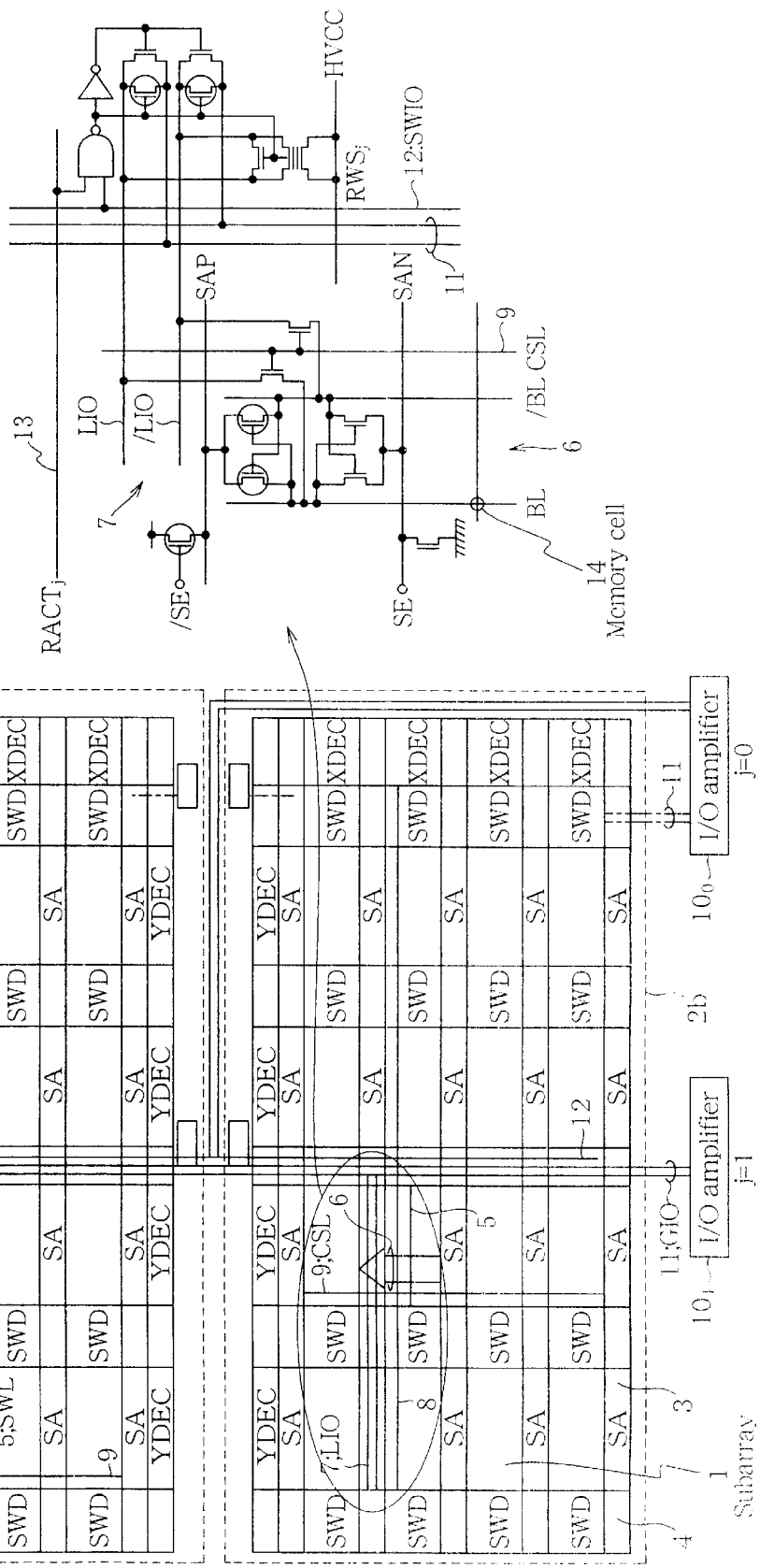
FIG. 33(a)
FIG. 33(b)

SEMICONDUCTOR STORAGE UNIT

BACKGROUND OF THE INVENTION

1. Field of the Invention

The present invention relates to a semiconductor storage unit and in particular to a semiconductor storage unit with a plurality of banks.

2. Description of the Prior Art

FIG. 33 shows one example of electric configuration of the conventional semiconductor storage unit disclosed in Japanese Patent Application No. 9-305505, where (a) and (b) are a block diagram showing the electric configuration of the main part and a circuit diagram showing a configurational example of a circuit provided inside the block diagram shown in FIG. 33(a), respectively.

As shown in FIG. 33(a), the semiconductor storage unit of this example comprises two banks 2a and 2b with a plurality of subarrays 1, 1, . . . arranged in a matrix form. The banks 2a and 2b each comprise: the respective sense amplifier columns (SA) 3, 3, . . . and the respective subword driver columns (SWD) 4, 4, . . . for individual subarrays 1, 1, . . . the respective subword lines (SWL) 5, 5, . . . wired in the X direction (horizontal direction in the figure) of a subarray 1 for individual subarrays 1, 1, . . . ; and the respective bit lines (BL) 6, 6, . . . wired in the Y direction (vertical direction in the figure) of a subarray 1 for individual subarrays 1, 1, . . . ; the respective local I/O lines (LIO) 7, 7, . . . and the respective main word lies (MWL) 8, 8, . . . wired in the X direction of a subarray 1; and the respective column selection line (CSL) 9, 9, . . . wired in the Y direction of a subarray 1 for individual subarrays 1, 1, . . . .

Besides, provided in common to the banks 2a and 2b are global I/O lines (GIO) 11 connected to I/O amplifiers $10_0$ and $10_1$, comprising write amplifiers, data amplifier or the like in the Y direction of subarray 1, controlled by a logical sum of signals conveyed over a column selection line 9, and switch lines (SWIO) 12 which is wired in the same direction as the global I/O lines 11 with one for each arranging column of the global I/O lines 11 and along which signals RWSRj indicating the active state of columns for connecting local I/O lines 7 and global I/O lines 11 are conveyed.

Next, the operation of the semiconductor storage unit configured above will be described. First, when the bank 2a is selected in accordance with a signal RACTj conveyed over the signal line 13 for indicating the active state of the row, a main word line 8 and a sub-word line 5 provided on the bank 2a are activated and moreover a signal SE for activating the sense amplifier column 3 stands up. When a sub-word line 5 is activated, bit lines 6 connected to the sub-word line 5 are gradually activated. Besides, activation of the sense amplifier column 3 by the signal SE causes the leading of a signal SAP.

Next, at the same time when a column selection line 9 provided on any subarray 1 is activated, a switch line 12 for connecting a local I/O line 7 and a global I/O line 11 provided on the subarray 1 is activated. Thereby, the local I/O line 7 and the global I/O line 11 provided on the subarray 1 are connected, both of them are gradually activated, and the data written in the memory cell 14 present on a bit line 6 of a desired subarray 1 in the bank 2a are read out.

Thereafter, when the column selection line 9 and the switch line 12 in the bank 2a becomes inactive and a column selection line 9 and a switch line 12 in the bank 2b are activated instead, a local I/O line 7 and a global I/O line 11 provided on the subarray 1 in the bank 2b are connected, both of them are gradually activated, and the data written in the memory cell 14 present on a bit line 6 of a desired subarray 1 in the bank 2b are read out.

Incidentally, the operation till the column selection line 9 and the switch line 12 in the bank 2b are activated will be omitted, because of being almost similar to that in the bank 2a.

BRIEF SUMMARY OF THE INVENTION

Object of the Invention

Meanwhile, in the above conventional semiconductor unit, indeed since global I/O lines 11 are provided in common to the banks 2a and 2b and moreover switch lines 12 are wired with one for each arranging column of the global I/O lines 11 in the same direction as the global I/O lines 11, the number of wiring lines can be reduced and the chip area can be minimized as compared with a case where they are provided respectively for individual banks or for individual subarrays.

In the conventional semiconductor unit, however, since the number of signal lines for conveying the signal of an I/O amplifier 10 or signal lines for conveying the signal for activating a column decoder (YDEC in FIG. 33) or the like cannot be reduced, there was a limit to the reduction of the chip area in the semiconductor storage unit.

Besides, in the above semiconductor storage unit, since global I/O lines 11 are provided in common to the banks 2a and 2b, the time taken to convey data on a global I/O line 11 lengthens as compared with a case where I/O lines are provided respectively for individual banks. Accordingly, considering the delay of data on a global I/O line 11, a column decoder or an I/O amplifier must be activated, but no account whatever is made of this point in the conventional semiconductor storage unit. For this reason, with the connecting configuration of the I/O amplifier 100 and the I/O amplifier 10, to a common data I/O bus, for example, there is a fear that data read out from the respective banks 2 might collide with each other on a data I/O bus in a continuous readout of data from the banks 2a and 2b.

Furthermore, in the above conventional semiconductor storage unit, a local I/O line 7 and a global I/O line 11 are connected in accordance with a signal $RWS_j$ conveyed on the switch line 12, but no generation circuit for generating a signal $RWS_j$ is disclosed. Thus, there was a disadvantage in that switching for selecting the connection to a local I/O line 7 and the connection to a global I/O line 11 cannot be concretely implemented without any damage to data read from the banks 2a and 2b or data written into the banks 2a and 2b.

Besides, Japanese Patent Application No. 9-305505 describes that short-circuiting a global I/O line 11 during the switching period between the control over the bank 2a and the control over the bank 2b shortens the time until the subsequent operation begins, but discloses no specific circuits whatever. Thus, there was a disadvantage in that no speedup of operation in the switching time mentioned above is specifically implementable.

Besides, in a large capacity semiconductor storage unit, the test mode in which data are written into a plurality of bank at a time or read out at a time is provided to shorten the time for a fault analysis or an estimating test and there are cases where a test signal for this mode is supplied to the semiconductor storage unit. In the case of a global I/O lines 11 provided in common to the upper and lower banks 2a and 2b like the above conventional semiconductor storage unit, there was another demerit that supplying a test signal as it is allows data read out from individual banks 2a and 2b and conveyed to collide with each other in the global I/O line 11, thereby disabling the test to be normally carried out because the upper and lower buses are simultaneously activated.

Fulfilled in consideration of these circumstances, the present invention has an object in providing a semiconductor storage unit enabling the number of wiring lines to be reduced as well as the collision of data on data I/O buses to be prevented and capable of switching the connection between a local I/O line and a global I/O line without occurrence of damages to data, implementing speedup of the operation in the switching time of control for upper and lower banks and further performing a test normally and in a short time about fault analysis or the like.

SUMMARY OF THE INVENTION

To solve these problems, a semiconductor storage unit claimed in claim 1 comprises: a plurality of bank blocks including a plurality of banks with a memory cell array composed of a plurality of memory cells placed in a matrix form, neighboring to each other, a plurality of global I/O lines provided in parallel to the arranging direction of the above banks and in common therewith for conveying data read out from any of the memory cells in a memory cell array configuring the above banks or data to be written in any of the memory cells, a plurality of I/O amplifiers connected to individual global I/O lines for amplifying data conveyed by corresponding global I/O lines or data to be conveyed from this on, and a plurality of column decoders provided in common to the above banks for respectively outputting a plurality of column selection switches for setting the bit lines corresponding to the memory cell array configuring any of the banks at the selected state; and a plurality of bank selective circuit, provided in common with the bank configuring a corresponding bank block for each of the above bank blocks which produce a column decoder activation signal for activating the corresponding column decoder in accordance with multi-bit bank address signal for selecting any one of all banks configuring the above bank blocks and an I/O amplifier activation signal for activating the corresponding I/O amplifier.

The invention claimed in claim 2 relates to a semiconductor storage unit as set forth in claim 1, characterized in that the above bank selective circuits makes a logical sum of bank selection signals for selecting any one of the banks configuring the corresponding bank block produced from the above multi-bit bank address signal and produces the above I/O amplifier activation signal.

The inventions claimed in claims 3 and 4 relate to a semiconductor storage unit as set forth in claim 1 or 2, characterized in that the above bank selective circuits makes a logical sum of bank selection signals for selecting any one of the banks configuring the corresponding bank block produced from the above multi-bit bank address signal and produces the above column decoder activation signal.

The invention claimed in claim 5 relates to a semiconductor storage unit as set forth in claim 1, characterized in that the above bank selective circuits produce the above column decoder activation signal and the above I/O amplifier activation signal in accordance with a bank block selection signal for selecting a corresponding bank block, produced from a part of the bits configuring the above multi-bit bank address signal.

The inventions claimed in claims 6 to 8 relates to a semiconductor storage unit as set forth in any one of claims 1 to 3, characterized in that in place of the above column decoder activation signal and the above I/O amplifier activation signal, the above bank selective circuits output the respective signals making logical product of the multi-bits corresponding to the banks configuring the bank block of the above multi-bit column address signals with the above column decoder activation signal and the above I/O amplifier activation signal.

The inventions claimed in claims 9 to 11 relate to a semiconductor storage unit as set forth in any one of claims 1 to 3, characterized in that the above bank selective circuits comprises a test circuit that make a logical sum of a test signal for accomplishing a fault analysis or an estimation test with the above bank selection signal or the above bank block selection signal to produce at least one of the above I/O amplifier activation signal or the above column decoder activation signal and make a logical product between the respective signals making a logical product of the above test signal with the multi-bits corresponding to the banks configuring the bank block of a multi-bit column address signal and the signal making a logical product of the inverted signal of the above test signal with the above column decoder activation signal to produce a column decoder signal for each bank.

The inventions claimed in claims 12 to 14 relate to a semiconductor storage unit as set forth in any one of claims 1 to 3, characterized in that the above bank selective circuits make a logical sum between the respective signals making a logical product of a test signal for accomplishing a fault analysis or an estimation test with the multi-bits corresponding to the banks configuring the bank block of a multi-bit column address signal and the above bank selection signal or the above bank block selection signal to produce at least one of the above I/O amplifier activation signal or the above column decoder activation signal.

The inventions claimed in claims 15 to 17 relate to a semiconductor storage unit as claimed in any one of claims 1 to 3, characterized in that the above bank selective circuits output the above I/O amplifier activation signal after the delay of a predetermined time from the input of the above multi-bit bank address signal.

The inventions claimed in claims 18 to 20 relate to a semiconductor storage unit as set forth in any one of claims 15 to 17, characterized in that with the difference of a predetermined time between the write time of data and the readout time of data, the above bank selective circuits output the above I/O amplifier activation signal.

The inventions claimed in claims 21 to 23 relate to a semiconductor storage unit as claimed in any one of claims 1 to 3, characterized in that the above bank blocks each comprises a connection selective circuit with a plurality of local I/O lines, provided perpendicularly to the above global I/O lines for the above individual memory cell array and allowed to convey data read out from any of the memory cells or data to be written into any of the memory cells in the corresponding memory cell array by being connected to a corresponding global I/O line, for selecting the connection between the above local I/O lines and their corresponding global I/O lines at predetermined intervals in accordance with the above column decoder activation signal.

The inventions claimed in claim 24 and 26 relate to a semiconductor storage unit as claimed in any one of claims 1 to 3, further comprising: an initialization circuit for short-circuiting and initializing the corresponding global I/O line in accordance with the above column decoder activation signal at the time of switchover of data readout from a certain bank to data readout from another bank in a continuous readout case of data from a plurality of banks provided corresponding to the above global I/O line configuring one and the same bank block.

BRIEF DESCRIPTION OF THE DRAWINGS

FIGS. 33(A) and 33(B) are block diagrams showing examples of the electric configuration of a conventional semiconductor storage unit: FIG. 33 (A) is a block diagram showing an example of the electric configuration of the main part; and FIG. 33(B) is a block diagram showing an example of the configuration of a circuit provided inside the block diagram shown in FIG. 33(A).

DETAILED DESCRIPTION OF THE PREFERRED EMBODIMENTS

Figure 1:
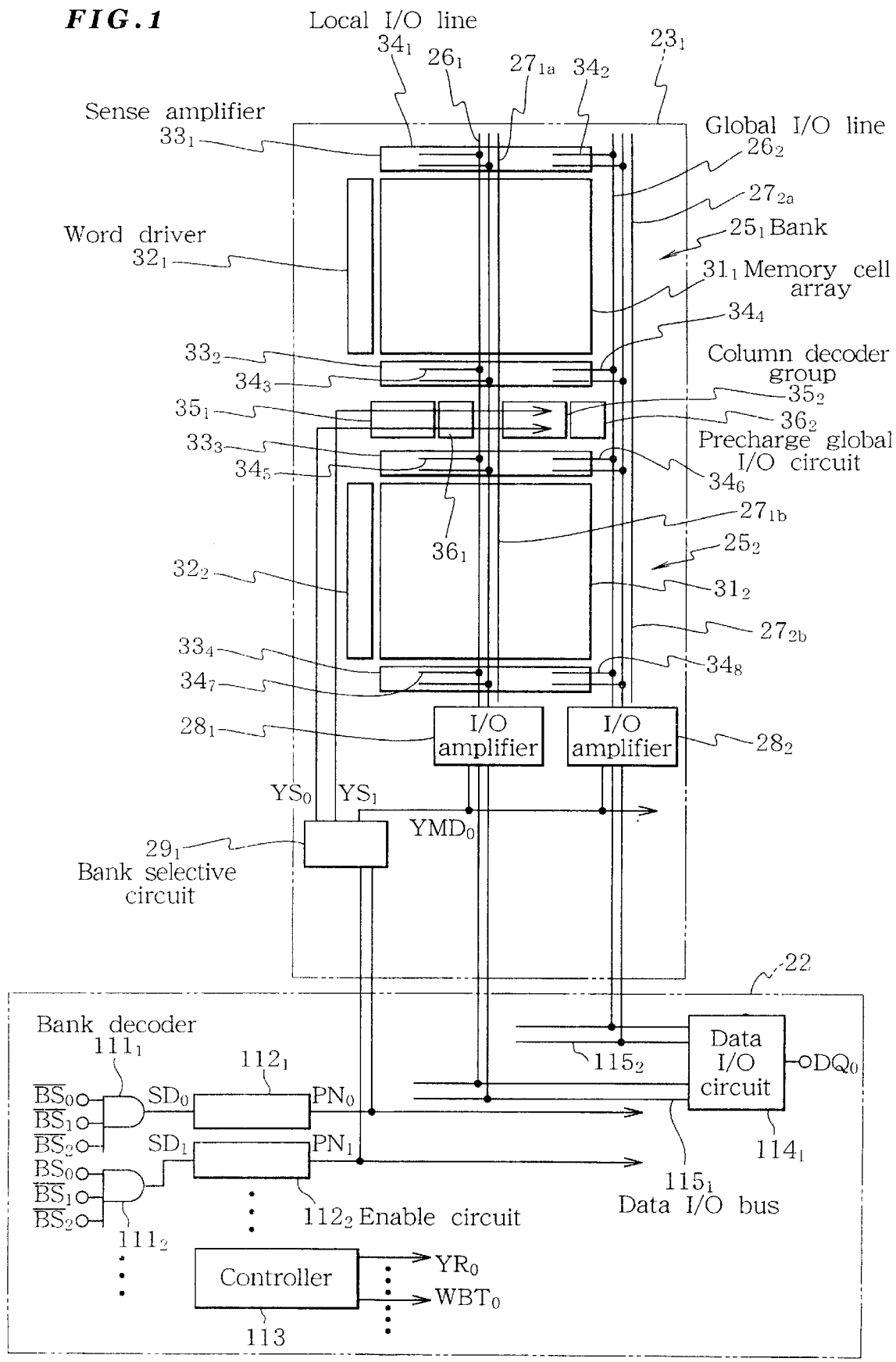
FIG. 1 is a block diagram showing the electric configuration of the main part of a semiconductor storage unit according to Embodiment 1 of the present invention.

Hereinafter, referring to the drawings, embodiments of the present invention will be described. Embodiments are used to specifically make a description.

Figure 2:
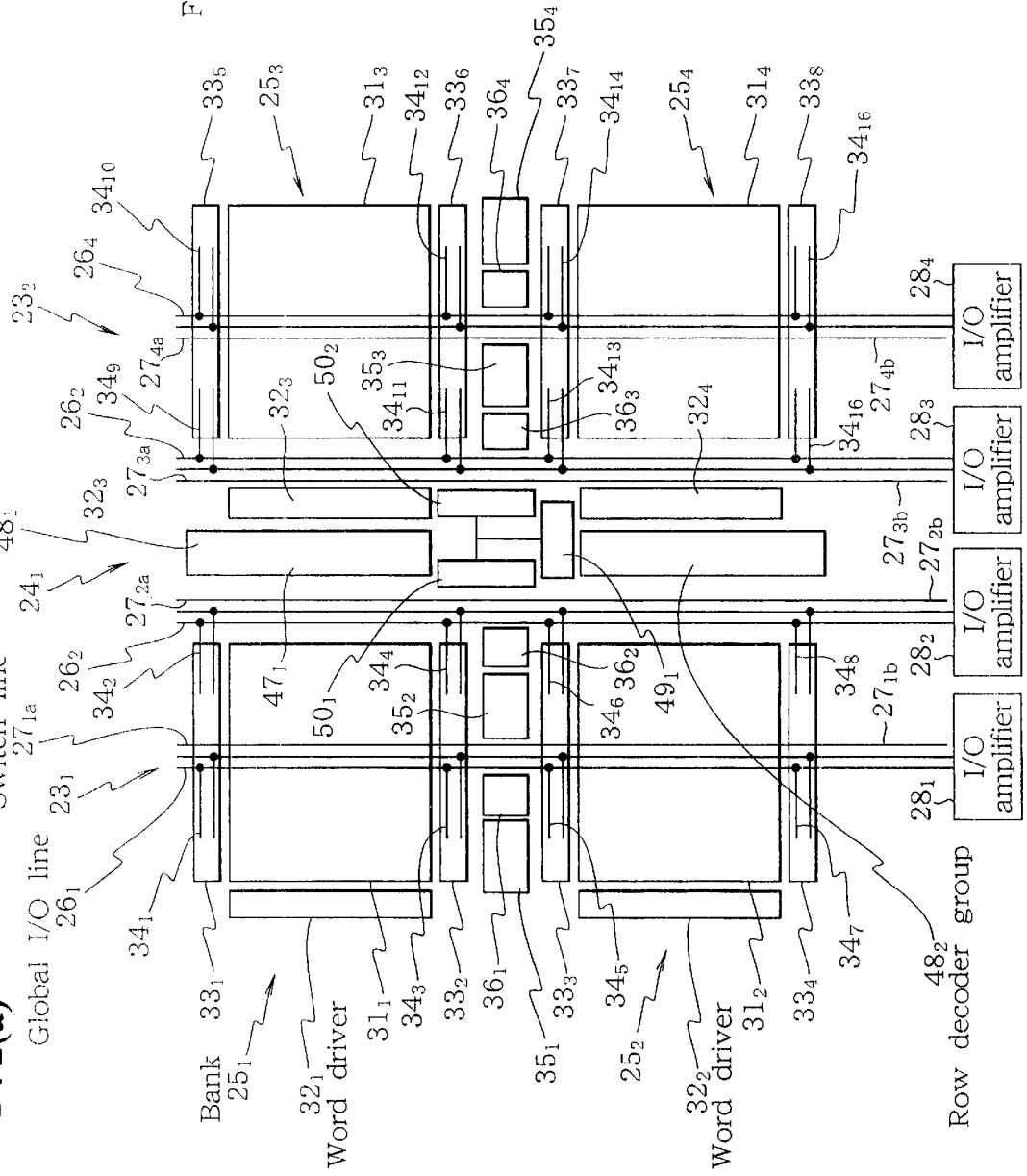
FIGS. 2(A) and 2(B) are block diagrams showing an example of a chip layout of the semiconductor storage unit.

A. Embodiment 1:

FIG. 1 is a block diagram showing the electric configuration of the main part of a semiconductor storage unit according to Embodiment 1 of the present invention. FIG. 2 is one example of a chip layout of the storage device.

As shown in FIG. 2 (B), the semiconductor storage unit of this example broadly comprises a functional block $21_1$ and $21_2$ and a peripheral circuit block 22. The functional block $21_1$ and the functional block $21_2$ differ in the index of components and moreover are the same in configuration except I/O signals and data, so that only the functional block $21_1$ will be described. The functional block $21_1$ broadly comprises bank blocks $23_1$ and $23_2$ and a peripheral circuit block $24_1$. As shown in FIG. 2 (A), the bank block $23_1$ and the bank block $23_2$ are related in plane symmetry concerning the plane perpendicular to the sheet surface at the portion of the peripheral circuit block $24_1$ except word drivers $32_1$ and $32_2$ and word drivers $32_3$ and $32_4$. These bank block $23_1$ and the bank block $23_2$ differ in the index of components and moreover are the same in configuration except I/O signals and data, so that only the bank block $23_1$ will be described.

As shown in FIG. 1, the bank block $23_1$ broadly comprises bank $25_1$ and $25_2$, global I/O lines $26_1$ and $26_2$, switch lines $27_{1a}$, $27_{1b}$, $27_{2a}$ and $27_{2b}$, I/O amplifier $28_1$ ad $28_2$ and a bank selective circuit $29_1$.

The bank $25_1$ broadly comprises a memory cell array $31_1$, a word driver $32_1$, sense amplifiers $33_1$ and $33_2$ and local I/O lines $34_1$ to $34_4$, whereas the bank $25_2$ broadly comprises a memory cell array $31_2$, a word driver $32_2$, sense amplifiers $33_3$ and $33_4$ and local I/O lines $34_5$ to $34_8$. Provided between the bank $25_1$ and the bank $25_2$ are column decoder groups $35_1$ and $35_2$ and precharge global I/O circuits $36_1$ and $36_2$.

In memory cell arrays $31_1$ and $31_2$, a plurality of memory cells are disposed in the shape of a matrix and divided in two. The word drivers $32_1$ and $32_2$ provided respectively corresponding to individual word lines of memory cell arrays $31_1$ and $31_2$ and drive the word lines made in the selection state by the row decoder groups $48_1$ and $48_2$ configuring the peripheral circuit block $24_1$. The sense amplifiers $33_1$ to $33_4$ detect and amplify data read out from a memory cell in the row selected of the memory cell arrays $31_1$ and $31_2$ to a bit line. On respectively being connected to the global I/O lines $26_1$ and $26_2$, the local I/O lines $34_1$ and $34_8$ transmit the data detected and amplified in the sense amplifiers $33_1$ to $33_4$ at the time of data readout and convey the data conveyed by the global I/O lines $26_1$ and $26_2$ to memory cells selected in the memory cell arrays $31_1$ and $31_2$ at the time of data write.

The column decoder groups $35_1$ and $35_2$, provided in common to the banks $25_1$ and $25_2$, comprise a plurality of column decoders for respectively outputting a plurality of column select switches, e.g. $CSL_{10}$ to $CSL_{13}$ and $CSL_{20}$ to $CSL_{23}$, serving to set the sense amplifiers $33_1$ to $33_4$ connected to the corresponding bit lines of the memory cell arrays $31_1$ and $31_2$ at the selection state on the basis of column select signals $YS_0$ and $YS_1$ supplied from the bank selective circuit $29_1$ (e.g. for 8-bank arrangement, the indices take 0 to 7 corresponding to banks $25_1$ to $25_8$).

The precharge global I/O circuits $36_1$ and $36_2$, provided corresponding to the global I/O lines $26_1$ and $26_2$, set the global I/O lines $26_1$ and $26_2$ at the precharge state by short-circuiting the global I/O lines in an access at the time of data readout in accordance with a precharge global signal $PG_0$, taking the "L" level, for example, only in one shot (e.g. for 8-bank arrangement, the indices take 0 to 7 corresponding to the banks $25_1$ to $25_8$) supplied from the second column control section $50_1$ configuring the peripheral circuit block $24_1$. Thereby, the corresponding column select switch is selected and data read out into a bit line and being in the progress of amplification by the sense amplification $33_1$ to $33_4$ are rapidly conveyed to the local I/O lines $34_1$ to $34_8$ without destruction.

Figure 3:
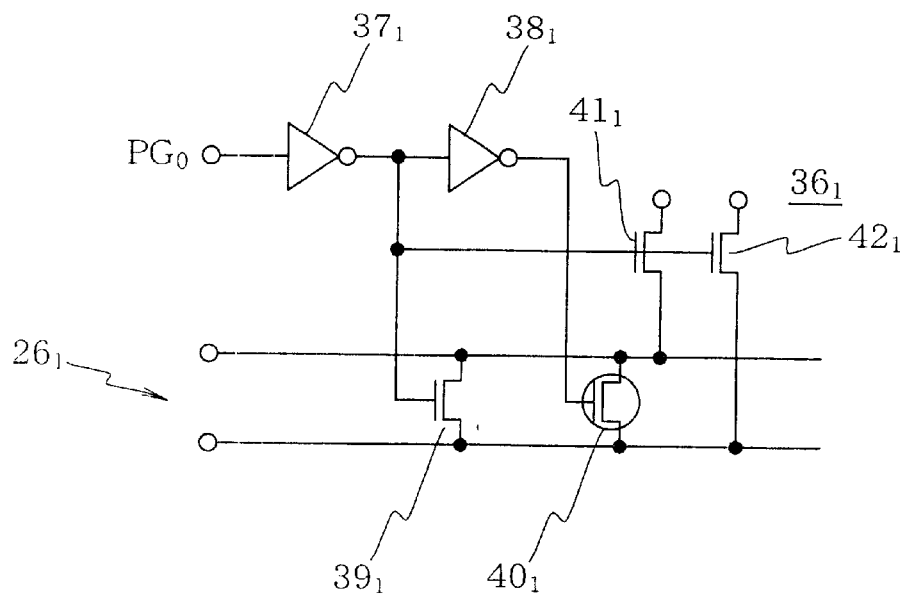
FIG. 3 is a block diagram showing an example of the configuration of a precharge global I/O circuit configuring the semiconductor storage unit.

Here, one example of arrangement for the precharge global I/O circuit $36_1$ is shown in FIG. 3. The precharge global I/O circuit $36_1$ broadly comprises an inverter $37_1$ for inverting a precharge global signal $PG_0$, an inverter $38_1$ for inverting an output signal of the inverter $37_1$, an N-channel FET $39_1$ for turning ON in response to an output signal of the inverter $37_1$ to shunt a pair of global I/O lines $26_1$, a P-channel FET $40_1$ for turning ON in response to an output signal of the inverter $38_1$ to shunt a pair of global I/O lines $26_1$, an N-channel FET $41_1$ for turning ON in response to an output signal of the inverter $37_1$ to apply an electric current voltage to one of a pair of global I/O lines $26_1$ and an N-channel FET $42_1$ for turning ON in response to an output signal of the inverter $37_1$ to apply an electric current voltage to the other of a pair of global I/O lines $26_1$. Incidentally, the arrangement for the precharge global I/O circuit $36_2$ differs in the index of components and moreover are identical to that of the precharge global I/O circuit $36_1$ except for different indices of inputted/outputted signals, so that the description thereof will be omitted.

The global I/O lines $26_1$ and $26_2$ shown in FIG. 1, provided in the common to the banks $25_1$ and $25_2$, convey data conveyed by the local I/O lines $34_1$ to $34_8$ respectively to the I/O amplifiers $28_1$ and $28_2$ and moreover convey data from the I/O amplifier $28_1$ and $28_2$ respectively to the local I/O lines $34_1$ to $34_8$. The switch lines $27_{1a}$, $27_{1b}$, $27_{2a}$ and $27_{2b}$, disposed in parallel to the global I/O lines $26_1$ and $26_2$ and corresponding to the memory cell arrays $31_1$ and $31_2$ divided in two, convey switch signals $SW_0$ and $SW_1$ (indices take 0 to 7 corresponding to the banks $25_1$ to $25_8$), supplied from the second column control section $50_1$ configuring the peripheral circuit block $24_1$. The switch signals $SW_0$ and $SW_1$ are signals for connecting the corresponding global I/O lines $26_1$ and $26_2$ to the local I/O lines $34_1$ to $34_8$ perpendicular to each of the global I/O lines $26_1$ and $26_2$ at the switchover time of an access to the bank $25_1$ and an access to the bank $25_2$.

The I/O amplifiers $28_1$ and $28_2$, provided in common to the banks $25_1$ and $25_2$, broadly comprise a data amplifier activated by a column multi-select delay signal $YMD_0$ supplied from the bank selective circuit $29_1$ (indices take 0 to 3 corresponding to the bank blocks $23_1$ to $23_4$), detected and amplified in the sense amplifiers $33_1$ to $33_4$ and supplied via the local I/O lines $34_1$ to $34_8$ and the global I/O lines $26_1$ and $26_2$, and a write amplifier activated similarly by column multi-select delay signal $YMD_0$ to amplify data supplied from the data I/O circuit $114_1$ via the data I/O bus $115_1$ and $115_2$.

On the basis of enable signals $PN_0$ and $PN_1$ supplied from enable circuits $113_1$ and $113_2$ configuring the peripheral circuit block 22, the bank selective circuit $29_1$, provided in common to the banks $25_1$ and $25_2$, produces column select signals $YS_0$ to $YS_7$ for the control of a plurality of column decoders configuring the column decoder groups $35_1$ and $35_2$ and column multi-select delay signals $YMD_0$ to $YMD_3$.

Figure 4:
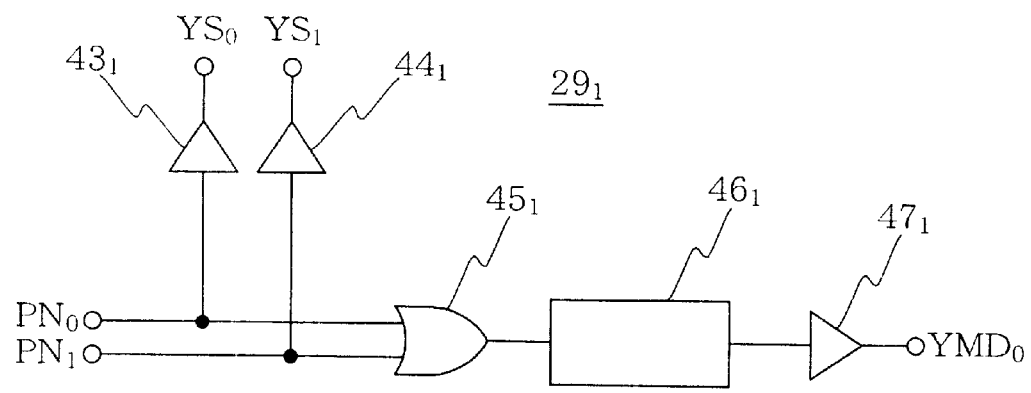
FIG. 4 is a block diagram showing an example of the configuration of a bank select circuit configuring the semiconductor storage unit.

Here, FIG. 4 shows one example of configuration of a bank selective circuit $29_1$. The bank selective circuit $29_1$ broadly comprises a buffer $43_1$ for buffering an enable signal $PN_0$ to output it as a column select signal $YS_0$, a buffer $44_1$ for buffering an enable signal $PN_1$ to output it as a column select signal $YS_1$, an OR gate $45_1$ for making a logical sum of an enable signal $PN_0$ and an enable signal $PN_1$, a delay element $46_1$ for delaying an output signal of the OR gate $45_1$ to cancel the delay (skew delay) for a predetermined time in column decoders configuring the column decoder groups $35_1$ and $35_2$ and a buffer $47_1$ for buffering an output signal of the delay element $46_1$ to output it as a column multi-select delay signal $YMD_0$.

As shown FIG. 2(a), the peripheral circuit block $24_1$ broadly comprises row decoder groups $48_1$ and $48_2$, a first column control section $49_1$ and second column control section $50_1$ and $50_2$. The first column control section $49_1$ and the second column control section $50_1$ and $50_2$ constitute a column control circuit.

The row decoder groups $48_1$ and $48_2$, respectively provided corresponding to the individual word lines of memory cell arrays $31_1$ as well as $31_3$ and memory cell arrays $31_2$ as well as $31_4$, include a plurality of row decoders for decoding unshown row address signals to thus set the corresponding word lines of the memory cell arrays $31_1$ as well as $31_3$ and the memory cell arrays $31_2$ and $31_4$, respectively, to the selected state.

On the basis of a write burst signal $WBT_0$ (indices take 0 to 7 corresponding to banks $25_1$ to $25_8$, while two write burst signals WBT with the same index as the index attached to two banks 25 commonly connected to a global I/O line 26 control either representatively corresponding bank 25) indicating, e.g. the write burst period during the "H" level, supplied from the controller 113 configuring the peripheral circuit block 22 and a column release signal $YR_0$ (indices take 0 to 7 corresponding to banks $25_1$ to $25_8$) for defining the occurring time of various signals, the first column control section $49_1$ produces a column release delay inverted signal $YRD_0$ (indices take 0 to 7 corresponding to banks $25_1$ to $25_8$) obtained by delaying the column release signal $YR_0$ for a predetermined period and inverting the resultant, a column release rear signal $YRR_0$ (indices take 0 to 7 corresponding to banks $25_1$ to $25_8$) indicating the rear of the column release signal $YR_0$, and a column release front signal $YRF_0$ (indices take 0 to 7 corresponding to banks $25_1$ to $25_8$) indicating the front of the column release signal $YR_0$ and moreover produces a column release center signal $YRC_0$ (indices take 0 to 7 corresponding to banks $25_1$ to $25_8$) indicating the center of the column release signal $YR_0$ if the write burst signal $WBT_0$ is a "L" level.

Figure 5:
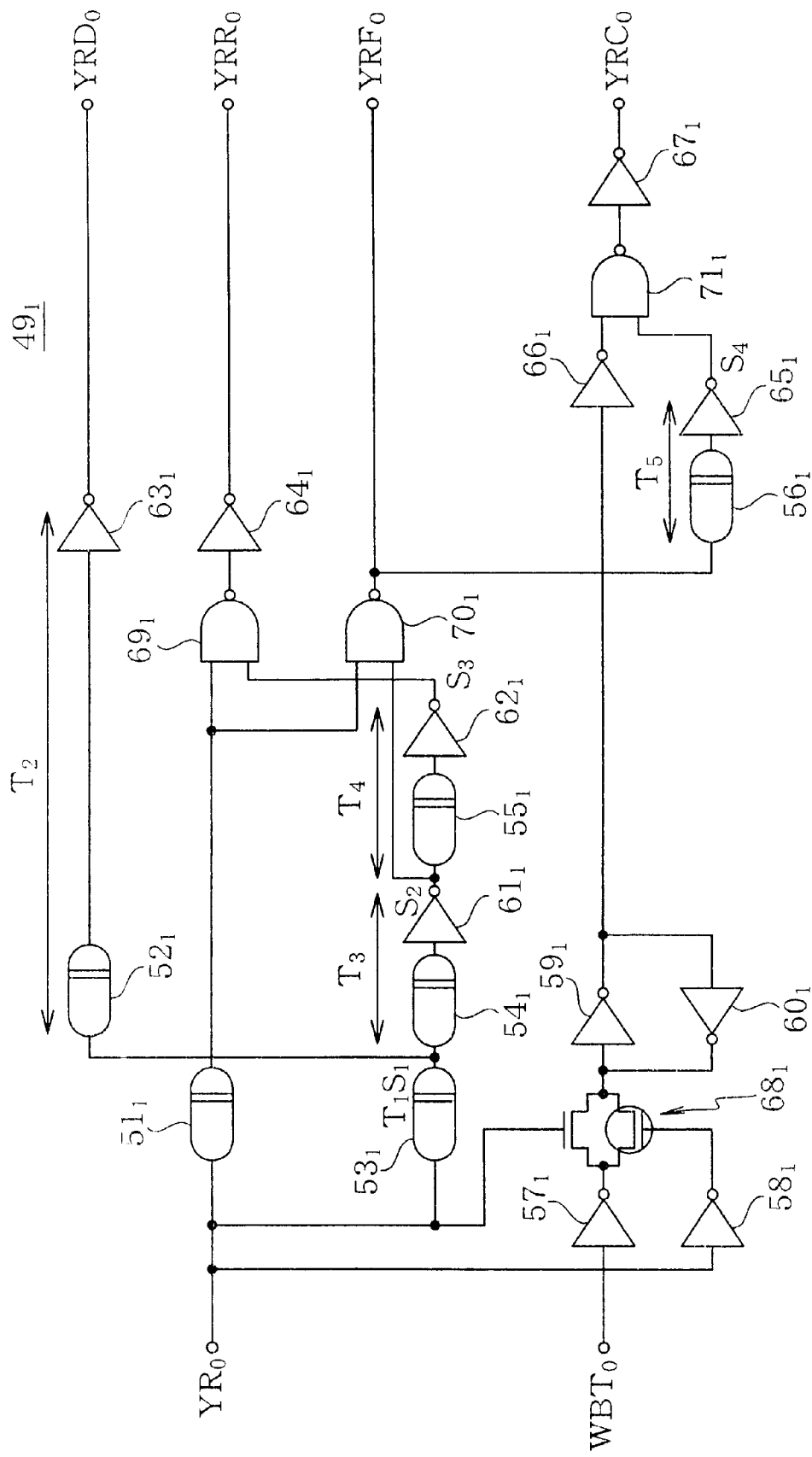
FIG. 5 is a block diagram showing an example of the configuration of a first column control section configuring the semiconductor storage unit.

Here, FIG. 5 shows one example of first column control section $49_1$. The first column control section $49_1$ broadly comprises delay elements $51_1, 52_1, 53_1, 54_1, 55_1$ and $56_1$, inverters $57_1, 58_1, 59_1, 60_1, 61_1, 62_1, 63_1, 64_1, 65_1, 66_1$ and $67_1$, a transfer gate $68_1$ and NAND gates $69_1, 70_1$ and $71_1$. The delay element $53_1$ delays a column release signal $YR_0$ for a time $T_1$, the delay element $52_1$ delays an output signal $S_1$ of the delay element $53_1$ for a predetermined time and the inverter $63_1$ inverts an output signal of the delay element $52_1$ to output the resultant as column release delay inverted signal $YRD_0$. The delay element $51_1$ delays a column release signal $YR_0$ for a predetermined time, the delay element $54_1$ delays an output signal of the delay element $53_1$ for a predetermined time and the inverter $61_1$ inverts an output signal of the delay element $54_1$, the delay element $55_1$ delays an output signal $S2_2$ of the inverter $61_1$ for a predetermined time and the inverter $62_1$ inverts an output signal of the delay element $55_1$. Thereby, the NAND gate $69_1$ makes a logical product of an output signal of the delay element $51_1$ and an output signal $S_3$ of the inverter $62_1$ to thus invert and output the resultant and the inverter $64_1$ inverts an output signal of the NAND gate $69_1$ and outputs the resultant as column release rear signal $YRR_0$. Besides, the NAND gate $70_1$ makes a logical product of an output signal of the delay element $51_1$ and an output signal of the inverter $61_1$ and inverts and outputs the resultant as column release front signal $YRF_0$. The inverter $57_1$ inverts a write burst signal $WBT_0$ and the inverter $58_1$ inverts a column release signal $YR_0$. Thereby, the transfer gate $64_1$ is turned ON/OFF by a column release signal $YR_0$ or an output signal of the inverter $58_1$, thus allowing an output signal of the inverter $57_1$ to pass. The inverter $59_1$ inverts an output signal of the transfer gate $68_1$, the inverter $60_1$ inverts an output signal of the inverter $59_1$ to supply the resultant to the inverter $59_1$, the inverter $66_1$ inverts an output signal of the inverter $59_1$, the delay element $56_1$ delays an output signal of the NAND gate $70_1$ for a predetermined time and the inverter $65_1$ inverts an output signal of the delay element $56_1$. Thereby, the NAND gate $71_1$ makes a logical product of an output signal of the inverter $66_1$ and an output signal $S_4$ of the inverter $65_1$ to invert and output the resultant and the inverter $67_1$ inverts an output signal of the NAND gate $71_1$ to output the resultant as a column releases center signal $YRC_0$.

Besides, on the basis of column select signals $YS_0, YS_1, YS_2$ and $YS_3$ (the respective indices take 0 to 7 corresponding to banks $25_1$ to $25_8$) supplied respectively from the bank selective circuits $29_1$ and $29_2$ configuring the bank blocks $23_1$ and $23_2$, a mode register reset signal MRS of resetting a mode register provided at a controller 113 configuring the peripheral circuit 22 for temporarily holding various information items corresponding to commands of the mode register set, supplied from the outside, and a column release delay inverted signal $YRD_0$, a column release rear signal $YRR_0$, a column release front signal $YRF_0$ and a column release center signal $YRC_0$ supplied from the first column control section $49_1$, the second column control section $50_1$ and $50_2$ shown in FIG. 2(a), respectively provided corresponding to the bank blocks $23_1$ and $23_2$, produce switch signals $SW_0$ and $SW_1$, column decode latch signals $YPT_0$ and $YPT_1$ (the respective indices take 0 to 7 corresponding to banks $25_1$ to $25_8$) for latching the inside address signals $YP_0$ to $YP_m$ (e.g. m=0 to 12 for k=0 to 15) produced from address signals $A_0$ to $A_k$ (e.g. k=0 to 15) supplied from the outside to activate a plurality of column decoder configuring the column decoder groups $35_1$ and $35_2$, column select inverted signals $YSB_0$ and $YSB_1$ (the respective indices take 0 to 7 corresponding to banks $25_1$ to $25_8$) for inactivating a plurality of column decoders configuring the column decoder groups $35_1$ and $35_2$, and a precharge global signal $PG_0$ for short-circuiting the global I/O line $26_1$ or $26_2$ to set it to the precharge state prior to an access in the time of data readout.

Figure 6:
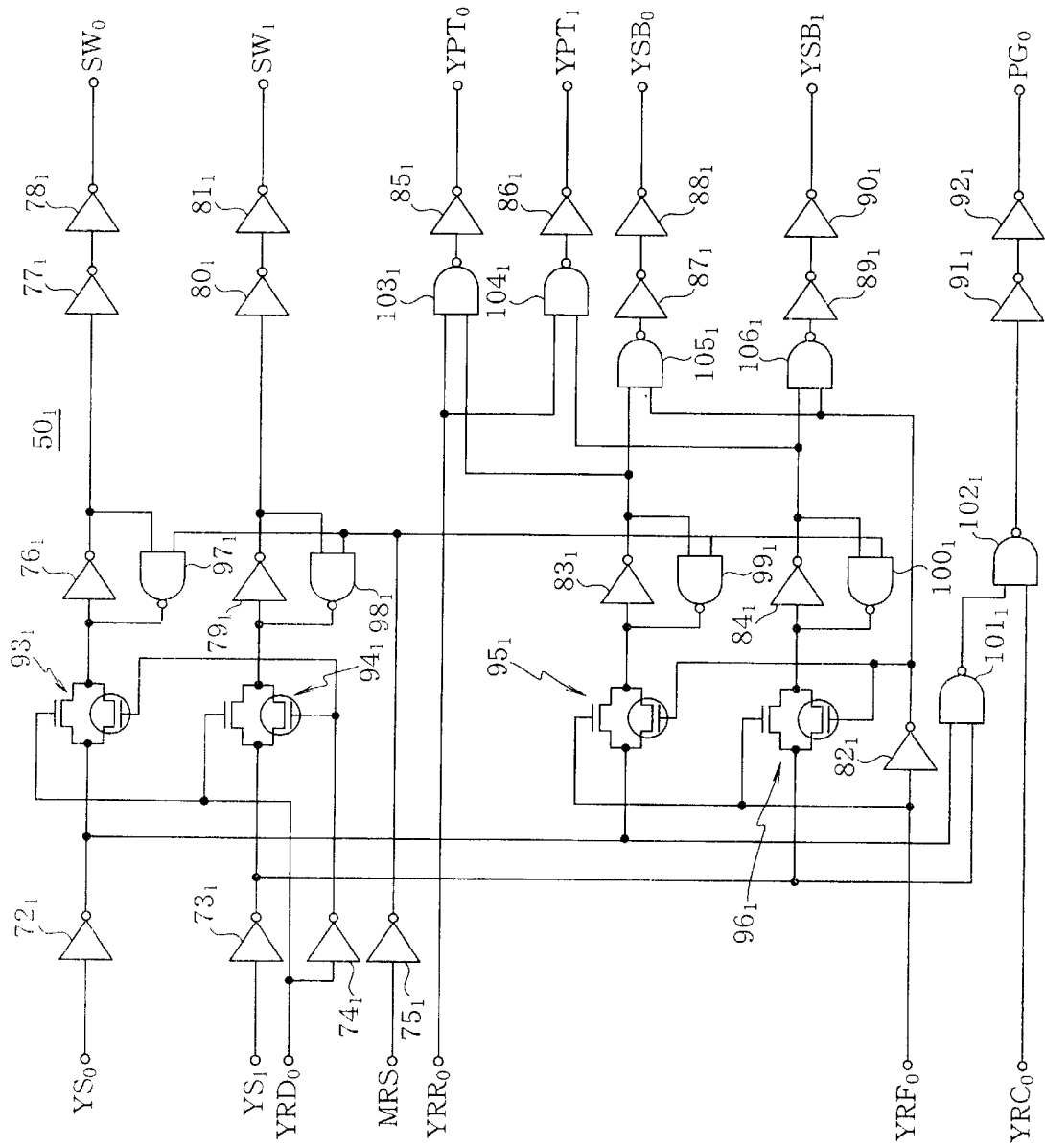
FIG. 6 is a block diagram showing an example of the configuration of a second column control section configuring the semiconductor storage unit.

Here, FIG. 6 shows one configurational example of second column control section $50_1$. The second column control section $50_1$ broadly comprises inverters $72_1, 73_1, 74_1, 75_1, 76_1, 77_1, 78_1, 79_1, 80_1, 81_1, 82_1, 83_1, 84_1, 85_1, 86_1, 87_1, 88_1, 89_1, 90_1, 91_1$ and $92_1$, transfer gates $93_1, 94_1, 95_1$ and $96_1$ and NAND gates $97_1, 98_1, 99_1, 100_1, 101_1, 102_1, 103_1, 104_1, 105_1$ and $106_1$.

The inverter $72_1$ inverts a column select signal $YS_0$, the inverter $73_1$ inverts a column select signal $YS_1$, and the inverter $74_1$ inverts a column release delay inverted signal $YRD_0$. Thereby, the transfer gates $93_1$ and $94_1$ are turned ON/OFF by a column release delay inverted signal $YRD_0$ or output signals of the inverter $74_1$, thereby allowing output signals of the inverters $72_1$ and $73_1$ to pass therethrough respectively. The inverter $75_1$ inverts a mode register reset signal MRS, the inverter $76_1$ inverts an output signal of the transfer gate $93_1$ and the inverter $79_1$ inverts an output signal of the transfer gate $94_1$. Thereby, the NAND gate $97_1$ makes a logical product of an output signal of the inverter $76_1$ and an output signal of the inverter $75_1$ to invert and supply the resultant to the inverter $79_1$ and the NAND gate $98_1$ makes a logical product of an output signal of the inverter $79_1$ and an output signal of the inverter $75_1$ to invert and supply the resultant to the inverter $79_1$. The inverter $77_1$ inverts an output signal of the inverter $76_1$ and the inverter $78_1$ inverts and outputs an output signal of the inverter $77_1$ as a switch signal $SW_0$. The inverter $80_1$ inverts an output signal of the inverter $79_1$ and the inverter $81_1$ inverts and outputs an output signal of the inverter $80_1$ as a switch signal $SW_1$.

The inverter $82_1$ inverts a column release front signal $YRF_0$ and the transfer gates $95_1$ and $96_1$ are turned ON/OFF by a column release front signal $YRF_0$ or output signals of the inverter $82_1$, thereby allowing output signals of the inverters $72_1$ and $73_1$ to respectively pass therethrough. The inverter $83_1$ inverts an output signal of the transfer gate $95_1$ and the inverter $84_1$ inverts an output signal of the transfer gate $96_1$. Thereby, the NAND gate $99_1$ makes a logical product of an output signal of the inverter $83_1$ and an output signal of the inverter $75_1$ to invert and supply the resultant to the inverter $83_1$ and the NAND gate $100_1$ makes a logical product of an output signal of the inverter $84_1$ and an output signal of the inverter $75_1$ to invert and supply the resultant to the inverter $84_1$. The NAND gate $103_1$ makes a logical product of a column release rear signal $YRR_0$ and an output signal of the inverter $83_1$ to invert and output the resultant, then the inverter $85_1$ inverts and outputs an output signal of the NAND gate $103_1$ as a column predecode latch signal $YPT_0$.

Besides, the NAND gate $104_1$ makes a logical product of a column release rear signal $YRR_0$ and an output signal of the inverter $84_1$ to invert and output the resultant as a column predecode latch signal $YPT_1$.

The NAND gate $105_1$ makes a logical product of an output signal of the inverter $83_1$ and an output signal of the inverter $82_1$ to invert and output the resultant, the inverter $87_1$ inverts an output signal of the NAND gate $105_1$ and the inverter 881 inverts an output signal of the inverter $87_1$ to output the resultant as a column select inverted signal $YSB_0$. Besides, the NAND gate $106_1$ makes a logical product of an output signal of the inverter $84_1$ and an output signal of the inverter $82_1$ to invert and output the resultant, the inverter $89_1$ inverts an output signal of the NAND gate $106_1$ and the inverter $90_1$ inverts an output signal of the inverter $89_1$ to output the resultant as a column select inverted signal $YSB_1$.

The NAND gate $101_1$ makes a logical product of an output signal of the inverter $72_1$ and an output signal of the inverter $73_1$ to invert and output the resultant, the NAND gate $102_1$ makes a logical product of an output signal of the NAND gate $102_1$ and a column release center signal $YRC_0$ to invert and output the resultant, the inverter $91_1$ inverts an output signal of the NAND gate $102_1$ and an inverter $92_1$ inverts an output signal of the inverter $91_1$ to output the resultant as a precharge global signal $PG_0$.

Incidentally, in the above circuit configuration, an example of respectively making column predecode latch signals $YPT_0$ and $YPT_1$, column select inverted signals $YSB_0$ and $YSB_1$ and switch signals $SW_0$ and $SW_1$ in the one-to-one correspondence of the banks 25 was shown, but they can be represented by those of either one bank if address signals of handling bank signals are present within the relevant region. In that case, it would be wise to make a column predecode latch signal $YPT_0$ or $YPT_1$, a column select inverted signal $YSB_0$ or $YSB_1$ and a switch signal $SW_0$ or $SW_1$ on the basis of the signal making a logical sum of a column select signal $YS_0$ and a column select signal $YS_1$ and an address related to a bank. According to such a configuration, the number of wiring lines and circuits can be reduced. This holds similarly also in the second and third embodiments.

Besides, a description will be omitted of the configuration of a second column control section $50_2$ because of a similarity to that of a second column control section $50_1$ except for the difference in the indices not only of individual components but also of I/O signals.

Besides, as shown in FIG. 1, the peripheral circuit block 22 broadly comprises bank decoders $111_1$ to $111_8$ (the bank decoders $111_3$ to $111_9$ are omitted in illustration), enable circuits $112_1$ to $112_9$ (the enable circuits $112_3$ to $112_8$ are omitted in illustration), a controller 113, a data I/O circuit $114_1$ and data I/O buses $115_1$ and $115_2$.

If the corresponding banks $25_1$ to $25_8$ are selected, the bank decoders $111_1$ to $111_8$, provided corresponding to banks $25_1$ to $25_8$, decode the bank select signals $BS_0$ to $BS_2$ (e.g., n=0 to 2 for k=0 to 15) produced from address signals $A_0$ to $A_k$ (e.g., k=0 to 15) externally supplied and the inverted signals $/BS_0$ to $/BS_2$ of the bank select signals $BS_0$ to $BS_2$ to output the select decision signals $SD_0$ to $SD_7$ indicating the purport thereof. On the basis of the select decision signals $SD_0$ to $SD_7$ outputted from the corresponding bank decoders $111_1$ to $111_8$, the enable circuits $112_1$ to $112_8$, provided corresponding to the banks $25_1$ to $25_8$, produce and output enable signals $PN_0$ to $PN_7$ for activating the corresponding banks $25_1$ to $25_8$. The controller 113 with a mode register to be reset by using a mode register reset signal MRS in which various information items externally supplied are retained temporarily produces column release signals $YR_0$ to $YR_7$ (indices correspond to the banks $25_1$ to $25_8$) defining the occurrence timing of various signals or the like in accordance with the internal clock having a definite delay amount synchronous with an external clock.

The data I/O circuit $114_1$, provided in common with the bank $25_1$ and $25_2$, supplies the data inputted from the data I/O terminal $DQ_0$ (indices take 0 to 3 corresponding to the bank blocks $23_1$ to $23_4$) via the I/O buses $115_1$ and $115_2$ to the I/O amplifiers $28_1$ and $28_2$ and moreover successively outputs data, supplied via the data I/O buses $115_1$ and $115_2$ from the I/O amplifiers $28_1$ and $28_2$, from the data I/O terminal $DQ_0$. Incidentally, other than the above shape, the connection relation between the multi-bit composed data I/O terminal $DQ_0$ and the data I/O terminals $115_1$ and $115_2$ and the connection relation between the data I/O buses $115_1$ and $115_2$ and the data I/O circuit $114_1$ may assume various shapes corresponding to different configurations of a memory array 31 and/or global I/O lines $26_1$ but a description thereof will be omitted because of no direct relation to this embodiment.

Next, the operation of a semiconductor storage unit as configured above will be described referring to the timing charts shown in FIGS. 7 to 10. First of all, the data write operation into the bank $25_1$ and the data readout operation from the bank $25_2$ with a time lag between an access to the bank $25_1$ and an access to the bank $25_2$ (referred to as gap) will be described referring to the timing chart shown in FIGS. 7 and 8.

Figure 7:
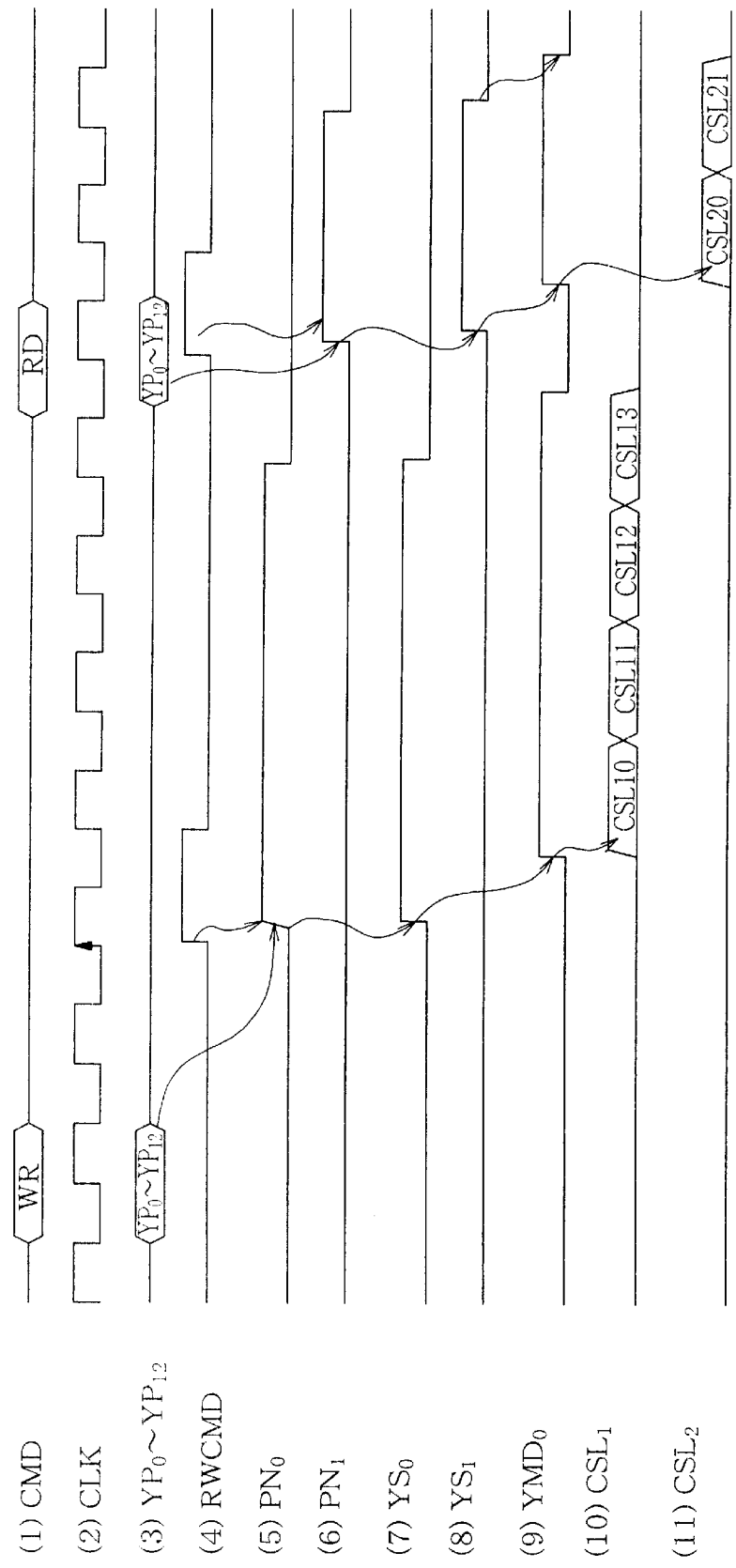
FIG. 7 is a timing chart showing an example of the operation of the semiconductor storage unit.

When a write command WR (See FIG. 7 (1)) and address signals $A_0$ to $A_{15}$ for the write of data supplied externally from a CPU (Central Processing Unit), a memory control unit (any of them is omitted in illustration) or the like are taken in synchronously with the leading of a first cycle in the clock CLK, internal address signals $YP_0$ to $YP_{12}$ (See FIG. 7 (3)), bank select signals $BS_0$ to $BS_2$ for selecting the bank $25_1$ and an internal command signal RWCMD (See FIG. 7 (4)) are produced. Henceforth, letting the first cycle be a cycle with the leading edge of a clock CLK taken at the origin in which this write command WR is inputted, a description will be made. Thereby, since the bank decoder $111_1$ decodes bank select signals $BS_0$ to $BS_2$ and the inverted signals $/BS_0$ to $/BS_2$ thereof to output a select decision signal $SD_0$ indicating the gist that the corresponding banks $25_1$ are selected (not shown in FIG. 7), the enable circuit $112_1$ produces an enable signal $PN_0$ for activating the corresponding bank $25_1$ on the basis of the select decision signal $SD_0$ outputted from the corresponding bank decoder $111_1$ and outputs it synchronously with the internal command signal.

RWCMD (See FIG. 7 (4)) supplied synchronous with the leading of a third cycle (See FIG. 7 (2)) in the clock CLK (See FIG. 7 (5)). Incidentally, this holds true similarly also for the leading of the first cycle as conventionally. Thus, in the bank selective circuit $29_1$, a column select signal $YS_0$ is outputted from the buffer $43_1$ (See FIG. 7 (7)) and moreover a column multi-select delay signal $YMD_0$ is outputted from the buffer $47_1$ after the lapse of a predetermined time (See FIG. 7 (9)). Besides, the controller 113 produces a column release signal $YR_0$, a write burst signal $WBT_0$ or the like. Incidentally, to simplify the description in this embodiment, other control signals, input signals, circuits and so on not directly associated to this embodiment are omitted, so that only the enable circuit 112 and the controller 113 are shown.

Figure 8:
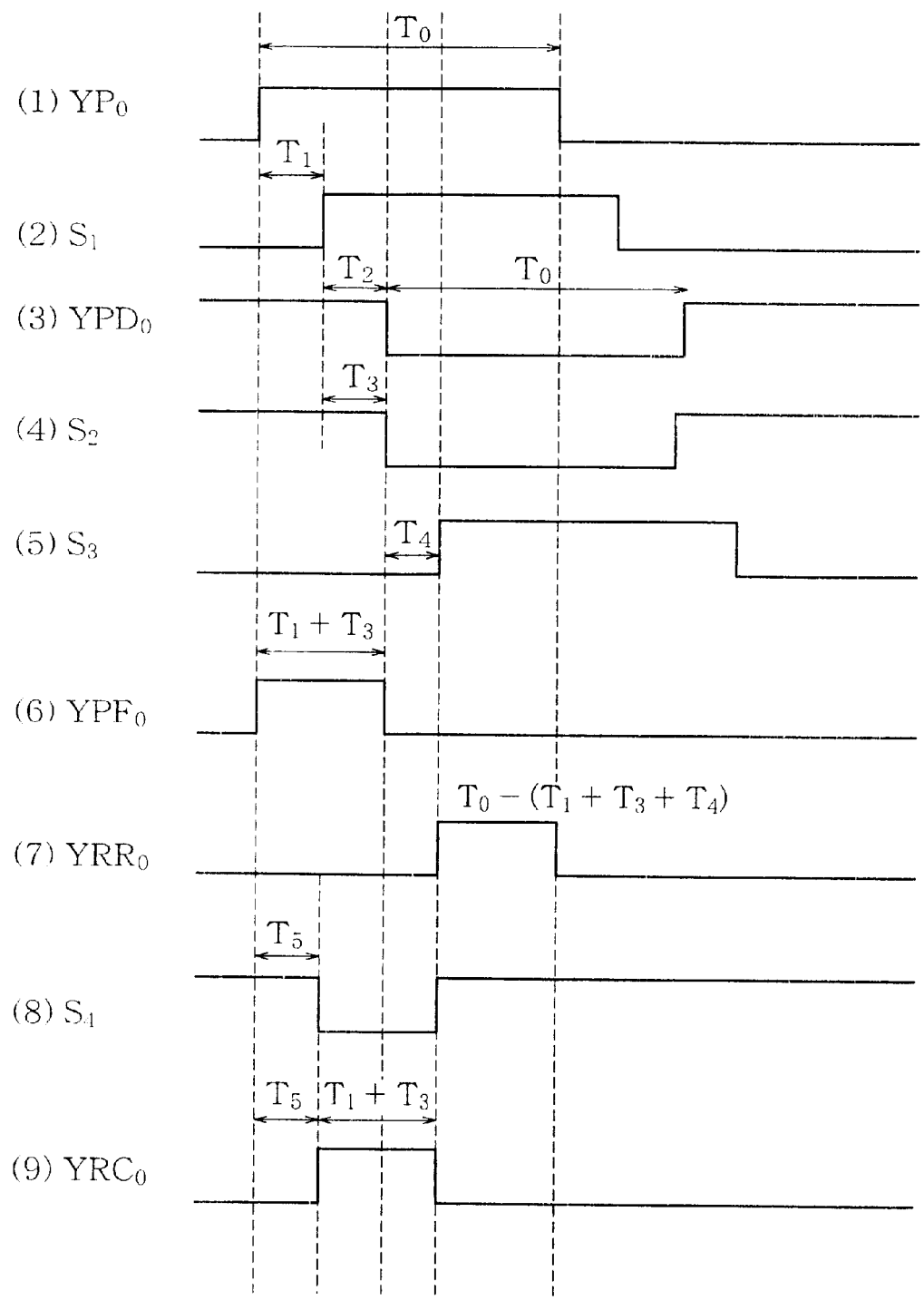
FIG. 8 is a timing chart showing an example of the operation of the first column control section configuring the semiconductor storage unit.

On the other hand, since data supplied externally and inputted through the data I/O terminal $DQ_0$ are supplied to the I/O amplifier $28_1$ or $28_2$ via the data I/O bus $115_1$ or $115_2$ by the data I/O circuit $114_1$, a write amplifier configuring an I/O amplifier $28_1$ or $28_2$, or the like is activated by a column multi-select delay signal $YMD_0$ (See FIG. 7 (9)) supplied from the bank selective circuit $29_1$ to amplify data supplied via the data I/O bus $115_1$ or $115_2$ from the data I/O circuit $114_1$ then conveying them to the global I/O line $26_1$ or $26_2$. Besides, on the basis of an "H" level write burst signal $WBT_0$ and a column release signal $YR_0$ (See FIG. 8 (1)), for example, supplied from the controller 113, the first column control section $49_1$ produces a column release delay inverted signal $YRD_0$ (See FIG. 8 (3)), a column release rear signal $YRR_0$ (See FIG. 8 (7)) and a column release front signal $YRF_0$ (See FIG. 8 (6)). Incidentally, since the write burst signal $WBT_0$ is a "H" level, the column release center signal $YRC_0$ remains a "L" level and does not become a wave form as shown in FIG. 8 (9). It is at the time of data readout that the column release center signal $YRC_0$ becomes a wave form as shown in FIG. 8 (9).

Thereby, in the second column control section $50_1$, the column select signal $YS_0$ supplied from the bank selective circuit $29_1$ is latched by a column release delay inverted signal $YRD_0$, a switch signal $SW_0$ is outputted and moreover the column select inverted signal $YSB_0$ for inactivating a plurality of column decoders configuring the column decoder group $35_1$ or $35_2$ is released on the basis of the column release front signal $YRF_0$, whereas a column predecode latch signal $YPT_0$ for activating a plurality of column decoder configuring the column decoder group $35_1$ or $35_2$ is produced. Incidentally, since the column release center signal $YRC_0$ remains a "L" level, the precharge global signal $PG_0$ remains an "H" level.

Thus, on the basis of a switch signal $SW_0$, the bank $25_1$ is selected and the global I/O line $26_1$ or $26_2$ is connected to the respective local I/O lines $34_1$ to $34_8$ perpendicular thereto, while signals predecoded by use of a predecoder configuring the column decoder group $35_1$ or $35_2$ are decoded on the basis of a column select signal $YS_0$ by use of a main decoder configuring the column decoder group $35_1$ or $35_2$ and become outputs of column select switches. Assuming here that these column select switches, for example, $CSL_{10}$ to $CSL_{13}$ are successively selected, sense amplifiers 33 of the corresponding bit lines are selected (See FIG. 7 (10)). Thereby, the data conveyed on the global I/O line $26_1$ or $26_2$ are conveyed to the selected memory cell of the memory cell array $31_1$ via any of the local I/O lines $34_1$ to $34_8$.

Incidentally, the operation of a word driver $32_1$ and a row decoder group $48_1$ are not directly associated with this embodiment, so that a description thereof will be omitted.

By use of the operation described above, data are written into the selected memory cell of the bank $25_1$.

Subsequently, when synchronously with the leading of the eighth period of a clock CLK (See FIG. 7 (2)), a read command RD (See FIG. 7 (1)) and address signals $A_0$ to $A_{15}$ for the readout of data supplied externally are taken in, internal address signals $YP_0$ to $YP_{12}$ (See FIG. 7 (3)), bank select signals $BS_0$ to $BS_2$ for selecting the bank $25_2$ and an internal command signal RWCMD (See FIG. 7 (4)) are produced. Thereby, since the bank decoder $111_2$ decodes bank select signals $BS_0$ to $BS_2$ and the inverted signals $/BS_0$ to $/BS_2$ thereof to output a select decision signal $SD_0$ indicating the gist that the corresponding banks $25_2$ are selected (not shown in FIG. 7), the enable circuit $112_2$ produces an enable signal $PN_1$ for activating the corresponding bank $25_2$ on the basis of the select decision signal $SD_1$ outputted from the corresponding bank decoder $111_2$ and outputs it synchronously with the internal command signal RWCMD (See FIG. 7 (4)) supplied synchronous with the leading of an eighth cycle (See FIG. 7 (2)) in the clock CLK (See FIG. 7 (6)).

Thus, in the bank selective circuit $29_1$, a column select signal $YS_1$ is outputted from the buffer $44_1$ (See FIG. 7 (8)) and moreover a column multi-select delay signal $YMD_0$ is outputted from the buffer $47_1$ after the lapse of a predetermined time (See FIG. 7 (9)). Besides, the controller 113 produces a column release signal $YR_0$, a write burst signal $WBT_0$ or the like.

On the other hand, on the basis of an "L" level write burst signal $WBT_0$ and a column release signal $YR_0$, for example, supplied from the controller 113, the first column control section $49_1$ produces a column release delay inverted signal $YRD_0$, a column release rear signal $YRR_0$, a column release front signal $YRF_0$ and a column release center signal $YRC_0$. Thereby, in the second column control section $50_1$, the column select signal $YS_1$ supplied from the bank selective circuit $29_1$ is latched by a column release delay inverted signal $YRD_0$, a switch signal $SW_1$ is outputted and moreover the column select inverted signal $YSB_0$ is released on the basis of the column release front signal $YRF_0$, whereas a column predecode latch signal $YPT_0$ is produced and further a precharge global signal $PG_0$ becoming only by one shot, e.g. an "L" level is produced.

Thus, on the basis of a switch signal $SW_1$, the bank $25_2$ is selected and the global I/O line $26_1$ or $26_2$ is connected to the respective local I/O lines $34_1$ to $34_8$ perpendicular thereto, but the global I/O line $26_1$ or $26_2$ is short-circuited by means of the precharge global I/O circuit $36_1$ or $36_2$ only during the period of the precharge global signal $PG_0$ becoming an "L" level to set the global I/O line $26_1$ or $26_2$ to the precharge state. Besides, on the basis of a column select signal $YS_0$, signals predecoded by use of a predecoder configuring the column decoder group $35_1$ or $35_2$ are decoded by use of a main decoder configuring the column decoder group $35_1$ or $35_2$ and become outputs of column select switches. Assuming here that these column select switches, for example, $CSL_{20}$ and $CSL_{21}$ are successively selected, sense amplifiers $33_3$ or $33_4$ of the corresponding bit lines are selected (See FIG. 7 (11)). Thereby, the sense amplifier $33_3$ or $33_4$ detects and amplifies the data read out onto a bit line from the memory cell connected to the selected row of the memory cell array $31_2$, so that the detected or amplified data are conveyed to the I/O amplifier $28_1$ or $28_2$ via the local I/O lines $34_5$ to $34_8$ and the global I/O lines $26_1$ or $26_2$. Activated by the column multi-select delay signal $YMD_0$ (See FIG. 7 (9)) supplied from the bank selective circuit $29_1$, data amplifier configuring the I/O amplifier $28_1$ or $28_2$, or the like conveys the supplied data to the data I/O circuit $114_1$ via the data I/O bus $115_1$ or $115_2$ after amplified. Thus, the data I/O circuit $114_1$ successively outputs the supplied data through the data I/O terminal $DQ_0$.

Incidentally, the operation of a word driver $32_2$ and a row decoder group $48_2$ are not directly associated with this embodiment, so that a description thereof will be omitted.

By use of the operation described above, data are read out from the selected memory cell of the bank $25_2$.

Figure 9:
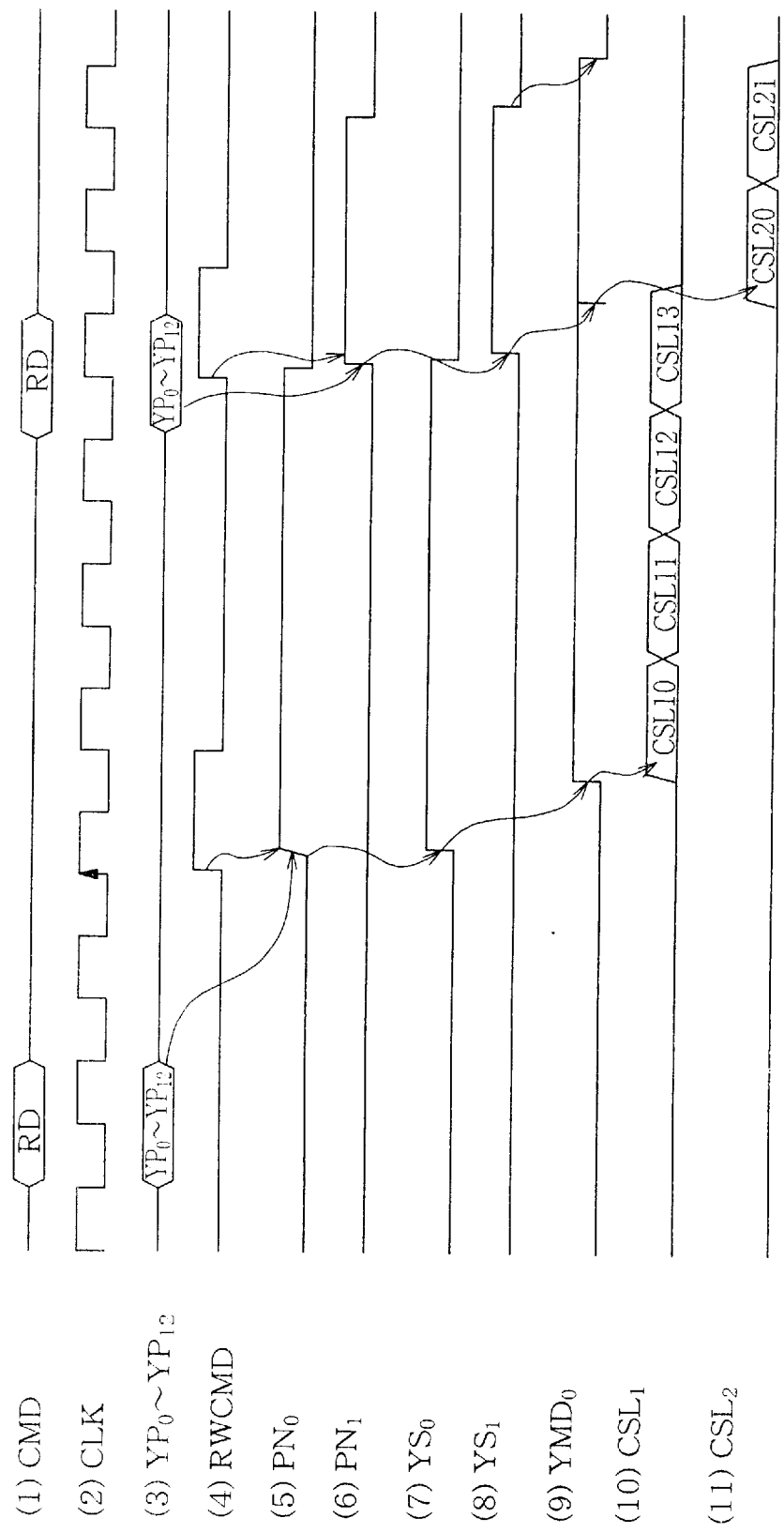
FIG. 9 is a timing chart showing an example of the operation of the semiconductor storage unit.

Next, referring to the timing chart shown in FIGS. 9 and 10, a description will be made of the continuous readout operation of data from the banks $25_1$ and $25_2$ without a gap between an access to the bank $25_1$ and an access to the bank $25_2$. The basic operation is similar to that of the above presence case of a gap. As shown in FIG. 9 (9) and FIG. 10 (3), however, the absence of a gap allows a column multi-select delay signal $YMD_0$ to be kept active continuously. Incidentally, in FIG. 9 (9), the time of switchover is designated with a mark to clearly understand the switching from an access to the bank $25_1$ over to an access to the bank $25_2$, but the signal actually keeps continuous.

When a read command RD is continuous and data are successively read out from the bank 25, and the $25_2$ as shown in FIG. 9 (1), an insufficient short-circuiting of a pair of global I/O lines $26_1$ or $26_2$ originating in a skew lag or the like occurring at the switching from an access to the bank $25_1$ over to an access to the bank $25_2$ in response to a switch signal $SW_0$ or $SW_1$ makes difficult a speedy readout of data from a memory cell and being amplified by any of the sense amplifiers $33_1$ to $33_4$.

Figure 10:
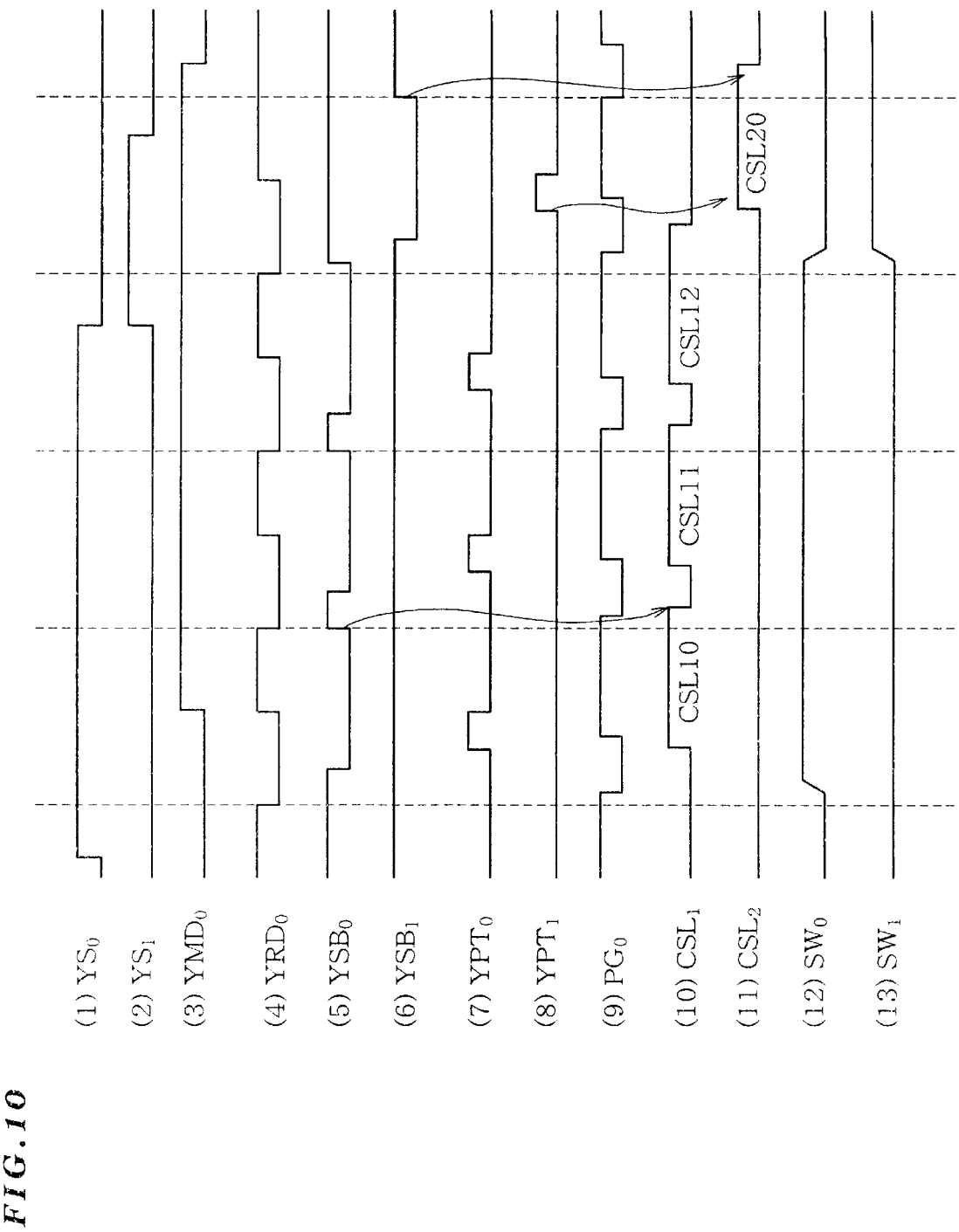
FIG. 10 is a timing chart showing an example of the operation of the second column control section configuring the semiconductor storage unit.

Accordingly, as shown in FIGS. 10 (9), (12) and (13), Embodiment 1 permits a short-circuiting of a pair of global I/O lines $26_2$ and $26_2$ to be fully fulfilled by the switchover from a switch signal $SW_0$ to a switch signal $SW_1$ during the period of a precharge global signal $PG_0$ being an "L" level.

Like this, according to this embodiment, the global I/O lines $26_1$ and $26_2$ are provided in common with the banks $25_1$ and $25_2$ disposed top-to-bottom and moreover the bank selective circuit $29_1$ is so arranged as to produce a column multi-select delay signal $YMS_0$ from the signal making a logical sum of the enable signals $PN_0$ and $PN_1$, thereby enabling the number of wiring lines to be reduced in compare with Embodiment 1 of producing column multi-select delay signals $YMD_0$ for each bank.

Besides, according to this embodiment, a short-circuiting of a pair of global I/O lines $26_1$ or $26_2$ is fully fulfilled by the switchover from a switch signal $SW_0$ to a switch signal $SW_1$ during the period of a precharge global signal $PG_0$ being an "L" level, in case of a continuous read command RD and a continuous readout of data from the banks $25_1$ and $25_2$, thereby enabling the readout of data to be executed at high speed.

B. Embodiment 2

Figure 11:
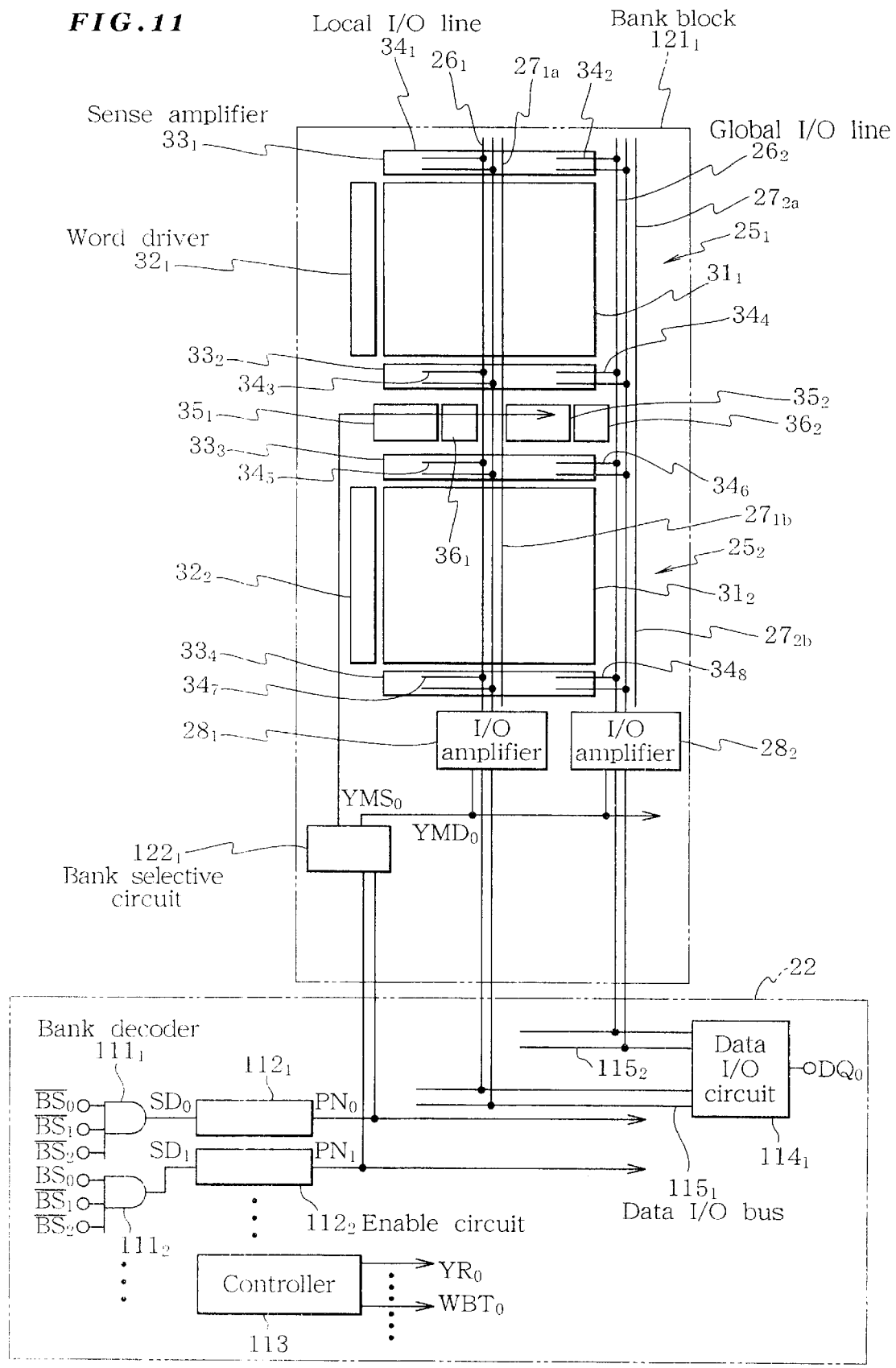
FIG. 11 is a block diagram showing the electric configuration of the main part of a semiconductor storage unit according to Embodiment 2 of the present invention.

Then, Embodiment 2 will be described. FIG. 11 is a block diagram showing the electric configuration of the main part of a semiconductor storage unit according to Embodiment 2. In FIG. 11, like symbols are attached to parts corresponding to individual parts of FIG. 1 and a description thereof will be omitted. With the semiconductor storage unit shown in FIG. 11, a bank block $121_1$ is anew provided in place of the bank block $23_1$ shown in FIG. 1. Incidentally, in a semiconductor storage unit according to Embodiment 2, the configuration of a functional block $21_1$ except the bank blocks $121_1$ and $121_2$ (unshown but the same configuration except for the difference in indices of the bank block $121_1$ and individual components and moreover the difference in indices of inputted/outputted signals and data) is much the same as that of the functional block $21_1$ shown in FIG. 2 (1). As with Embodiment 1, the chip layout also comprises four bank blocks as shown in FIG. 2 (2). With respect to the second column control section $50_1$, however, since the bank select circuit $122_1$ produces only a column multi-select signal $YMS_0$ in place of column select signals $YS_0$ and $YS_1$ as mentioned above, the components related to a column select signal $YS_0$ are correspondingly applied to those related to a column multi-select signal $YMS_0$ as they are among the circuit shown in FIG. 6, but those related to a column multi-select signal $YS_1$ are unnecessary and eliminated.

Figure 12:
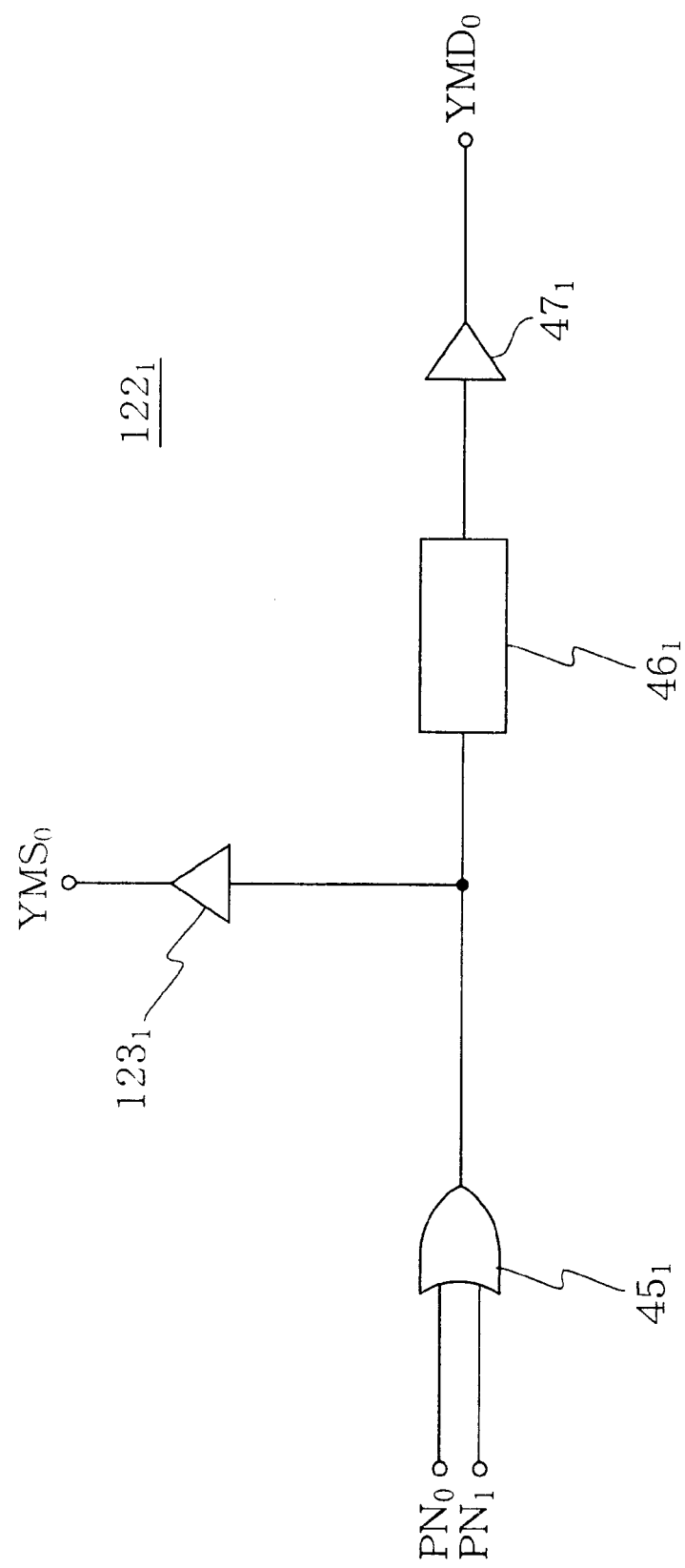
FIG. 12 is a block diagram showing an example of the configuration of a bank select circuit configuring the semiconductor storage unit.

The bank block $121_1$ differs from the bank block $23_1$ shown in FIG. 1 in that a bank select circuit $122_1$ is anew provided in place of the bank select circuit 291. Here, FIG. 12 is a block diagram showing one configurational example of bank select circuit $122_1$. In FIG. 12, like symbols are attached to those corresponding to individual parts of FIG. 4 and a description thereof will be omitted. The bank select circuit $122_1$ differs from the bank select circuit $29_1$ in that a buffer $123_1$ for buffering an output signal of the OR gate $45_1$ to output it as column multi-select signal $YMS_0$ is anew provided in place of buffers $43_1$ and $44_1$.

Next, the operation of a semiconductor storage unit as configured above will be described referring to FIGS. 13 and 14. First of all, the write operation of data into the bank $25_1$ and the readout operation of data from the bank $25_2$ with a gap between an access to the bank $25_1$ and an access to the bank $25_2$ will be described referring to a timing charts FIG. 13.

Figure 13:
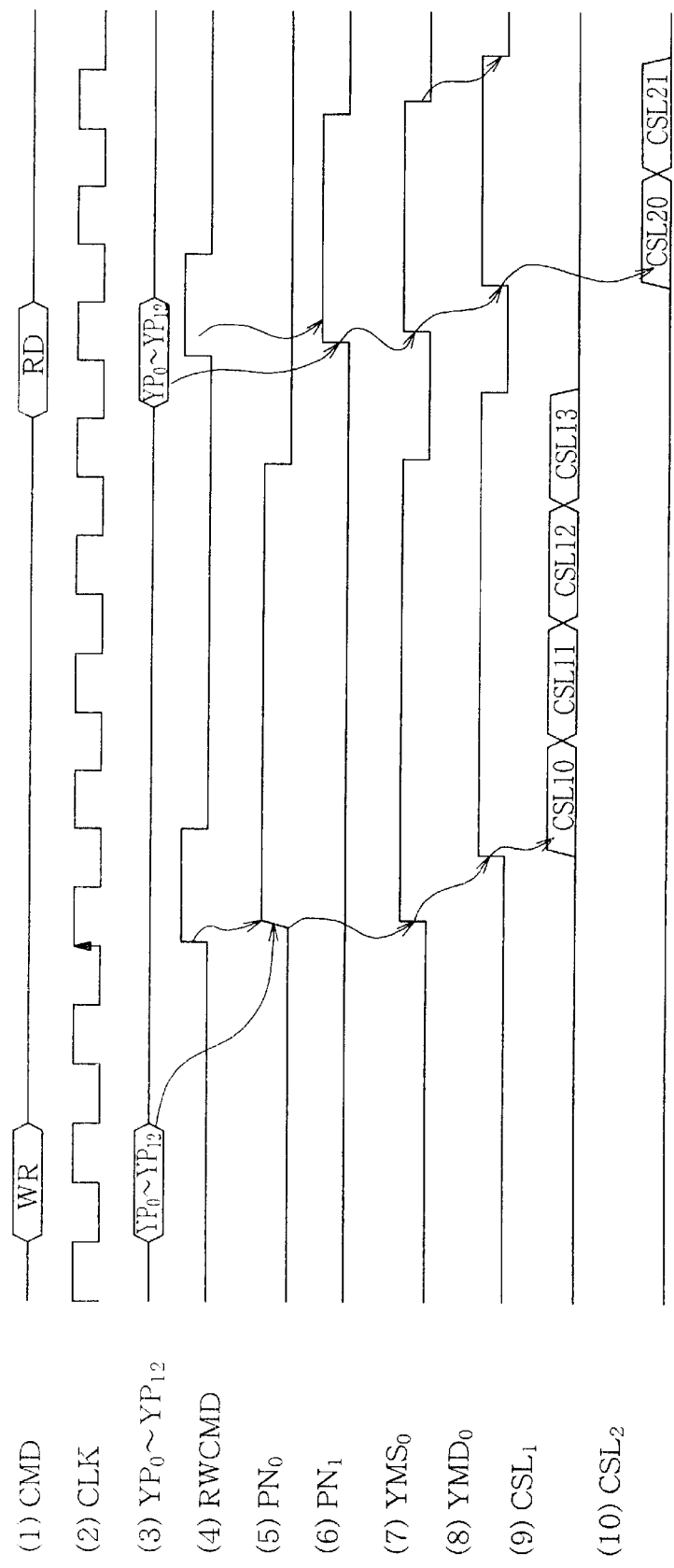
FIG. 13 is a timing chart showing an example of the operation of e semiconductor storage unit.

When a write command WR (See FIG. 13 (2)) and address signals AO to $A_{15}$ for the write of data supplied externally are taken in synchronously with the leading (See FIG. 13 (2)) of a first cycle in the clock CLK, internal address signals $YP_0$ to $YP_{12}$ (See FIG. 13 (3)), bank select signals $BS_0$ to $BS_2$ for selecting the bank $25_1$ and an internal command signal RWCMD (See FIG. 13 (4)) are produced. Henceforth, letting the cycle with the leading edge of a clock CLK when this write command WR was inputted taken at the origin be a first cycle, a description will be made. Thereby, since the bank decoder $111_2$ decodes bank selection signals $BS_0$ to $BS_2$ and the inverted signals $IBS_0$ to $/BS_2$ thereof to output a select decision signal $SD_0$ (not shown in FIG. 13), the enable circuit $112_1$ produces an enable signal $PN_0$ on the basis of the select decision signal $SD_0$ outputted from the corresponding bank decoder $111_1$ and outputs it synchronously with the internal command signal RWCMD (See FIG. 13 (4)) supplied synchronously with the leading of a third cycle (See FIG. 13 (2)) in the clock CLK (See FIG. 13 (5)). Incidentally, this holds true similarly also for the leading of the first cycle as conventionally. Thus, in the bank select circuit $122_1$, a column multi-select signal $YMS_0$ is outputted from the buffer $123_1$ (See FIG. 13 (7)) and moreover a column multi-select delay signal $YMD_0$ is outputted from the buffer 472 after the lapse of a predetermined time (See FIG. 13 (8)). Besides, the controller 113 produces a column release signal $YR_0$, a write burst signal $WBT_0$ or the like. Incidentally, to simplify the description, other control signals, input signals, circuits and so on not directly associated with this embodiment are omitted, so that only the enable circuit 112 and the controller 113 are shown.

On the other hand, since data supplied externally and inputted through the data I/O terminal $DQ_0$ are supplied to the I/O amplifier $28_1$ or $28_2$ via the data I/O bus $115_1$ or $115_2$ by the data I/O circuit $114_1$, a write amplifier configuring an I/O amplifier $28_1$ or $28_2$, or the like is activated by a column multi-selection delay signal $YMD_0$ (See FIG. 13 (8)) supplied from the bank selection circuit $122_1$ to amplify data supplied via the data I/O bus $115_1$ or $115_2$ from the data I/O circuit $114_1$, then conveying them to the global I/O line $26_1$ or $26_2$. Besides, on the basis of an "H" level write burst signal $WBT_0$ and a column release signal $YR_0$, for example, supplied from the controller 113, the first column control section $49_1$ produces a column release delay inverted signal $YRD_0$, a column release rear signal $YRR_0$ and a column release front signal $YRF_0$. Incidentally, since the write burst signal $WBT_0$ is a "H" level, the column release center signal $YRC_0$ remains a "L" level.

Thereby, in the second column control section $50_1$, the column multi-select signal $YMS_0$ supplied from the bank selection circuit $122_1$ is latched by a column release delay inverted signal $YRD_0$, a switch signal $SW_0$ is outputted and moreover the column selection inverted signal $YSB_0$ is released on the basis of the column release front signal $YRF_0$, whereas a column predecode latch signal $YPT_0$ is produced. Incidentally, since the column release center signal $YRC_0$ remains a "L" level, the precharge global signal $PG_0$ remains an "H" level.

Thus, on the basis of a switch signal $SW_0$, the bank $25_1$ is selected and the global I/O line $26_1$ or $26_2$ is connected to the respective local I/O lines $34_1$ to $34_8$ perpendicular thereto, while signals predecoded by use of a predecoder configuring the column decoder group $35_1$ or $35_2$ are decoded on the basis of a column multi-select signal $YMS_0$ by use of a main decoder configuring the column decoder group $35_1$ or $35_2$ and become outputs of column selection switches. Assuming here that these column selection switches, for example, $CSL_{10}$ to $CSL_{13}$ are successively selected, sense amplifiers 33 of the corresponding bit lines are selected (See FIG. 13 (9)). Thereby, the data conveyed on the global I/O line $26_1$ or $26_2$ are conveyed to the selected memory cell of the memory cell array $31_1$ via any of the local I/O lines $34_1$ to $34_8$.

Incidentally, the operation of a word driver $32_1$ and a row decoder group $48_1$ are not directly associated with this embodiment, so that a description thereof will be omitted.

By use of the operation described above, data are written into the selected memory cell of the bank $25_1$.

Subsequently, when synchronously with the leading of the eighth cycle of a clock CLK (See FIG. 13 (2)), a read command RD (See FIG. 13 (1)) and address signals $A_0$ to $A_{15}$ supplied externally are taken in, internal address signals $YP_0$ to $YP_{12}$ (See FIG. 13 (3)), bank selection signals $BS_0$ to $BS_2$ for selecting the bank $25_2$ and an internal command signal RWCMD (See FIG. 13 (4)) are produced. Thereby, since the bank decoder $111_2$ decodes bank selection signals $BS_0$ to $BS_2$ and the inverted signals $/BS_0$ to $/BS_2$ thereof to output a select decision signal $SD_1$ (not shown in FIG. 13), the enable circuit $112_2$ produces an enable signal $PN_1$ on the basis of the select decision signal $SD_1$ outputted from the corresponding bank decoder $111_2$ and outputs it synchronously with the internal command signal RWCMD (See FIG. 13 (4)) supplied synchronous with the leading of an eighth cycle (See FIG. 13 (2)) in the clock CLK (See FIG. 13 (6)).

Thus, in the bank selection circuit $122_1$, a column multi-select signal $YMS_0$ is outputted from the buffer $123_1$ (See FIG. 13 (7)) and moreover a column multi-selection delay signal $YMD_0$ is outputted from the buffer $47_1$ after the lapse of a predetermined time (See FIG. 13 (8)). Besides, the controller 113 produces a column release signal $YR_0$, a write burst signal $WBT_0$ or the like.

On the other hand, on the basis of an "L" level write burst signal $WBT_0$ and a column release signal $YR_0$, for example, supplied from the controller 113, the first column control section $49_1$ produces a column release delay inverted signal $YRD_0$, a column release rear signal $YRR_0$, a column release front signal $YRF_0$ and a column release center signal $YRC_0$. Thereby, in the second column control section $50_1$, the column multi-select signal $YMS_0$ supplied from the bank selection circuit $122_1$ is latched by a column release delay inverted signal $YRD_0$, a switch signal $SW_1$ is outputted and moreover the column selection inverted signal $YSB_0$ is released on the basis of the column release front signal $YRF_0$, whereas a column predecode latch signal $YPT_0$ is produced and further a precharge global signal $PG_0$ becoming only by one shot, e.g. an "L" level is produced.

Thus, on the basis of a switch signal $SW_1$, the bank $25_2$ is selected and the global I/O line $26_1$ or $26_2$ is connected to the respective local I/O lines $34_1$ to $34_8$ perpendicular thereto, but the global I/O line $26_1$ or $26_2$ is short-circuited by means of the precharge global I/O circuit $36_1$ or $36_2$ only during the period of the precharge global signal $PG_0$ becoming an "L" level to set the global I/O line $26_1$ or $26_2$ to the precharge state. Besides, on the basis of a column multi-selection signal $YMS_0$, signals predecoded by use of a predecoder configuring the column decoder group $35_1$ or $35_2$ are decoded by use of a main decoder configuring the column decoder group $35_1$ or $35_2$ and become outputs of column selection switches. Assuming here that these column selection switches, for example, $CSL_{20}$ to $CSL_{21}$ are successively selected, sense amplifiers 33 of the corresponding bit lines are selected (See FIG. 13 (10)). Thereby, the sense amplifier $33_3$ or $33_4$ detects and amplifies the data read out onto a bit line from the memory cell connected to the selected row of the memory cell array $31_2$, so that the detected or amplified data are conveyed to the I/O amplifier $28_1$ or $28_2$ via the local I/O lines $34_5$ to $34_8$ and the global I/O line $26_1$ or $26_2$. Activated by the column multi-selection delay signal $YMD_0$ (See FIG. 13 (8)) supplied from the bank selection circuit $122_1$, data amplifier configuring the I/O amplifier $28_1$ or $28_2$, or the like conveys the supplied data to the data I/O circuit $114_1$ via the data I/O bus $115_1$ or $115_2$ after amplified. Thus, the data I/O circuit $114_1$ successively outputs the supplied data through the data I/O terminal $DQ_0$.

Incidentally, the operation of a word driver $32_2$ and a row decoder group $48_2$ are not directly associated with this embodiment, so that a description thereof will be omitted.

By use of the operation described above, data are read out from the selected memory cell of the bank $25_2$.

Figure 14:
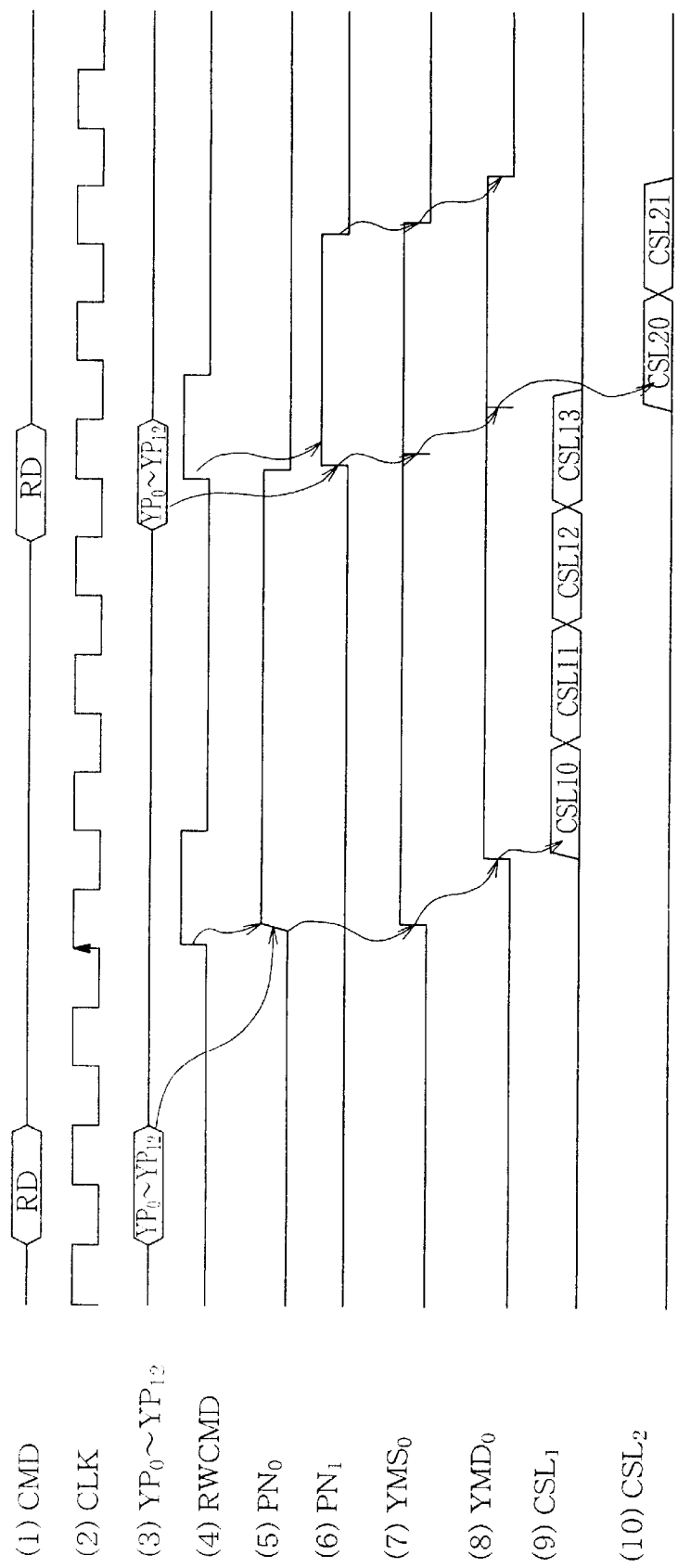
FIG. 14 is a timing chart showing an example of the operation of the semiconductor storage unit.

Next, FIG. 14 is a timing chart showing the continuous readout operation of data from the banks $25_1$ and $25_2$ without gap between an access to the bank $25_1$ and an access to the bank $25_2$. The basic operation is similar to that of the above presence case of a gap. As shown in FIG. 14 (7) and FIG. 14 (8),however, the absence of a gap allows a column multi-select signal $YMS_0$ or a column multi-select delay signal $YMD_0$ to be kept active continuously. Incidentally, in FIG. 14 (7) and (8), the time of switching is designated with a mark to clearly understand the switching from an access to the bank $25_1$ over to an access to the bank $25_2$, but the signal keeps continuous in fact.

Like this, according to this embodiment, since the global I/O lines $26_1$ and $26_2$ are provided in common with the banks $25_1$ and $25_2$ disposed top-to-bottom and moreover the bank selection circuit $122_1$ is so arranged as to produce a column multi-select signal $YMS_0$ and a column multi-select delay signal $YMD_0$ from the signal making a logical sum of the enable signals $PN_0$ and $PN_1$, the number of wiring lines can be reduced to a greater extent than Embodiment 1 of producing column select signals $YS_0$ and $YS_1$ for each bank.

C. Embodiment 3

Figure 15:
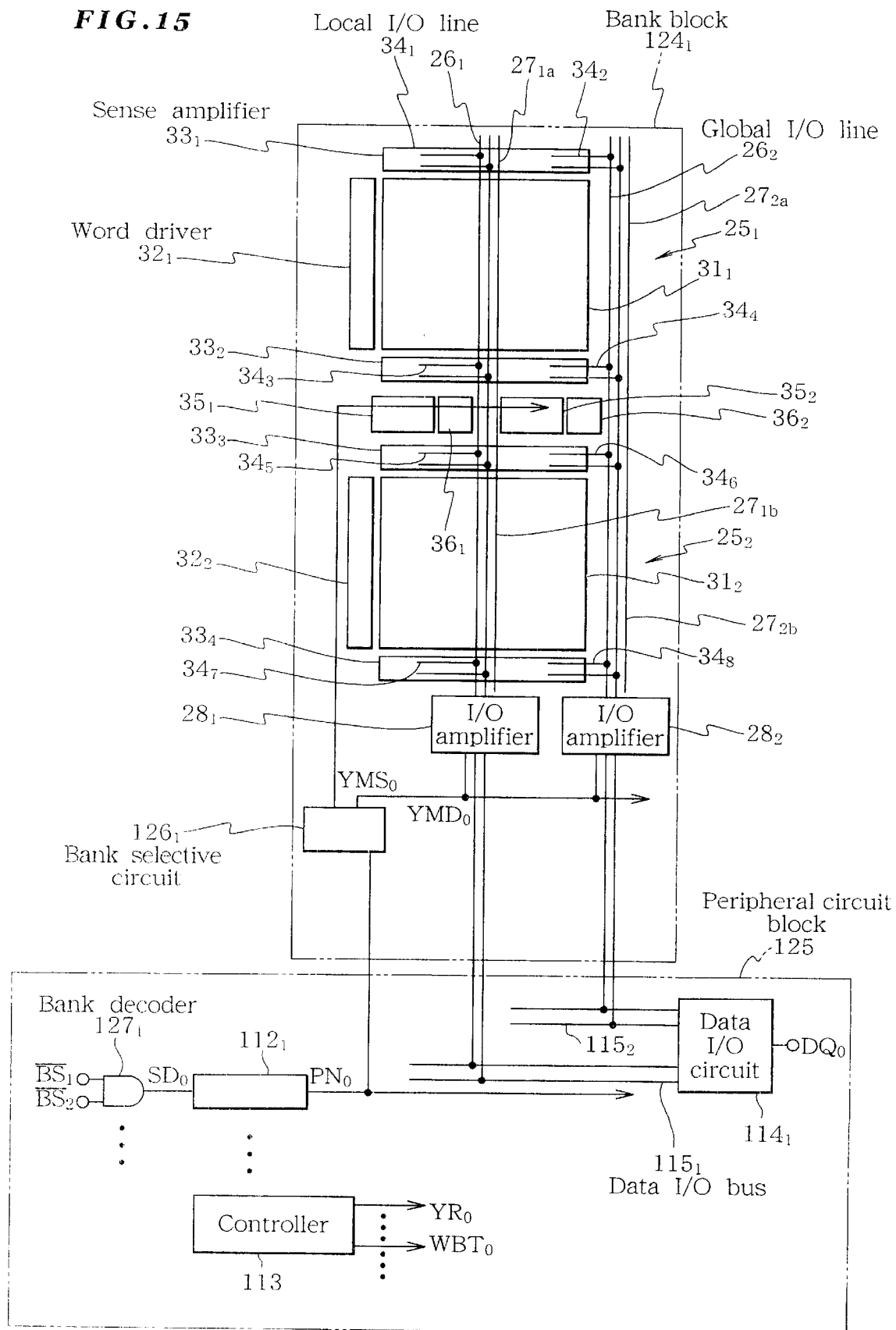
FIG. 15 is a block diagram showing the electric configuration of the main part of a semiconductor storage unit according to Embodiment 3 of the present invention.

Then, Embodiment 3 will be described. FIG. 15 is a block diagram showing the electric configuration of the main part of a semiconductor storage unit according to Embodiment 3. In FIG. 15, like symbols are attached to parts corresponding to individual parts of FIG. 11 and a description thereof will be omitted. With the semiconductor storage unit shown in FIG. 15, a bank block $124_1$ and a peripheral circuit block 125 are anew provided in place of the bank block $121_1$ and the peripheral circuit block 22 shown in FIG. 11. Incidentally, in a semiconductor storage unit according to Embodiment 3, the configuration of a functional block $21_1$ except the bank blocks $124_1$ and $124_2$ (unshown but the same configuration except for the difference in indices of individual components from the bank block $124_1$ as well as the difference in indices of inputted/outputted signals and data) and the peripheral circuit block 125 is much the same as that of the functional block 21, shown in FIG. 2 (1). Besides, as with Embodiments 1 and 2, the chip layout also comprises four bank blocks as shown in FIG. 2 (2). With respect to the second column control section $50_1$, however, since the bank select circuit $126_1$ produces only a column multi-select signal $YMS_0$ in place of column select signals $YS_0$ and $YS_1$ as mentioned later, the components related to a column select signal $YS_0$ are correspondingly applied to those related to a column multi-select signal $YMS_0$ as they are among the circuit shown in FIG. 6, but those related to a column select signal $YS_1$ are unnecessary and eliminated.

Figure 16:
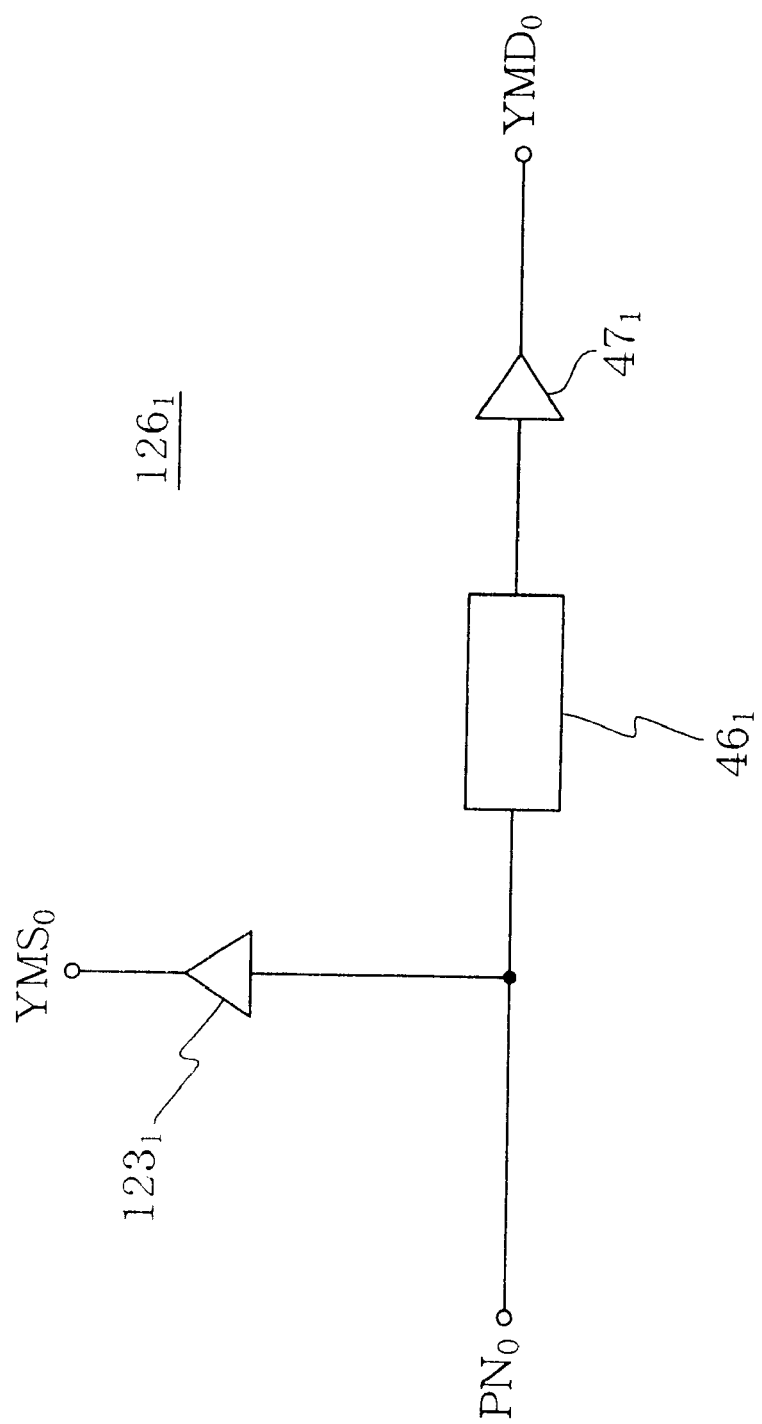
FIG. 16 is a block diagram showing an example of the configuration of a bank select circuit configuring the semiconductor storage unit.

The bank block $124_1$ differs from the bank block $121_1$ shown in FIG. 11 in that a bank select circuit $126_1$ is anew provided in place of the bank select circuit $122_1$. Here, FIG. 16 is a block diagram showing one configurational example of bank select circuit $126_1$. In FIG. 16, like symbols are attached to those corresponding to individual parts of FIG. 12 and a description thereof will be omitted. The bank select circuit $126_1$ differs from the bank select circuit $122_1$ in that the OR gate $45_1$ is eliminated and an enable signal $PN_0$ is directly inputted to the buffer $123_1$ and the delay element $46_1$.

The peripheral circuit block 125 differs from the peripheral circuit 22 shown in FIG. 11 in that four bank decoders $127_1$ to $127_4$ (bank decoders $127_3$ and $127_4$ are omitted in illustration) are anew provided in place of eight bank decoders $111_1$ to $111_8$ and in that four enable circuits $112_5$ to $112_8$ are eliminated out of the eight enable circuits $112_1$ to $112_8$. The bank decoders $127_1$ to $127_4$, provided corresponding to the bank blocks $23_1$ to $23_4$, decodes bank select signals $BS_1$ and $BS_2$ and the inverted signals $/BS_1$ and $/BS_2$ thereof and outputs select decision signals $SD_0$ to $SD_3$ indicating its gist if the corresponding bank blocks $23_1$ to $23_4$ are selected. The enable circuits $112_1$ to $112_4$, corresponding to the bank blocks $23_1$ to $23_4$, produce and output enable signals $PN_0$ to $PN_3$ for activating the corresponding bank blocks $23_1$ to $23_4$, on the basis of select decision signals $SD_1$ to $SD_4$ issued from the corresponding bank decoders $127_1$ to $127_4$.

Next, the operation of a semiconductor storage unit as configured above will be described referring to timing charts shown in FIGS. 17 and 18. First of all, the write operation of data into the bank $25_1$ and the readout operation of data from the bank $25_2$ with a gap between an access to the bank $25_1$ and an access to the bank $25_2$ will be described referring to the timing chart of FIG. 17.

Figure 17:
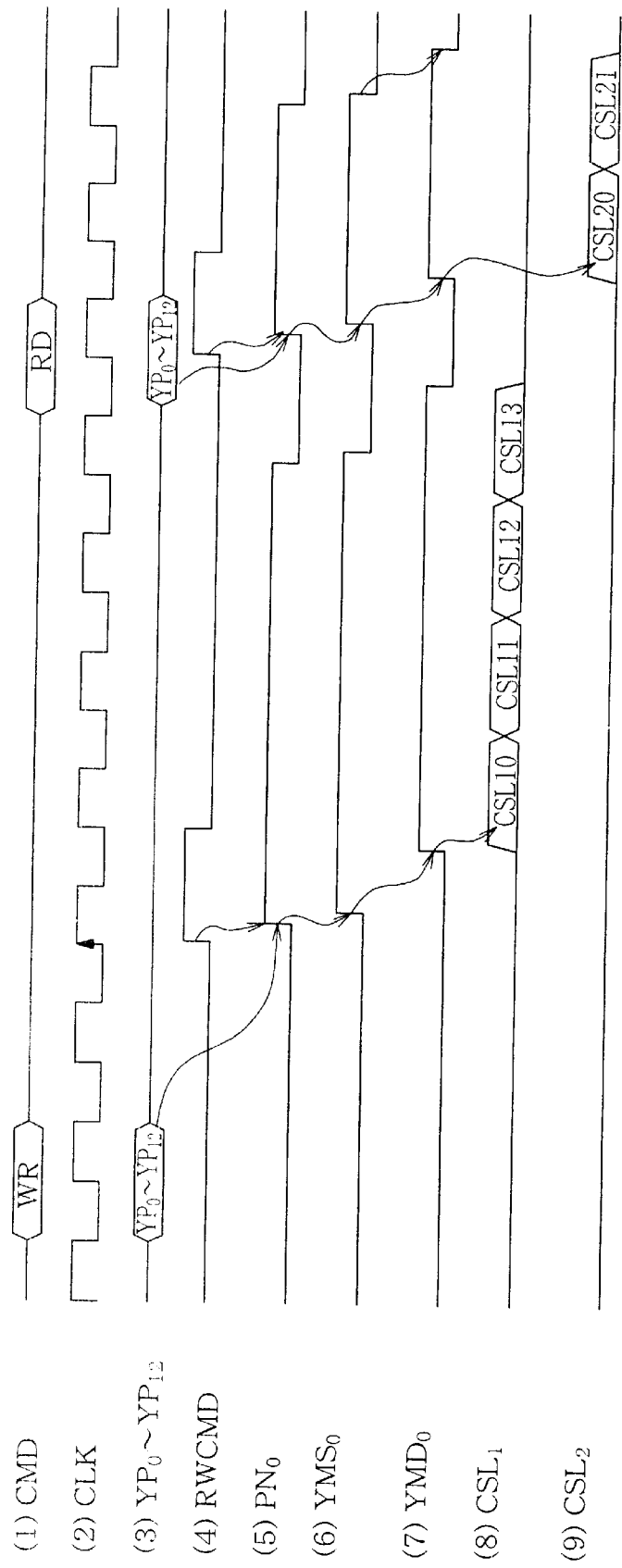
FIG. 17 is a timing chart showing an example of the operation of the semiconductor storage unit.

When a write command WR (See FIG. 17 (1)) and address signals $A_0$ to $A_{15}$ supplied externally are taken in synchronously with the leading (See FIG. 17 (2)) of a first cycle in the clock CLK, internal address signals $YP_0$ to $YP_{12}$ (See FIG. 17 (3)), bank select signals $BS_0$ to $BS_2$ for selecting the bank $25_1$ and an internal command signal RWCMD (See FIG. 17 (4)) are produced. Henceforth, letting the cycle with the leading edge of a clock CLK when this write command WR was inputted taken at the origin be a first cycle, a description will be made. Thereby, since the bank decoder $127_1$ decodes the bits $BS_1$ and $BS_2$ except the least significant bit $BS_0$ out of bank select signals $BS_0$ to $BS_2$ and the inverted signals $/BS_0$ to $/BS_2$ of the bank select signals $BS_1$ and $BS_2$ to output select decision signal $SD_0$ indicating a gist that the corresponding bank block $23_1$ is selected (not shown in FIG. 17), the enable circuit $112_1$ produces an enable signal $PN_0$ for activating the corresponding bank block $23_1$ on the basis of the select decision signal $SD_0$ outputted from the corresponding bank decoder $127_1$ and outputs it synchronously with the internal command signal RWCMD (See FIG. 17 (4)) supplied synchronously with the leading of the third cycle (See FIG. 17 (2)) in the clock CLK (See FIG. 17 (5)). Incidentally, this holds true similarly also for the leading of the first cycle as conventionally. Thus, in the bank select circuit $126_1$, a column multi-select signal $YMS_0$ is outputted from the buffer $123_1$ (See FIG. 17 (6)) and moreover a column multi-select delay signal $YMD_0$ is outputted from the buffer $47_1$ after the lapse of a predetermined time (See FIG. 17 (7)). Besides, the controller 113 produces a column release signal $YR_0$, a write burst signal $WBT_0$ or the like. Incidentally, to simplify the description, other control signals, input signals, circuits and so on not directly associated with this embodiment are omitted, so that only the enable circuit 112 and the controller 113 are shown.

On the other hand, since data supplied externally and inputted through the data I/O terminal $DQ_0$ are supplied to the I/O amplifier $28_1$ or $28_2$ via the data I/O bus $115_1$ or $115_2$ by the data I/O circuit $114_1$, a write amplifier configuring an I/O amplifier $28_1$ or $28_2$, or the like is activated by a column multi-selection delay signal $YMD_0$ (See FIG. 17 (7)) supplied from the bank selection circuit $126_1$ to amplify data supplied via the data I/O bus $115_1$ or $115_2$ from the data I/O circuit $114_1$, then conveying them to the global I/O line $26_1$ or $26_2$. Besides, on the basis of an "H" level write burst signal $WBT_0$ and a column release signal $YR_0$, for example, supplied from the controller 113, the first column control section $49_1$ produces a column release delay inverted signal $YRD_0$, a column release rear signal $YRR_0$ and a column release front signal $YRF_0$. Incidentally, since the write burst signal $WBT_0$ is a "H" level, the column release center signal $YRC_0$ remains a "L" level.

Thereby, in the second column control section $501_1$ the column multi-select signal $YMS_0$ supplied from the bank selection circuit $126_1$ is latched by a column release delay inverted signal $YRD_0$, a switch signal $SW_0$ is outputted and moreover the column selection inverted signal $YSB_0$ is released on the basis of the column release front signal $YRF_0$, whereas a column predecode latch signal $YPT_0$ is produced. Incidentally, since the column release center signal $YRC_0$ remains a "L" level, the precharge global signal $PG_0$ remains an "H" level.

Thus, on the basis of a switch signal $SW_0$, the bank $25_1$ is selected and the global I/O line $26_1$ or $26_2$ is connected to the respective local I/O lines $34_1$ to $34_8$ perpendicular thereto, while signals predecoded by use of a predecoder configuring the column decoder group $35_1$ or $35_2$ are decoded on the basis of a column multi-select signal $YMS_0$ by use of a main decoder configuring the column decoder group $35_1$ or $35_2$ and become outputs of column selection switches. Assuming here that these column selection switches, for example, $CSL_{10}$ to $CSL_{13}$ are successively selected, sense amplifiers 33 of the corresponding bit lines are selected (See FIG. 17 (8)).

Thereby, the data conveyed on the global I/O line $26_1$ or $26_2$ are conveyed to the selected memory cell of the memory cell array $31_1$ via any of the local I/O lines $34_1$ to $34_8$.

Incidentally, the operation of a word driver $32_1$ and a row decoder group $48_1$ are not directly associated with this embodiment, so that a description thereof will be omitted.

By use of the operation described above, data are written into the selected memory cell of the bank $25_1$.

Subsequently, when synchronously with the leading of the eighth cycle of a clock CLK (See FIG. 17 (2)), a read command RD (See FIG. 17 (1)) and address signals $A_0$ to $A_{15}$, supplied externally are taken in, internal address signals $YP_0$ to $YP_{12}$ (See FIG. 17 (3)), bank selection signals $BS_0$ to $BS_2$ for selecting the bank $25_2$ and an internal command signal RWCMD (See FIG. 17 (4)) are produced. Thereby, since the bank decoder $127_1$ decodes the other bits $BS_1$ and $BS_2$ than the least significant bit $BS_0$ out of bank selection signals $BS_0$ to $BS_2$ and the inverted signals $/BS_1$ to $/BS_2$ thereof to output a select decision signal $SD_0$ indicating a gist that the corresponding bank block $23_1$ is selected (not shown in FIG. 17), the enable circuit $112_2$ produces an enable signal $PN_0$ on the basis of the select decision signal $SD_0$ outputted from the corresponding bank decoder $127_2$ and outputs it synchronously with the internal command signal RWCMD (See FIG. 17 (4)) supplied synchronously with the leading of an eighth cycle (See FIG. 17 (2)) in the clock CLK (See FIG. 17 (5)). Thus, in the bank selection circuit $126_1$, a column multi-select signal $YMS_0$ is outputted from the buffer $123_1$ (See FIG. 17 (6)) and moreover a column multi-selection delay signal $YMD_0$ is outputted from the buffer $123_1$ after the lapse of a predetermined time (See FIG. 17 (7)). Besides, the controller 113 produces a column release signal $YR_0$, a write burst signal $WBT_0$ or the like.

On the other hand, on the basis of an "L" level write burst signal $WBT_0$ and a column release signal $YR_0$, for example, supplied from the controller 113, the first column control section $49_1$ produces a column release delay inverted signal $YRD_0$, a column release rear signal $YRR_0$, a column release front signal $YRF_0$ and a column release center signal $YRC_0$. Thereby, in the second column control section $50_1$, the column multi-select signal $YMS_0$ supplied from the bank selection circuit $126_1$ is latched by a column release delay inverted signal $YRD_0$, a switch signal $SW_0$ is outputted and moreover the column selection inverted signal $YSB_0$ is released on the basis of the column release front signal $YRF_0$, whereas a column predecode latch signal $YPT_0$ is produced and further a precharge global signal $PG_0$ becoming only by one shot, e.g. an "L" level is produced.

Thus, on the basis of a switch signal $SW_1$, the bank $25_2$ is selected and the global I/O line $26_1$ or $26_2$ is connected to the respective local I/O lines $34_1$ to $34_8$ perpendicular thereto, but the global I/O line $26_1$ or $26_2$ is short-circuited by means of the precharge global I/O circuit $36_1$ or $36_2$ only during the period of the precharge global signal $PG_0$ becoming an "L" level to set the global I/O line $26_1$ or $26_2$ to the precharge state. Besides, on the basis of a column multi-selection signal $YMS_0$, signals predecoded by use of a predecoder configuring the column decoder group $35_1$ or $35_2$ are decoded by use of a main decoder configuring the column decoder group $35_1$ or $35_2$ and become outputs of column selection switches. Assuming here that these column selection switches, for example, $CSL_{20}$ to $CSL_{21}$ are successively selected, sense amplifiers 33 of the corresponding bit lines are selected (See FIG. 17 (9)). Thereby, the sense amplifier $33_3$ or $33_4$ detects and amplifies the data read out onto a bit line from the memory cell connected to the selected row of the memory cell array $31_2$, so that the detected or amplified data are conveyed to the I/O amplifier $28_1$ or $28_2$ via the local I/O lines 345 to 348 and the global I/O line $26_1$ or $26_2$. Activated by the column multi-selection delay signal $YMD_0$ (See FIG. 17 (7)) supplied from the bank select circuit $126_1$, data amplifier configuring the I/O amplifier $28_1$ or $28_2$, or the like conveys the supplied data to the data I/O circuit $114_1$ via the data I/O bus $115_1$ or $115_2$ after amplified. Thus, the data I/O circuit $114_1$ successively outputs the supplied data through the data I/O terminal $DQ_0$.

Incidentally, the operation of a word driver $32_2$ and a row decoder group 482 are not directly associated with this embodiment, so that a description thereof will be omitted.

By use of the operation described above, data are read out from the selected memory cell of the bank $25_2$.

Figure 18:
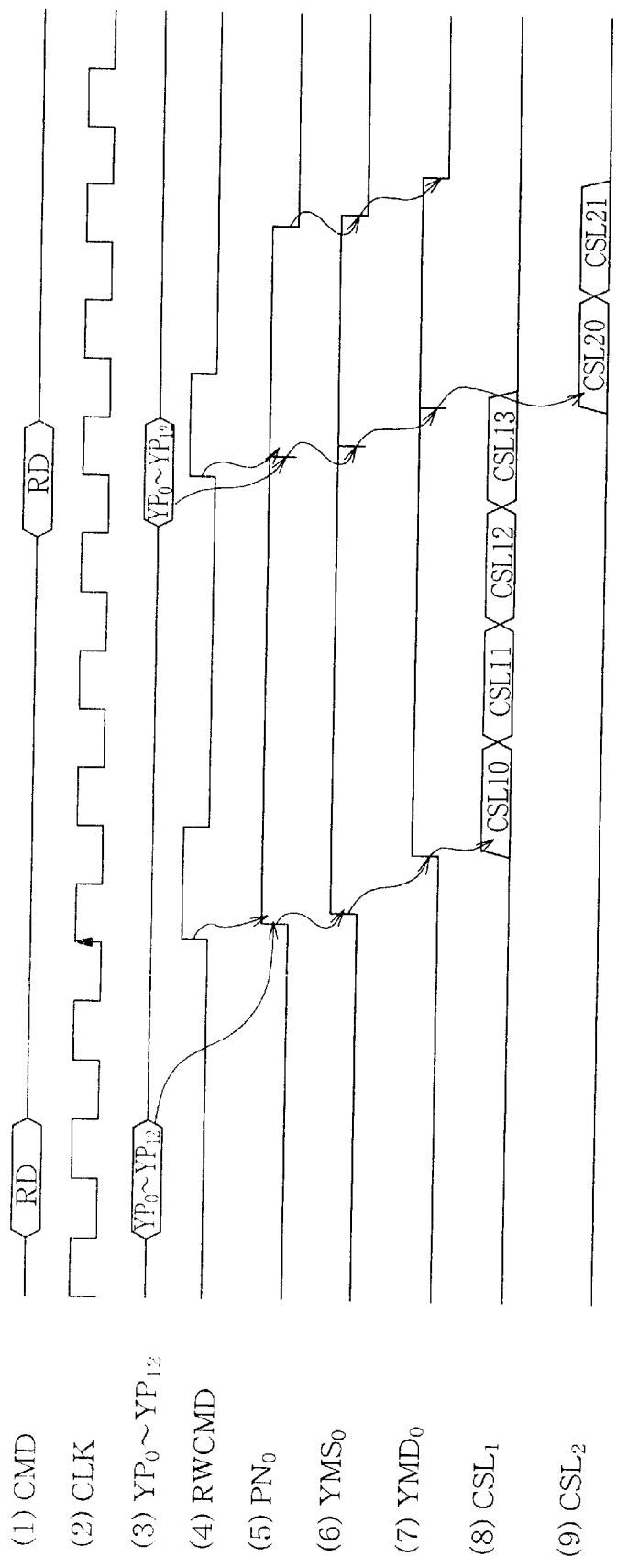
FIG. 18 is a timing chart showing an example of the operation of the semiconductor storage unit.

Next, FIG. 18 is a timing chart showing the continuous readout operation of data from the banks $25_1$ and $25_2$ without a gap between an access to the bank $25_1$ and an access to the bank $25_2$. The basic operation is similar to that of the above presence case of a gap. As shown in FIGS. 18 (5) to (7), Li; however, the absence of a gap allows an enable signal $PN_0$ a column multi-select signal $YMS_0$ or a column multi-select delay signal $YMD_0$ to be kept active continuously. Incidentally, in FIG. 18 (5) to (7), the time of switching is designated with a mark to clearly understand the switching from an access to the bank $25_1$ over to an access to the bank $25_2$, but the signal keeps active in fact.

Like this, according to this embodiment, since the global I/O lines $26_1$ and $26_2$ are provided in common with the banks $25_1$ and $25_2$ disposed top-to-bottom and moreover the bank selection circuit $126_1$ is so arranged as to produce a column multi-select signal $YMS_0$ and a column multi-select delay signal $YMD_0$ from the enable signal $PN_0$ for activating the bank block $23_1$, the number of wiring lines can be reduced to a greater extent than Embodiment 2 of producing enable signals $PN_0$ and $PN_1$ for each bank and moreover the number of bank decoders 127 and enable circuits 112 can be also reduced by half.

D. Embodiment 4

Figure 19:
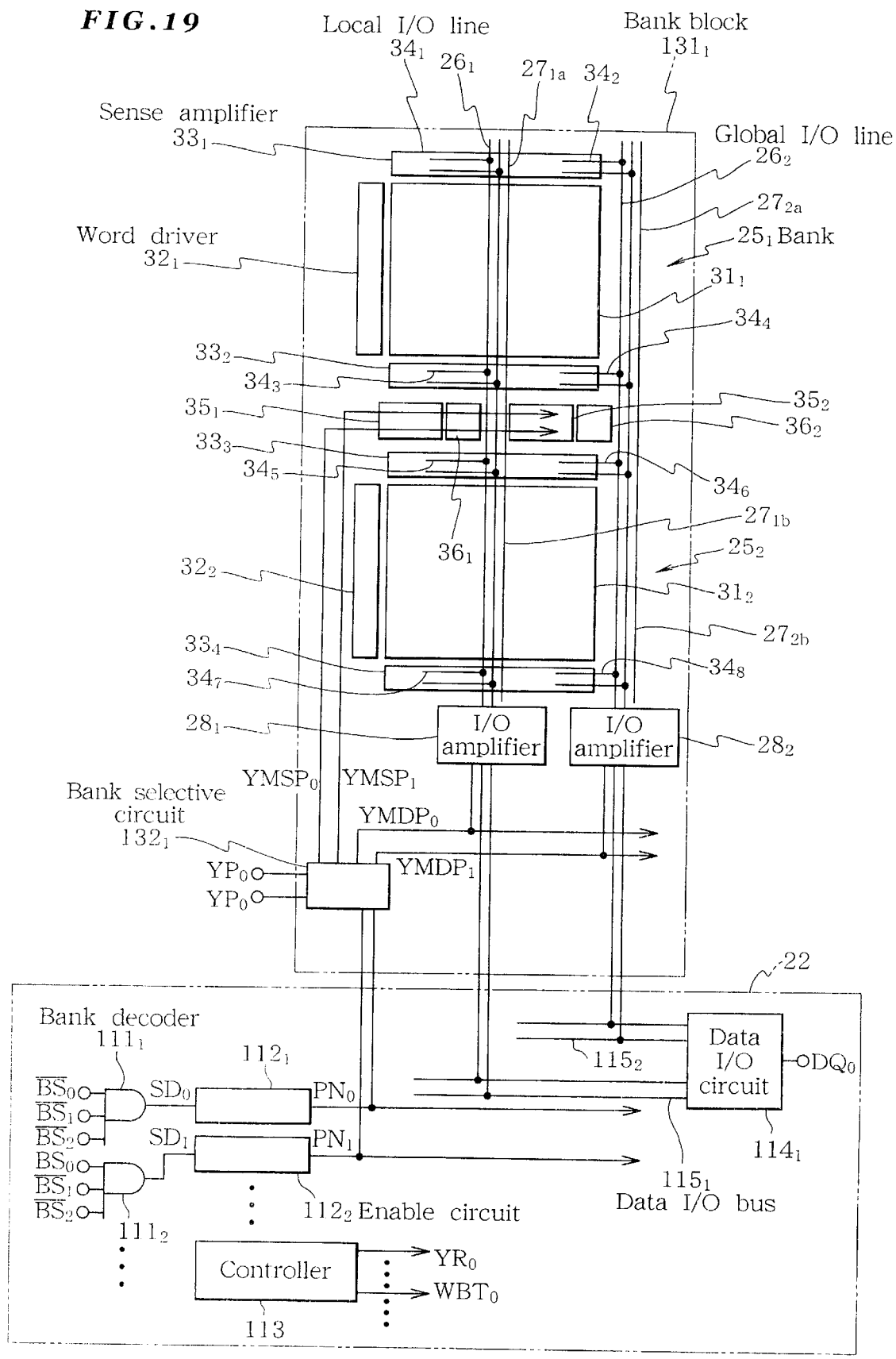
FIG. 19 is a block diagram showing an example of the electric configuration of the main part of a semiconductor storage unit according to Embodiment 4 of the present invention.

Then, Embodiment 4 will be described. FIG. 19 is a block diagram showing the electric configuration of the main part of a semiconductor storage unit according to Embodiment 4. In FIG. 19, like symbols are attached to parts corresponding to individual parts of FIG. 11 and a description thereof will be omitted.

With the semiconductor storage unit shown in FIG. 19, a bank block $131_1$ is anew provided in place of the bank block $121_1$ shown in FIG. 11. Incidentally, in a semiconductor storage unit according to Embodiment 4, the configuration of the functional blocks $21_1$ except for the bank block $131_1$ and the bank block $131_2$ (unshown but the same configuration except for a difference in indices of individual components from the bank block $131_1$ as well as a difference in indices of inputted/outputted signals and data) is much the same as that of the functional block $21_1$ shown in FIG. 2 (1). Besides, as with Embodiments 1 to 3, the chip layout also comprises four bank blocks as shown in FIG. 2 (2). With respect to the second column control section $50_1$, however, since the bank select circuit 132, produces only a column multi-select signal $YMS_0$ in place of column select signals $YS_0$ and $YS_1$ as mentioned later, the components related to a column select signal $YS_0$ are correspondingly applied to those related to a column multi-select signal $YMS_0$ as they are among the circuit shown in FIG. 6, but those related to a column select signal $YS_1$ are unnecessary and eliminated.

Figure 20:
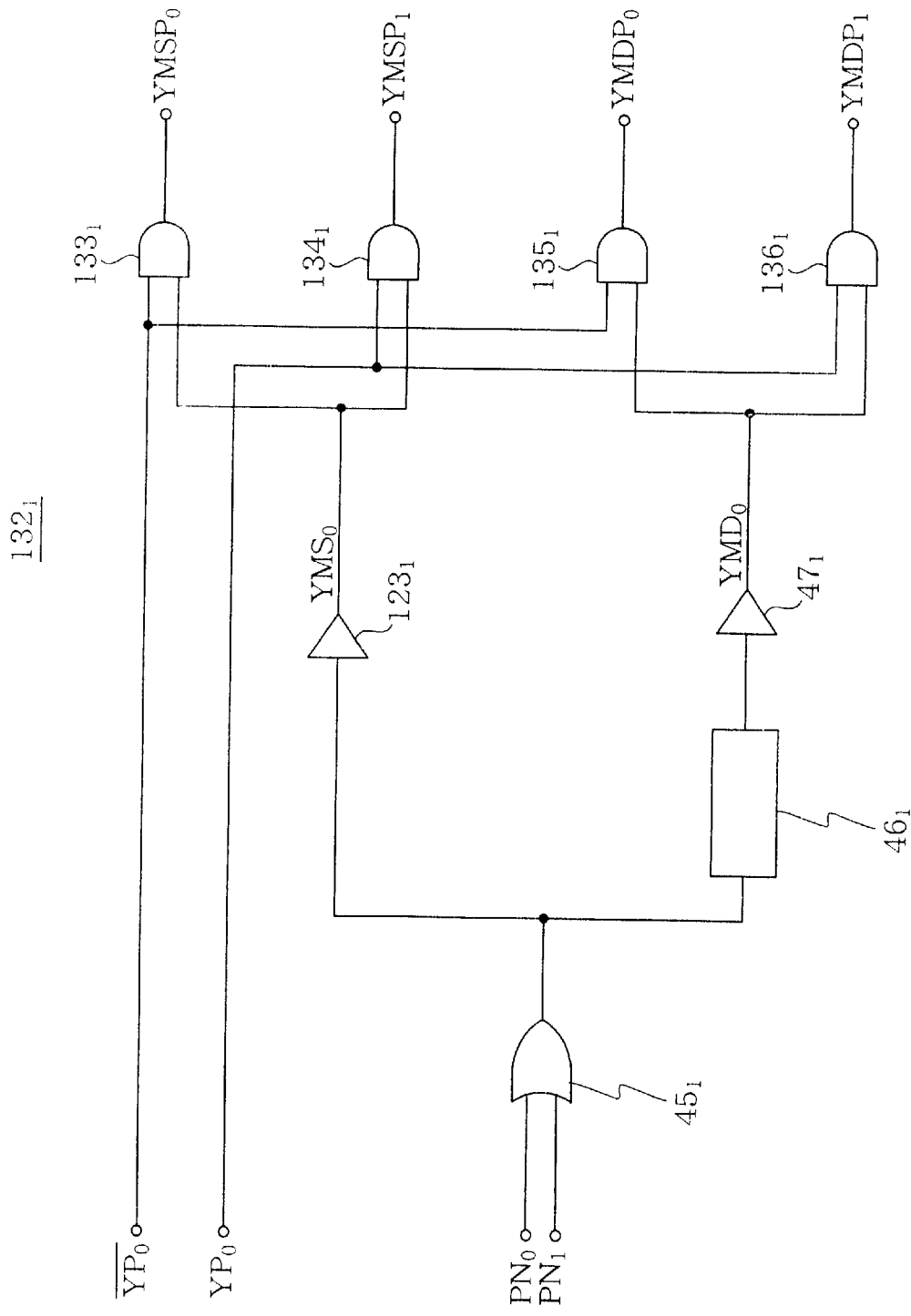
FIG. 20 is a block diagram showing an example of the configuration of a bank select circuit configuring the semiconductor storage unit.

The bank block $131_1$ differs from the bank block $121_1$ shown in FIG. 11 in that a bank select circuit $132_1$ is anew provided in place of the bank select circuit $122_1$. Here, FIG. 20 is a block diagram showing one configurational example of bank select circuit $132_1$. In FIG. 20, like symbols are attached to those corresponding to individual parts of FIG. 12 and a description thereof will be omitted. The bank select circuit $132_1$ differs from the bank select circuit $122_1$ in that an AND gate $133_1$ for making a logical product of an internal address signal $/YP_0$ and a column multi-select signal $YMS_0$, as an output signal of the buffer $123_1$ to output the resultant as a column multi-select signal $YMSP_0$, an AND gate $134_1$ for making a logical product of an internal address signal $YP_0$ and a column multi-select signal $YMS_0$ to output the resultant as a column multi-select signal $YMSP_1$, an AND gate $135_1$ for making a logical product of an internal address signal $/YP_0$ and a column multi-select delay signal $YMD_0$, as an output signal of the buffer $47_1$ to output the resultant as a column multi-select delay signal $YMDP_0$ and an AND gate $136_1$ for making a logical product of an internal address signal $YP_0$ and a column multi-select delay signal $YMD_0$ to output the resultant as a column multi-select delay signal $YMDP_1$ are anew provided. Incidentally, except that the number of precharge global I/O circuits $36_1$ or $36_2$ activated by the column multi-select signal $YMSP_0$ and $YMSP_1$ as well as the column multi-select delay signal $YMDP_0$ and $YMDP_1$ are reduced by half, thereby resulting a reduction by half of the number of activated memory cells in the bank $25_1$ or $25_2$ relative to that of Embodiment 2, the operation of a semiconductor storage unit as configured above is much the same as with Embodiment 2, so that a description thereof will be omitted.

Like this, according to Embodiment 4, since AND gates $133_1$, $134_1$, $135_1$ and $136_1$ are provided, logical products of an internal signals $/YP_0$ and $YP_0$ with a column multi-select signal $YMS_0$ or a column multi-select delay signal $YMD_0$ are made and the results are used as activating signals, the number of memory cells in the banks $25_1$ and $25_2$ can be reduced by half as compared with Embodiment 2.

E. Embodiment 5

Figure 21:
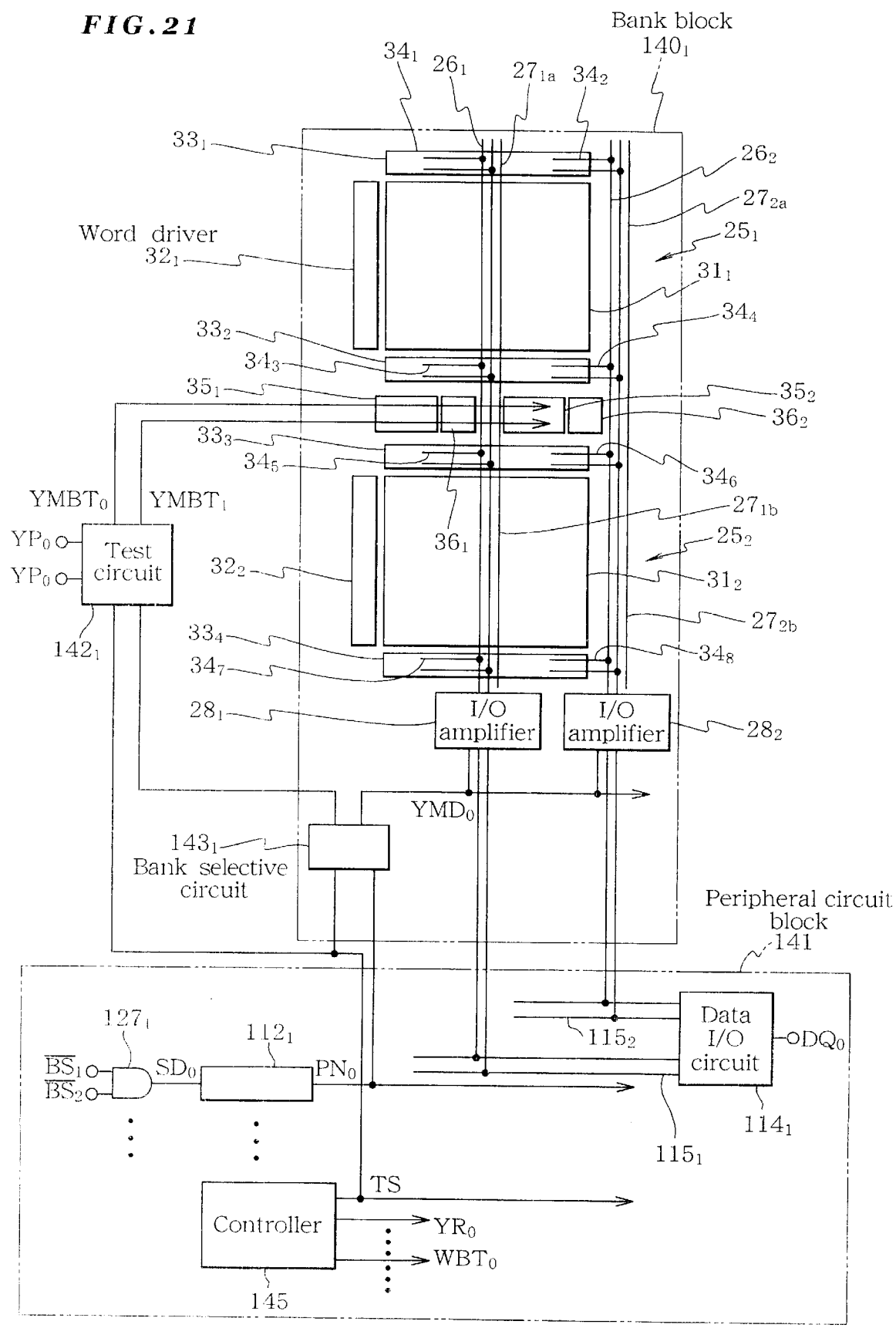
FIG. 21 is a block diagram showing an example of the electric configuration of the main part of a semiconductor storage unit according to Embodiment 5 of the present invention.

Then, Embodiment 5 will be described. FIG. 21 is a block diagram showing the electric configuration of the main part of a semiconductor storage unit according to Embodiment 5. In FIG. 21, like symbols are attached to parts corresponding to individual parts of FIG. 15 and a description thereof will be omitted. With the semiconductor storage unit shown in FIG. 21, a bank block $140_1$ and a peripheral circuit block 141 are anew provided in place of the bank block $124_1$ and the peripheral circuit block 125 shown in FIG. 15 and further a test circuit $142_1$ configuring a column control circuit is anew provided along with the first column control section $49_1$ and the second column control sections $50_1$ and $50_2$. Incidentally, in a semiconductor storage unit according to this embodiment, the configuration of the functional block $21_1$ except for the bank block $140_1$ and the bank block $140_2$ (unshown but the same configuration except for a difference in indices of individual components from the bank block $140_1$ as well as a difference in indices of inputted/outputted signals and data), the peripheral circuit block 141 and the test circuit $142_1$ is much the same as that of the functional block $21_1$ shown in FIG. 2 (1). Besides, as with Embodiments 1 to 4, the chip layout also comprises four bank blocks as shown in FIG. 2 (2). With respect to the second column control section $50_1$, however, since the bank select circuit $143_1$ produces only a column multi-select signal $YMS_0$ in place of column select signals $YS_0$ and $YS_1$ as mentioned later, the components related to a column select signal $YS_0$ are correspondingly applied to those related to a column multi-select signal $YMS_0$ as they are among the circuit shown in FIG. 6, but those related to a column select signal $YS_1$ are unnecessary and eliminated.

Figure 22:
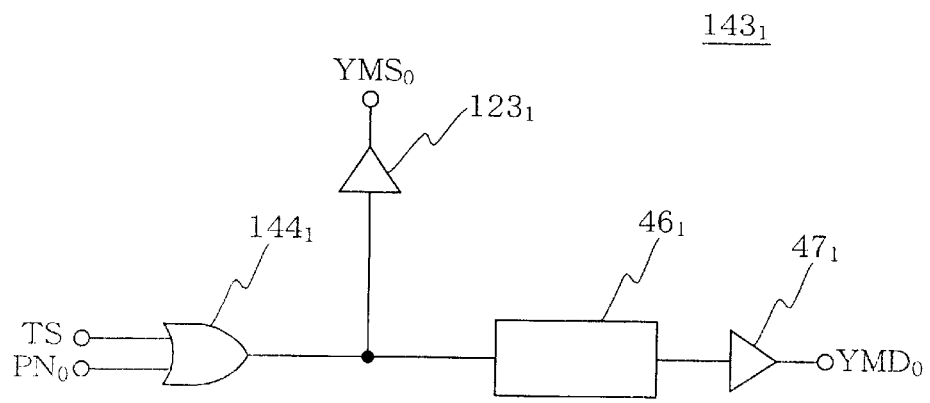
FIG. 22 is a block diagram showing an example of the configuration of a bank select circuit configuring the semiconductor storage unit.

The bank block $140_1$ differs from the bank block $124_1$ shown in FIG. 15 in that a bank select circuit $143_1$ is anew provided in place of the bank select circuit $126_1$. Here, FIG. 22 is a block diagram showing one configurational example of a bank select circuit $143_1$. In FIG. 22, like symbols are attached to those corresponding to individual parts of FIG. 16 and a description thereof will be omitted. The bank select circuit $143_1$ differs from the bank select circuit $126_1$ in that an OR gate $144_1$ for making a logical sum of a test signal TS supplied from the controller 153 and an enable signal $PN_0$ is anew provided and an output signal of the OR gate $144_1$ is inputted to the buffer $123_1$ and the delay element $46_1$.

The peripheral circuit block 141 differs from the peripheral circuit block 125 shown in FIG. 15 in that a controller 145 is anew provided in place of the controller 113. The controller 145 differs from the controller 113 shown in FIG. 15 in producing and outputting also a test signal TS for performing a test such as fault analysis of this semiconductor storage unit.

Next, FIG. 22 shows a block diagram of a configurational example of test circuit $142_1$. The test circuit $142_1$ of this example broadly comprises an AND gate $146_1$ for making a logical product of a test signal TS supplied from the controller 145 configuring the peripheral circuit block 141 and an internal address signal $/YP_0$, an AND gate $147_1$ for making a logical product of the test signal TS and an internal address signal $YP_0$, an invertor $148_1$ for inverting the test signal TS, an AND gate $149_1$ for making a logical product of an output signal of the invertor $148_1$ and a column multi-select signal $YMS_0$ supplied from the bank select circuit $143_1$, an OR gate $150_1$ for making a logical sum of an output signal of the AND gate $146_1$ and an output signal of the AND gate $149_1$, an OR gate $151_1$ for making a logical sum of an output signal of the AND gate $147_1$ and an output signal of the AND gate $149_1$, a buffer gate $152_1$ for buffering an output signal of the OR gate $150^1$ to output it as a column multi-select signal $YMBT_0$ and a buffer $153_1$ for buffering an output signal of the OR gate $151_1$ to output it as a column multi-select signal $YMBT_1$.

In such a configuration, since the controller 145 outputs a an "H" level test signal TS on the basis of a test command supplied externally at the time of a test, a column multi-select signal $YMS_0$ is outputted from the bank select circuit $143_1$ on the basis of the test signal TS. In this case, when an internal address signal $/YP_0$ is supplied to test the bank $25_1$, the AND gate $146_1$ allows the test signal TS to pass in the test circuit $142_1$. Thereby, since a column multi-select signal $YMBT_0$ is outputted from the buffer $152_1$, a test of the bank $25_1$ becomes possible. In contrast to this, when an internal address signal $YP_0$ is supplied to test the bank $25_2$, the AND gate $147_1$ allows the test signal TS to pass in the test circuit $142_1$. Thereby, since a column multi-select signal $YMBT_1$ is outputted from the buffer $153_1$, a test of the bank $25_2$ becomes possible.

On the other hand, at a normal time, since the controller 145 outputs an "L" level test signal TS, the AND gate $149_1$ always allows the column multi-select signal $YMS_0$ to pass in the test circuit $142_1$. Thereby, a column multi-select signal $YMBT_0$ and a column multi-select signal $YMBT_1$ are outputted from the buffers $152_1$ and $153_1$. The subsequent operation is almost similar to that of a semiconductor storage unit according to Embodiment 3, so that a description thereof will be omitted.

As described above, in a large capacity semiconductor storage unit, a test mode for writing data at a time or reading data at a time into/from a plurality of banks is provided to shorten the time of a fault analysis or an estimate test and there is a case of supplying a test signal to a semiconductor storage unit for this purpose. In a semiconductor storage unit with global I/O lines $26_1$ and $26_2$ provided in common with the upper and lower banks $25_1$ and $25_2$, only the bank 25 selected by use of the bank select signals $BS_0$ to $BS_2$ is activated in an ordinary use mode, but since the upper and lower banks $25_1$ and $25_2$ are simultaneously excited in a conventional test mode when a test mode is supplied as it is, data read from individual banks $25_1$ and $25_2$ collide with each other in the global I/O line $26_1$ or $26_2$, thus disabling a test to be normally carried out.

Under these circumstances, by an arrangement that a test signal is produced in the controller 145 and moreover only either of a column multi-select signal $YMBT_0$ or a column multi-select signal $YMBT_1$ is outputted on the basis of an internal address signal /$YP_0$ or an internal address signal $YP_0$ in the test circuit $142_1$ as seen in this example, only either of the bank $25_1$ or the bank $25_2$ configuring the bank block $140_1$ is activated. Thus, the collision of data read out from individual banks $25_1$ and $25_2$ on the global I/O line $26_1$ or $26_2$ can be avoided.

F. Embodiment 6

Figure 24:
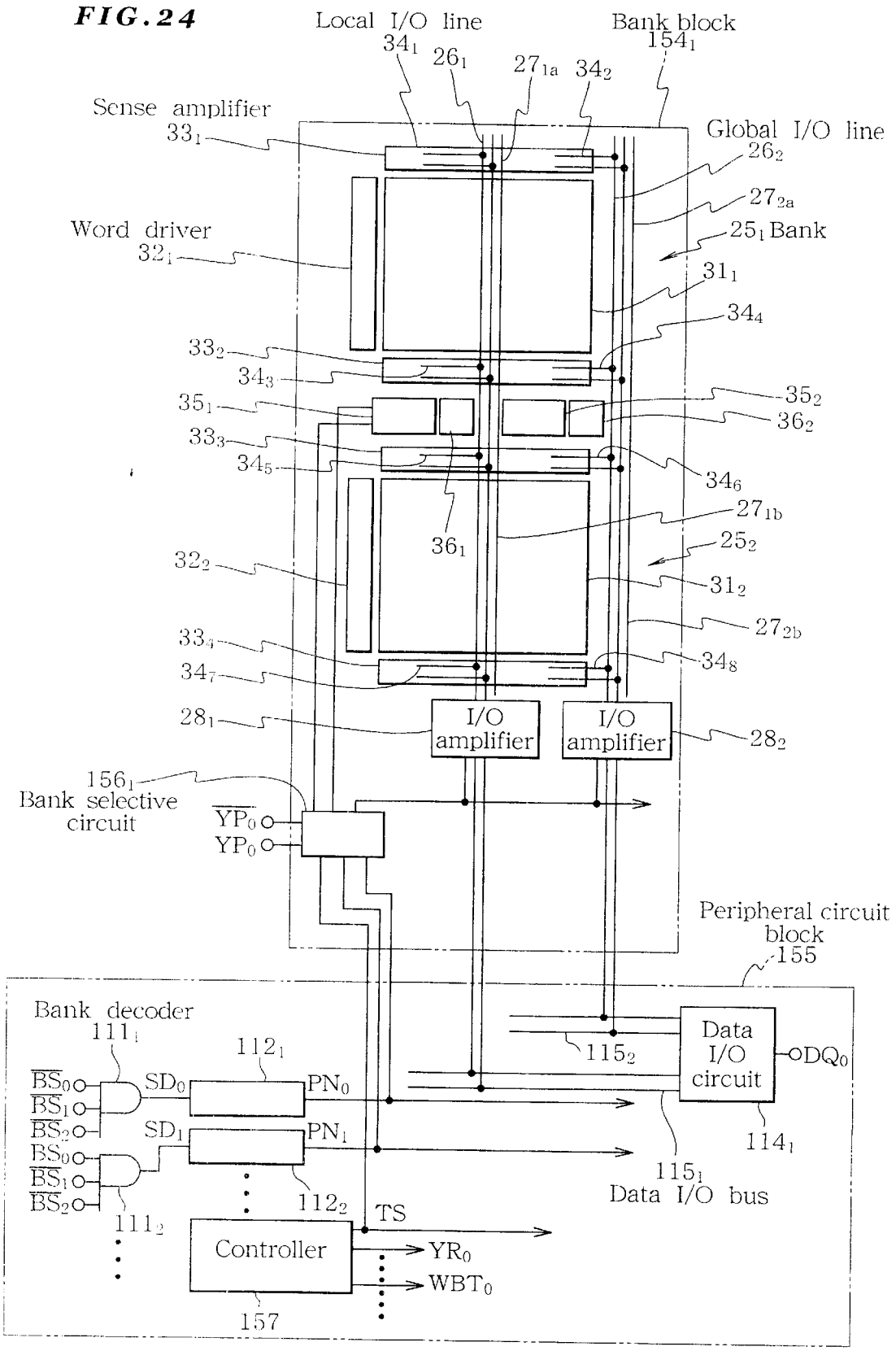
FIG. 24 is a block diagram showing an example of the electric configuration of the main part of a semiconductor storage unit according to Embodiment 6 of the present invention.

Then, Embodiment 6 will be described. FIG. 24 is a block diagram showing the electric configuration of the main part of a semiconductor storage unit according to Embodiment 6. In FIG. 24, like symbols are attached to parts corresponding to individual parts of FIG. 1 and a description thereof will be omitted. With the semiconductor storage unit shown in FIG. 24, a bank block $154_1$ and a peripheral circuit block 155 are anew provided in place of the bank block 23, and the peripheral circuit block 22 shown in FIG. 1. Incidentally, in a semiconductor storage unit according to this embodiment, other constituents of the functional block $21_1$ than the bank block $154_1$ and the bank block $154_2$ (unshown but the same configuration except for a difference in indices of individual components from the bank block $154_1$ as well as a difference in indices of inputted/outputted signals and data) and the peripheral circuit block $155_1$ are much the same as those of the functional block $21_1$ shown in FIG. 2 (1). Besides, as with Embodiments 1 to 5, the chip layout also comprises four bank blocks as shown in FIG. 2 (2).

Figure 25:
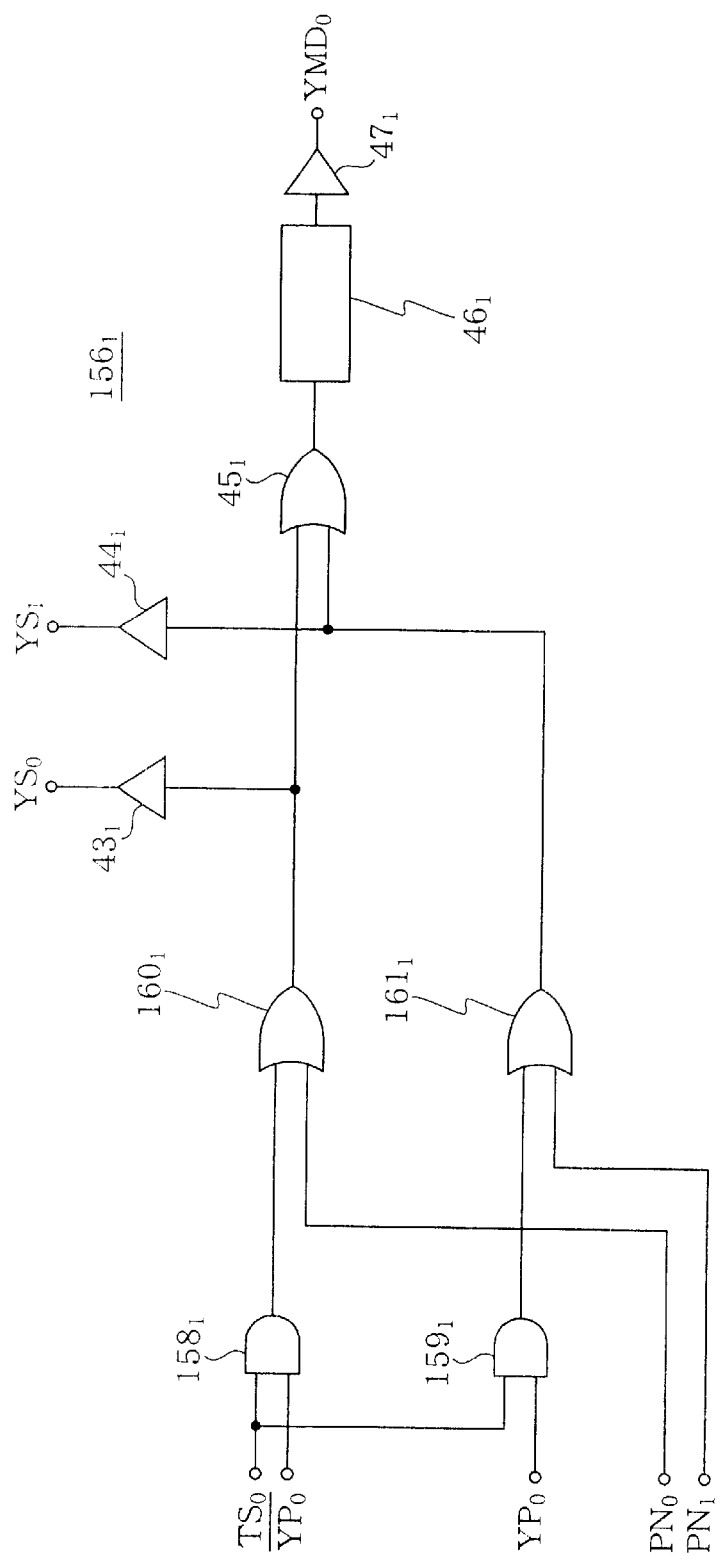
FIG. 25 is a block diagram showing an example of the configuration a bank select circuit configuring the semiconductor storage unit.

The bank block $154_1$ differs from the bank block $23_1$ shown in FIG. 1 in that a bank select circuit $156_1$ is anew provided in place of the bank select circuit $29_1$. Here, FIG. 25 is a block diagram showing one configurational example of bank select circuit $156_1$. In FIG. 25, like symbols are attached to those corresponding to individual parts of FIG. 4 and a description thereof will be omitted. The bank select circuit $156_1$ differs from the bank select circuit $29_1$ shown in FIG. 4 in that an AND gate $158_1$ for making a logical product of a test signal TS and an internal address signal/ $YP_0$, an AND gate $159_1$ for making a logical product of a test signal TS and an internal address signal $YP_0$, an OR gate $160_1$ for making a logical sum of an output signal of the AND gate $158_1$ and an enable signal $PN_0$ and an OR gate $161_1$ for making a logical sum of an output signal of the AND gate $159_1$ and an enable signal $PN_1$ are anew provided and in that an output signal of the OR gate $160_1$ is inputted to the input terminal of the buffer $43_1$ and one of input terminal of the OR gate $45_1$ and an output signal of the OR gate $161_1$ is inputted to the input of the buffer $44_1$ and the other of input terminal of the OR gate $45_1$.

Besides, the peripheral circuit block 155 shown in FIG. 24 differs from the peripheral circuit block 22 shown in FIG. 1 in that a controller 157 is anew provided in place of the controller 113. The controller 157 differs from the controller 113 shown in FIG. 1 in producing and outputting a test signal TS also for performing a test such as fault analysis of this semiconductor unit on the basis of a test command supplied externally.

In such a configuration, the controller 157 outputs an "H" level test signal TS on the basis of a test command supplied externally at the time of a test. In this case, when an go internal address signal /$YP_0$ is supplied to test the bank $25_1$, the AND gate $158_1$ allows the test signal TS to pass in the bank selective circuit $156_1$. Thereby, since a column select signal $YS_0$ is outputted from the buffer $43_1$, a test of the bank $25_1$ becomes possible. In contrast to this, when an internal address signal $YP_0$ is supplied to test the bank $25_2$, the AND gate $159_1$ allows the test signal TS to pass in the bank selective circuit $156_1$. Thereby, since a column select signal $YS_1$ is outputted from the buffer $44_1$, a test of the bank $25_2$ becomes possible.

On the other hand, at a normal time, since the controller 157 outputs an "L" level test signal TS, in the bank selective circuit $156_1$ both an output signal of the AND gate $158_1$ and an output signal of the AND gate $159_1$ are always of an "L" level and column select signals $YS_0$ and $YS_1$ are outputted only on the basis of enable signals $PN_0$ and $PN_1$. The subsequent operation is almost similar to that of a semiconductor storage unit according to Embodiment 1, so that a description thereof will be omitted.

Like this, according to Embodiment 6, since the controller 157 produces a test signal TS and moreover the bank select circuit $155_1$ is so arranged as to output only either of a column select signal $YS_0$ or a column select signal $YS_1$ on the basis of an internal address signal /$YP_0$ or an internal address signal $YP_0$, only either of the banks $25_1$ or $25_2$ configuring the bank block $154_1$ is activated. Thus, the collision of data read out from individual banks $25_1$ and $25_2$ on the global I/O line $26_1$ or $26_2$ can be avoided.

G. Embodiment 7

Figure 26:
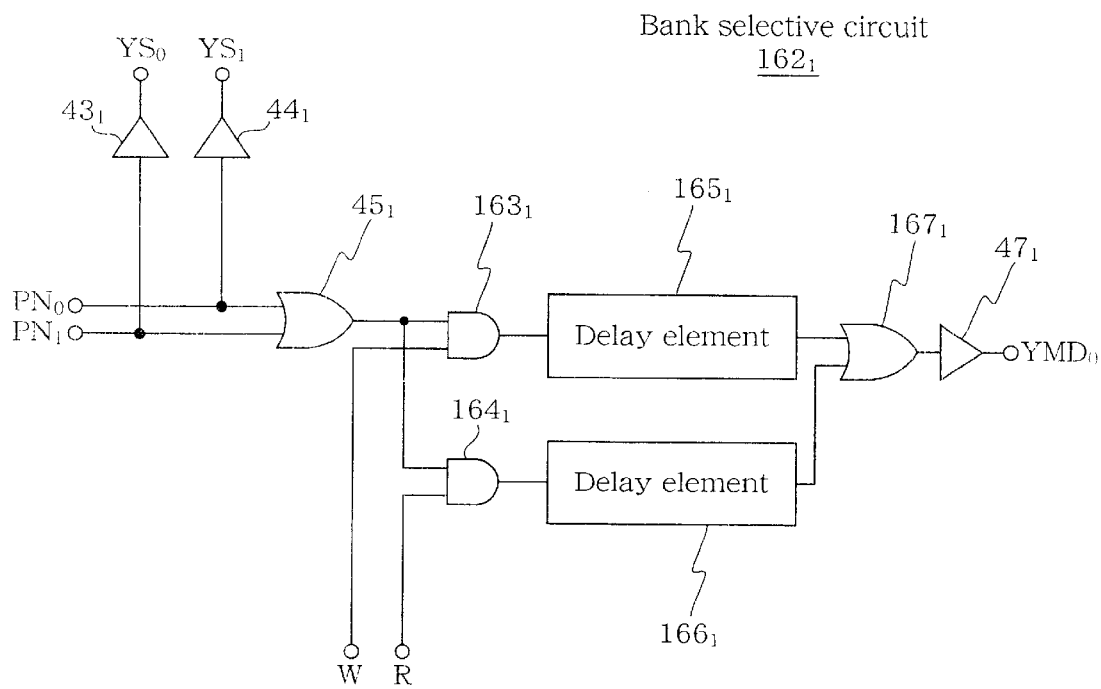
FIG. 26 is a block diagram showing an example of the configuration f a bank select circuit configuring a semiconductor storage unit according to Embodiment 7 of the present invention.

Then, Embodiment 7 will be described. FIG. 26 is a block a diagram showing one configurational example of bank selective circuit $162_1$ configuring a semiconductor storage unit according to Embodiment 7 of the present invention. In FIG. 26, like symbols are attached to parts corresponding to individual parts of FIG. 4 and a description thereof will be omitted. The bank selective circuit $162_1$ differs from the bank selective circuit $29_1$ shown in FIG. 4 in that an AND gate $163_1$ for making a logical product of an output signal of the OR gate $45_1$ and a write signal W indicating the write period of data supplied from the controller 113 configuring the peripheral circuit block 22, an AND gate $164_1$ for making a logical product of an output signal of the OR gate $45_1$ and a read signal R indicating the readout period of data supplied from the controller 113 configuring the peripheral circuit block 22, a delay element $165_1$ for delaying an output signal of the AND gate $163_1$ for a predetermined time, a delay element $166_1$ for delaying an output signal of the AND gate $164_1$ for a predetermined time and an OR gate $167_1$ for making a logical sum of an output signal of the delay element $165_1$ and the delay element $166_1$ are anew provided in place of the delay element $46_1$ and in that an output signal of the OR gate $167_1$ is supplied to the input terminal of the buffer $47_1$. The delay amount of the delay element $165_1$ and that of the delay element $166_1$ are set to mutual different values corresponding to the difference of skew lags (timing lags) between the data write time and the data readout time to reduce a skew lag.

Incidentally, other constituents and operations of a semiconductor storage unit according to Embodiment 7 are much the same as those of a semiconductor storage unit according to Embodiment 1 (See FIGS. 1 to 6 and 8) and therefore a description thereof will be omitted.

Like this, according to this embodiment, since delay elements $165_1$ and $166_1$ are provided in the bank selective circuit $162_1$, a skew lag at the time of data write and a skew lad at the time of data readout can be separately reduced respectively and the design on the regulation of skews is facilitated. Hereinafter, the reason for this will be described.

At the time of data write, externally supplied data are conveyed to a sense amplifier via the global I/O line $26_1$ or $26_2$ and the local I/O lines $34_1$ to $34_8$ after amplified in a write amplifier configuring the I/O amplifiers $28_1$ and $28_2$ activated by a column multi-select delay signal $YMD_0$. Thus, prior to the turn ON of the column select switch based on a column select signal $YS_0$ or $YS_1$, a column multi-select delay signal $YMD_0$ has to be produced.

In contrast to this, at the time of data readout, data are read out from a memory cell via a bit line by turning ON the column select switch, conveyed via the local I/O lines $34_1$ to $34_8$ and the global I/O line $26_1$ or $26_2$ after amplified by use of a sense amplifier and amplified in a data amplifier configuring the I/O amplifier $28_1$ or $28_2$ activated by a column multi-select delay signal $YMD_0$. Thus, after the column select switch is turned ON on the basis of a column select signal $YS_0$ or $YS_1$, a column multi-select delay signal $YMD_0$ has to be produced and the column multi-select delay signal $YMD_0$ cannot be turned OFF till all the data are read out.

In other words, at the time of data write and at the time of data readout, the timing for turning ON the column select switch and the occurrence time of a column multi-select delay signal $YMD_0$ have to be made different.

Though having a delay depending on the performance of individual elements and a delay originating in delay elements (See FIG. 6), a column select signals $YS_0$ and $YS_1$ for controlling a plurality of column decoders configuring the column decoder groups $35_1$ and $35_2$, a column predecode latch signal $YPT_0$ for activating a plurality of column decoders configuring the column decoder groups $35_1$ and $35_2$ and a column select inverted signal $YSB_0$ for inactivating a plurality of column decoders configuring the column decoder groups $35_1$ and $35_2$ are produced synchronously with the leading of the corresponding clock CLK independently of the type of supplied commands. Accordingly, if a column multi-select delay signal $YMD_0$ for activating a data amplifier or write amplifier configuring the I/O amplifier $28_1$ or $28_2$ is produced regardless of the type of supplied command synchronously with the leading of a clock CLK corresponding in a uniform manner, e.g. in the case of a change from an access to the bank $25_1$ to an access to the bank $25_2$ by use of a switch signal $SW_0$ or $SW_1$ for a continuous readout of data from the bank $25_1$ and $25_2$ under a continuously issued read command RD, a period of simultaneous activation of data amplifiers configuring the I/O amplifiers $28_1$ and $28_2$ commonly connected to the data I/O bus $115_1$ or $115_2$ may occur. In this case, data read from the bank $25_1$ and data read from the bank $25_2$ collide with each other on the data I/O bus $115_1$ and $115_2$, thereby preventing data from being correctly read out.

Ordinarily, to prevent such a colliding period of data, the length of an activation period of a column multi-select delay signal $YMD_0$ is regulated in common with a write command WR and a read command RD, the occurrence timing of a column multi-select delay signal $YMD_0$ to a write command WR during the write of data is delayed by lengthening the period of a clock CLK or the period extending from the trailing of the prior column multi-select delay signal $YMD_0$ to the leading of the next clock CLK is prolonged during the readout of data. With an increase in storage capacity, however, the size of the bank $25_1$ and the bank $25_2$ increases and further the length of global I/O buses $26_1$ and $26_2$ also increases, thus leading to s prolonged period of data conveyance there, so that the above collision cannot be completely prevented only by regulating the length of the activation period of a column multi-select delay signal $YMD_0$ and a longer period of the clock CLK results in a lower speed of data write or data readout.

Under theses circumstances, in this embodiment, a skew lag at the write time of data and a skew lag at the readout time of data are made separately reducible by the provision of delay elements $165_1$ and $166_1$ in the bank selective circuit $162_1$ mutually different in delay amount on the bank selective circuit, thereby facilitating the design on the regulation of skew lags and enabling the write and readout of data to be carried out at high speed.

H. Embodiment 8

Figure 27:
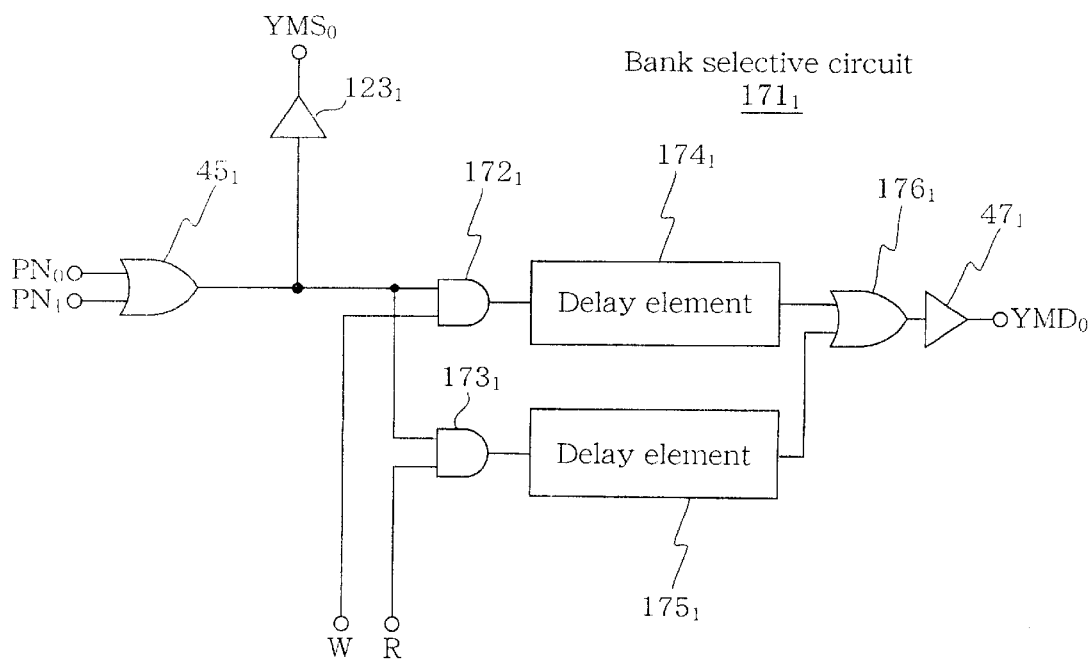
FIG. 27 is a block diagram showing an example of the configuration of a bank select circuit configuring a semiconductor storage unit according to Embodiment 8 of the present invention.

Then, Embodiment 8 will be described. FIG. 27 is a circuit diagram showing a configurational example of bank selective circuit $171_1$ of a semiconductor storage unit according to Embodiment 8. In FIG. 21, like symbols are attached to parts corresponding to individual parts of FIG. 12 and a description thereof will be omitted. The bank selective circuit $171_1$ differs from the bank selective circuit $122_1$ shown in FIG. 12 in that an AND gate $172_1$ for making a logical product of an output signal of the OR gate $45_1$ and a write signal W supplied from the controller 113 configuring the peripheral circuit block 22, an AND gate $173_1$ for making a logical product of an output signal of the OR gate $45_1$ and a read signal R supplied from the controller 113 configuring the peripheral circuit block 22, a delay element $174_1$ for delaying an output signal of the AND gate $172_1$ for a predetermined time, a delay element $175_1$ for delaying an output signal of the AND gate $173_1$ for a predetermined time and an OR gate $176_1$ for making a logical sum of an output signal of the delay element $174_1$ and the delay element $175_1$ are anew provided in place of the delay element $46_1$ and in that an output signal of the OR gate $176_1$ is supplied to the input terminal of the buffer $119_1$. The delay amount of the delay element $174_1$ and that of the delay element $175_1$ are set to mutually different values from each other corresponding to the difference of skew lags between the data write time and the data readout time to reduce a skew lag. Incidentally, other constituents of a semiconductor storage unit according to Embodiment 8 are much the same as those of a semiconductor storage unit according to Embodiment 2 (See FIG. 2 and 11) and therefore a description thereof will be omitted.

Next, in a semiconductor storage unit as configured above, the write operation of data into the bank $25_1$ and the readout operation of data from the bank $25_1$ will be described referring to the timing chart of FIG. 28.

Figure 28:
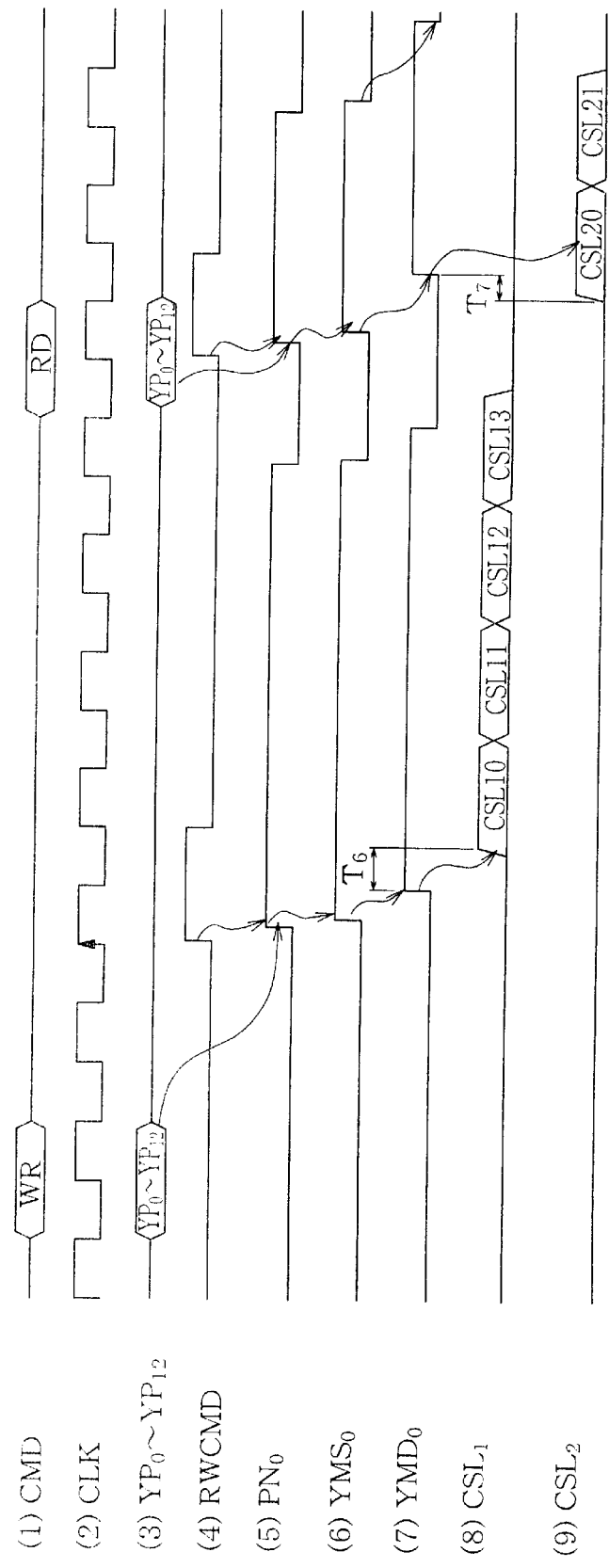
FIG. 28 is a timing chart showing an example of the operation of the semiconductor storage unit.

When a write command WR (See FIG. 28 (1)) and address signals $A_0$ to $A_{15}$ supplied externally are taken in synchronously with the leading (See FIG. 28 (2)) of a first cycle in the clock CLK, internal address signals $YP_0$ to $YP_{12}$ (See FIG. 28 (3)), bank select signals $BS_0$ to $BS_2$ for selecting the bank $25_1$ and an internal command signal RWCMD (See FIG. 28 (4)) are produced. Henceforth, letting the first cycle be a cycle with the leading of a clock CLK taken as the origin in which this write command WR was inputted, a description will be made. Thereby, since the bank decoder $111_1$ decodes bank selection signals $BS_0$ to $BS_2$ and the inverted signals /$BS_0$ to /$BS_2$ thereof to output a select decision signal $SD_0$ (not shown in FIG. 28), the enable circuit $112_2$ produces an enable signal $PN_0$ on the basis of the select decision signal $SD_0$ outputted from the corresponding bank decoder $111_1$ and outputs it synchronously with the internal command signal RWCMD (See FIG. 28 (4)) supplied synchronously with the leading of the third cycle (See FIG. 28 (2)) in the clock CLK (See FIG. 28 (5)). Incidentally, this holds true similarly also for the first cycle as conventionally.

Thus, in the bank selective circuit $171_1$ a column multi-select signal $YMS_0$ is outputted from the buffer $123_1$ (See FIG. 28 (6)) and simultaneously a write signal W is supplied from the controller 113 configuring the peripheral circuit block 22, thereby allowing the AND gate $172_1$ to pass an enable signal $PN_0$. Thereby, in the delay element $174_1$, the enable signal $PN_0$ is delayed by a set delay amount, and thereafter outputted from the buffer $47_1$ via the OR gate $176_1$ as a column multi-select delay signal $YMD_0$ (See FIG. 28 (7)). Besides, the controller 113 produces a column release signal $YR_0$, a write burst signal $WBT_0$ or the like. Incidentally, in this embodiment, other control signals, input signals, circuits or the like that are not directly related to the embodiment are omitted, and thus only the enable circuit 112 and the controller 113 are described, aiming at simplifying the explanation.

On the other hand, since data supplied externally and inputted through the data I/O terminal $DQ_0$ are supplied to the I/O amplifier $28_1$ or $28_2$ via the data I/O bus $115_1$ or $115_2$ by the data I/O circuit $114_1$, a write amplifier configuring an I/O amplifier $28_1$ or $28_2$, or the like is activated by a column multi-select delay signal $YMD_0$ (See FIG. 28 (7)) supplied from the bank selective circuit $171_1$ to amplify data supplied via the data I/O bus $115_1$ or $115_2$ from the data I/O circuit $114_1$, then conveying them to the global I/O line $26_1$ or $26_2$.

Besides, on the basis of an "H" level write burst signal $WBT_0$ and a column release signal $YR_0$, for example, supplied from the controller 113, the first column control section $49_1$ produces a column release delay inverted signal $YRD_0$, a column release rear signal $YRR_0$ and a column release front signal $YRF_0$. Incidentally, since the write burst signal $WBT_0$ is a "H" level, the column release center signal $YRC_0$ remains a "L" level.

Thereby, in the second column control section $50_1$, the column multi-select signal $YMS_0$ supplied from the bank selective circuit $171_1$ is latched by a column release delay inverted signal $YRD_0$, a switch signal $SW_0$ is outputted and moreover the column selection inverted signal $YSB_0$ is released on the basis of the column release front signal $YRF_0$, whereas a column predecode latch signal $YPT_0$ is produced. Incidentally, since the column release center signal $YRC_0$ remains a "L" level, the precharge global signal $PG_0$ remains an "H" level.

Thus, on the basis of a switch signal $SW_0$, the bank $25_1$ is selected and the global I/O line $26_1$ or $26_2$ is connected to the respective local I/O lines $34_1$ to $34_8$ perpendicular thereto, while signals predecoded by use of a predecoder configuring the column decoder group $35_1$ or $35_2$ are decoded on the basis of a column multi-select signal $YMS_0$ by use of a main decoder configuring the column decoder group $35_1$ or $35_2$ and become outputs of column selection switches in conformity with the timing of data arrival, i.e. after the lapse of time $T_6$ from the leading of a column multi-select delay signal $YMD_0$ as shown in FIGS. 28 (7) and (8). Assuming here that these column selection switches, for example, $CSL_10$ to $CSL_{13}$ are successively selected, sense amplifiers 33 of the corresponding bit lines are selected (See FIG. 28 (8)). Thereby, the data conveyed on the global I/O line $26_1$ or $26_2$ are conveyed to the selected memory cell of the memory cell array $31_1$ via any of the local I/O lines $34_1$ to $34_8$.

Incidentally, the operation of a word driver $32_1$ and a row decoder group $48_1$ are not directly associated with this embodiment, so that a description thereof will be omitted.

By use of the operation described above, data are written into the selected memory cell of the bank $25_1$.

Subsequently, when synchronously with the leading of the eighth cycle of a clock CLK (See FIG. 28 (2)), a read command RD (See FIG. 28 (1)) and address signals $A_0$ to $A_{15}$ supplied externally are taken in, internal address signals $YP_0$ to $YP_{12}$ (See FIG. 28 (3)), bank selection signals $BS_0$ to $BS_2$ for selecting the bank $25_1$ and an internal command signal RWCMD (See FIG. 28 (4)) are produced. Thereby, since the bank decoder $111_1$ decodes bank selection signals $BS_0$ to $BS_2$ and the inverted signals $/BS_0$ to $/BS_2$ thereof to output a select decision signal $SD_0$ (not shown in FIG. 28), the enable circuit $112_1$ produces an enable signal $PN_0$ on the basis of the select decision signal $SD_0$ outputted from the corresponding bank decoder $111_1$ and outputs it synchronously with the internal command signal RWCMD (See FIG. 28 (4)) supplied synchronous with the leading of an eighth cycle (See FIG. 28 (2)) in the clock CLK.

Thus, in the bank selective circuit $171_1$, a column multi-select signal $YMS_0$ is outputted from the buffer $123_1$ (See FIG. 28 (6)) and simultaneously a read signal R is supplied from the controller 113, thereby allowing the AND gate $173_1$ to pass an enable signal $PN_0$. Thereby, in the delay element $175_1$, the enable signal $PN_0$ is delayed by a set delay amount, i.e. as mentioned later an amount corresponding to the time taken from the detection and amplification of data read from a memory cell connected to the selected row of the memory cell array $31_2$ till the data arrival at the I/O amplifier $28_1$ or $28_2$ via the local I/O, lines $34_1$ to $34_4$ and the global I/O line $26_1$ or $26_2$, and thereafter outputted from the buffer $47_1$ via the OR gate $176_1$ as a column multi-select delay signal $YMD_0$ (See FIG. 22 (7)). Besides, the controller 113 produces a column release signal $YR_0$, a write burst signal $WBT_0$ or the like.

On the other hand, on the basis of an "L" level write burst signal $WBT_0$ and a column release signal $YR_0$, for example, supplied from the controller 113, the first column control section $49_1$ produces a column release delay inverted signal $YRD_0$, a column release rear signal $YRR_0$, a column release front signal $YRF_0$ and a column release center signal $YRC_0$. Thereby, in the second column control section $50_1$, the column multi-select signal $YMS_0$ supplied from the bank selective circuit $171_1$ is latched by a column release delay inverted signal $YRD_0$, a switch signal $SW_0$ is outputted and simultaneously the column select inverted signal $YSB_0$ is released on the basis of the column release front signal $YRF_0$, :whereas a column predecode latch signal $YPT_0$ is produced and further a precharge global signal $PG_0$ becoming only by one shot, e.g. an "L" level is produced.

Thus, on the basis of a switch signal $SW_0$, the bank $25_1$ is selected and the global I/O line $26_1$ or $26_2$ is connected to the respective local I/O lines $34_1$ to $34_4$ perpendicular thereto, but the global I/O line $26_1$ or $26_2$ is short-circuited by means of the precharge global I/O circuit $36_1$ or $36_2$ only during the period of the precharge global signal $PG_0$ becoming an "L" level to set the global I/O line $26_1$ or $26_2$ to the precharge state. Besides, on the basis of a column selection signal $YS_0$, signals predecoded by use of a predecoder configuring the column decoder group $35_1$ or $35_2$ are decoded by use of a main decoder configuring the column decoder group $35_1$ or $35_2$ and become outputs of column selection switches. Assuming here that these column selection switches, for example, $CSL_{20}$ to $CSL_{21}$ are successively selected, sense amplifiers $33_1$ or $33_2$ of the corresponding bit lines are selected (See FIG. 28 (10)). Thereby, the sense amplifier $33_1$ or $33_2$ detects and amplifies the data read out from the memory cell connected to the selected row of the memory cell array $31_1$, so that the detected or amplified data are conveyed to the I/O amplifier $28_1$ or $28_2$ via the local I/O lines $34_1$ to $34_4$ and the global I/O $26_1$ or $26_2$. Activated by the column multi-select delay signal $YMD_0$ (See FIG. 28

(8)) supplied from the bank selection circuit $171_1$ in conformity with the timing of data arrival as mentioned above, i.e. after the lapse of time T7 from the leading of a column select switch $CSL_{20}$ as shown in FIGS. 28 (7) and (9), data amplifier configuring the I/O amplifier $28_1$ or $28_2$, or the like conveys the supplied data to the data I/O circuit $114_1$ via the data I/O bus $115_1$ or $115_2$ after amplified. Thus, the data I/O circuit $114_1$ successively outputs the supplied data through the data I/O terminal $DQ_0$. Incidentally, the operation of a word driver $32_1$ and a row decoder group $48_1$ are not directly associated with this embodiment, so that a description thereof will be omitted.

By use of the operation described above, data are read out from the selected memory cell of the bank $25_1$.

Incidentally, since other operations of a semiconductor storage unit according to Embodiment 8 are much the same as those of a semiconductor storage unit according to Embodiment 2 (See FIGS. 13 and 14), a description thereof will be omitted. Embodiment 8 can be applied to Embodiment 4 as it is.

Like this, according to this embodiment, a skew lag at the write time of data and a skew lag at the readout time of data are made separately reducible by the provision of delay elements $174_1$ and $175_1$ in the bank selective circuit $171_1$, thereby facilitating the design on the regulation of skew lags and enabling the write and readout of data to be carried out at high speed.

I. Embodiment 9

Figure 29:
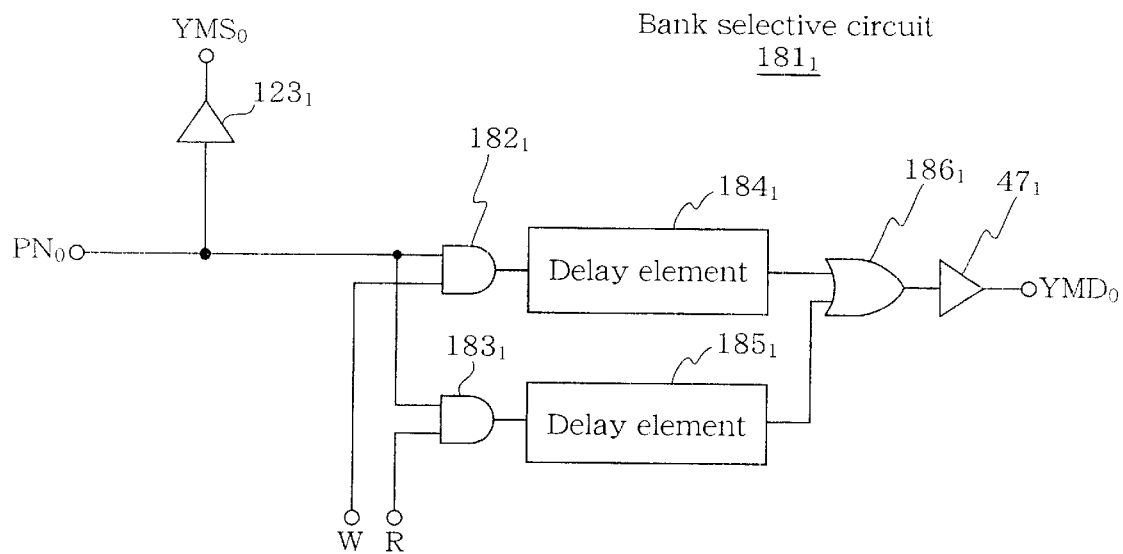
FIG. 29 is a block diagram showing an example of the configuration of a bank select circuit configuring a semiconductor storage unit according to Embodiment 9 of the present invention.

Then, Embodiment 9 will be described. FIG. 29 is a circuit diagram showing a configurational example of bank selective circuit $181_1$ of a semiconductor storage unit according to Embodiment 9. In FIG. 29, like symbols are attached to parts corresponding to individual parts of FIG. 16 and a description thereof will be omitted. The bank selective circuit $181_1$ differs from the bank selective circuit $126_1$ shown in FIG. 16 in that an AND gate $182_1$ for making a logical product of an enable signal $PN_0$ and a write signal W supplied from the controller 113 configuring the peripheral circuit block 125, an AND gate $183_1$ for making a logical product of an enable signal $PN_0$ and a read signal R supplied from the controller 113 configuring the peripheral circuit block 125, a delay element $184_1$ for delaying an output signal of the AND gate $182_1$ for a predetermined time, a delay element $185_1$ for delaying an output signal of the AND gate $183_1$ for a predetermined time and an OR gate $186_1$ for making a logical sum of an output signal of the delay element $184_1$ and the delay element $185_1$ are anew provided in place of the delay element $46_1$ and in that an output signal of the OR gate $186_1$ is supplied to the input terminal of the buffer $47_1$. The delay amount of the delay element $184_1$ and that of the delay element $185_1$ are set to mutually different values corresponding to the difference of skew lags between the data write time and the data readout time to reduce a skew lag. Incidentally, other constituents and operations of a semiconductor storage unit according to Embodiment 9 are much the same as the constituents and operations of a semiconductor storage unit according to Embodiment 3 (See FIGS. 2, 15, 17 and 18) and therefore a description thereof will be omitted.

Like this, according to this embodiment, a skew lag at the write time of data and a skew lag at the readout time of data are made separately reducible by the provision of delay elements $184_1$ and $185_1$ in the bank selective circuit $181_1$, thereby facilitating the design on the regulation of skew lags and enabling the write and readout of data to be carried out at high speed.

J. Embodiment 10

Figure 23:
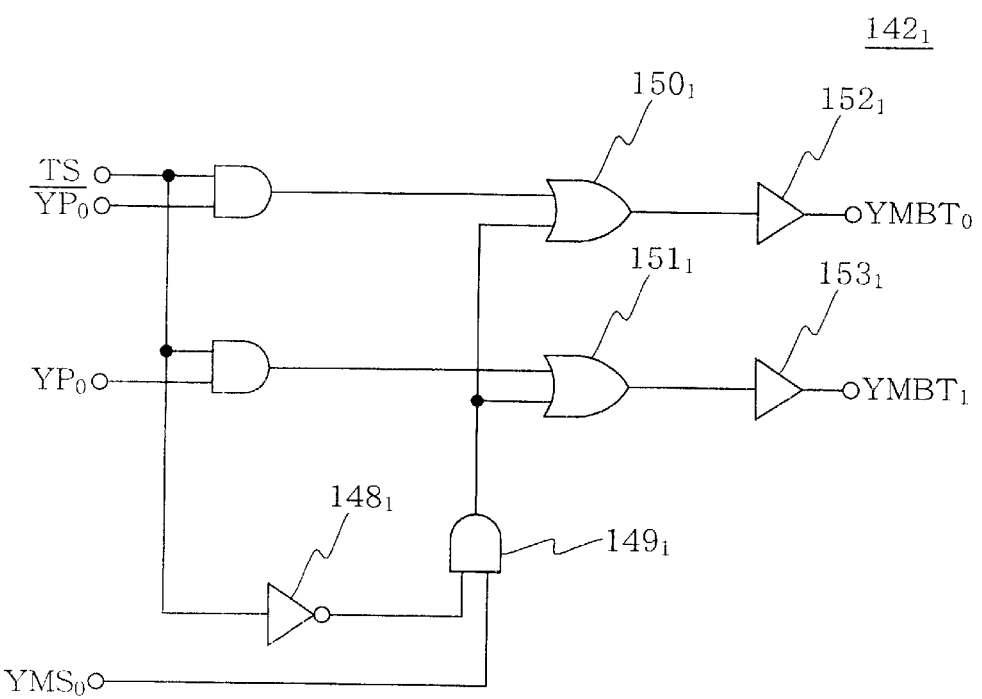
FIG. 23 is a block diagram showing an example of the configuration of a test circuit configuring the semiconductor storage unit.
Figure 30:
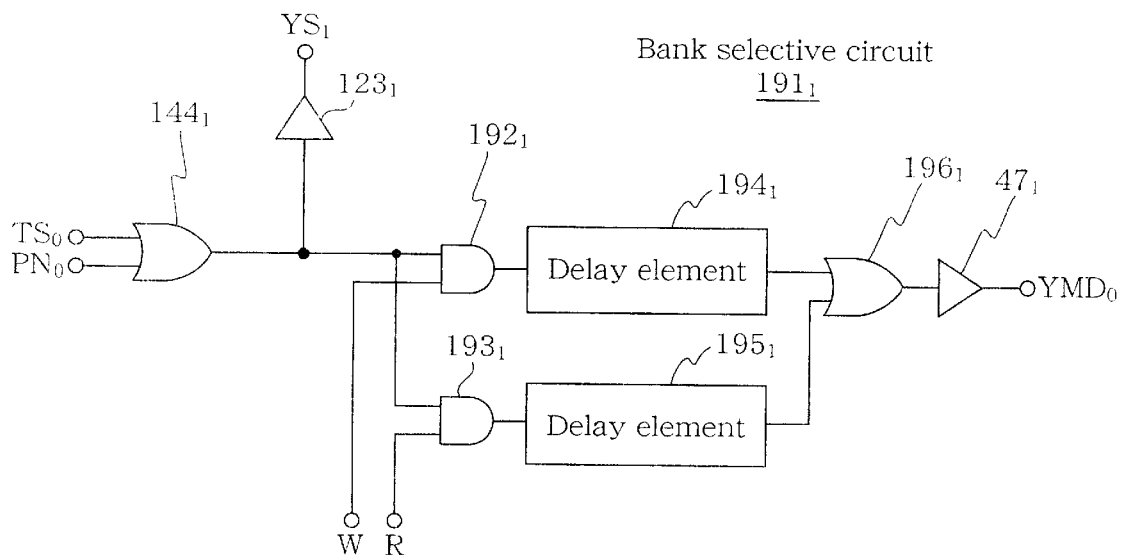
FIG. 30 is a block diagram showing an example of the configuration of a bank select circuit configuring a semiconductor storage unit according to Embodiment 10 of the present invention.

Then, Embodiment 10 will be described. FIG. 30 is a circuit diagram showing a configurational example of bank selective circuit $191_1$ of a semiconductor storage unit according to Embodiment 10. In FIG. 30, like symbols are attached to parts corresponding to individual parts of FIG. 22 and a description thereof will be omitted. The bank selective circuit $191_1$ differs from the bank selective circuit $143_1$ shown in FIG. 22 in that an AND gate $192_1$ for making a logical product of an output signal of the OR gate $144_1$ and a write signal W supplied from the controller 145 configuring the peripheral circuit block 141, an AND gate $193_1$ for making a logical product of an output signal of the OR gate $144_1$ and a read signal R supplied from the controller 145 configuring the peripheral circuit block 141, a delay element $194_1$ for delaying an output signal of the AND gate $192_1$ for a predetermined time, a delay element $195_1$ for delaying an output signal of the AND gate $193_1$ for a predetermined time and an OR gate $196_1$ for making a logical sum of an output signal of the delay element $194_1$ and the delay element $195_1$ are anew provided in place of the delay element $46_1$ and in that an output signal of the OR gate $196_1$ is supplied to the input terminal of the buffer $47_1$. The delay amount of the delay element $194_1$ and that of the delay element $195_1$ are set to mutually different values corresponding to the difference of skew lags between the data write time and the data readout time to reduce a skew lag. Incidentally, other constituents and operations of a semiconductor storage unit according to Embodiment 10 are much the same as those of a semiconductor storage unit according to Embodiment 5 (See FIG. 2, 21 and 23) and therefore a description thereof will be omitted.

Like this, according to this embodiment, a skew lag at the write time of data and a skew lag at the readout time of data are made separately reducible by the provision of delay elements $194_1$ and $195_1$ in the bank selective circuit $191_1$, thereby facilitating the design on the regulation of skew lags and enabling the write and readout of data to be carried out at high speed.

K. Embodiment 11

Figure 31:
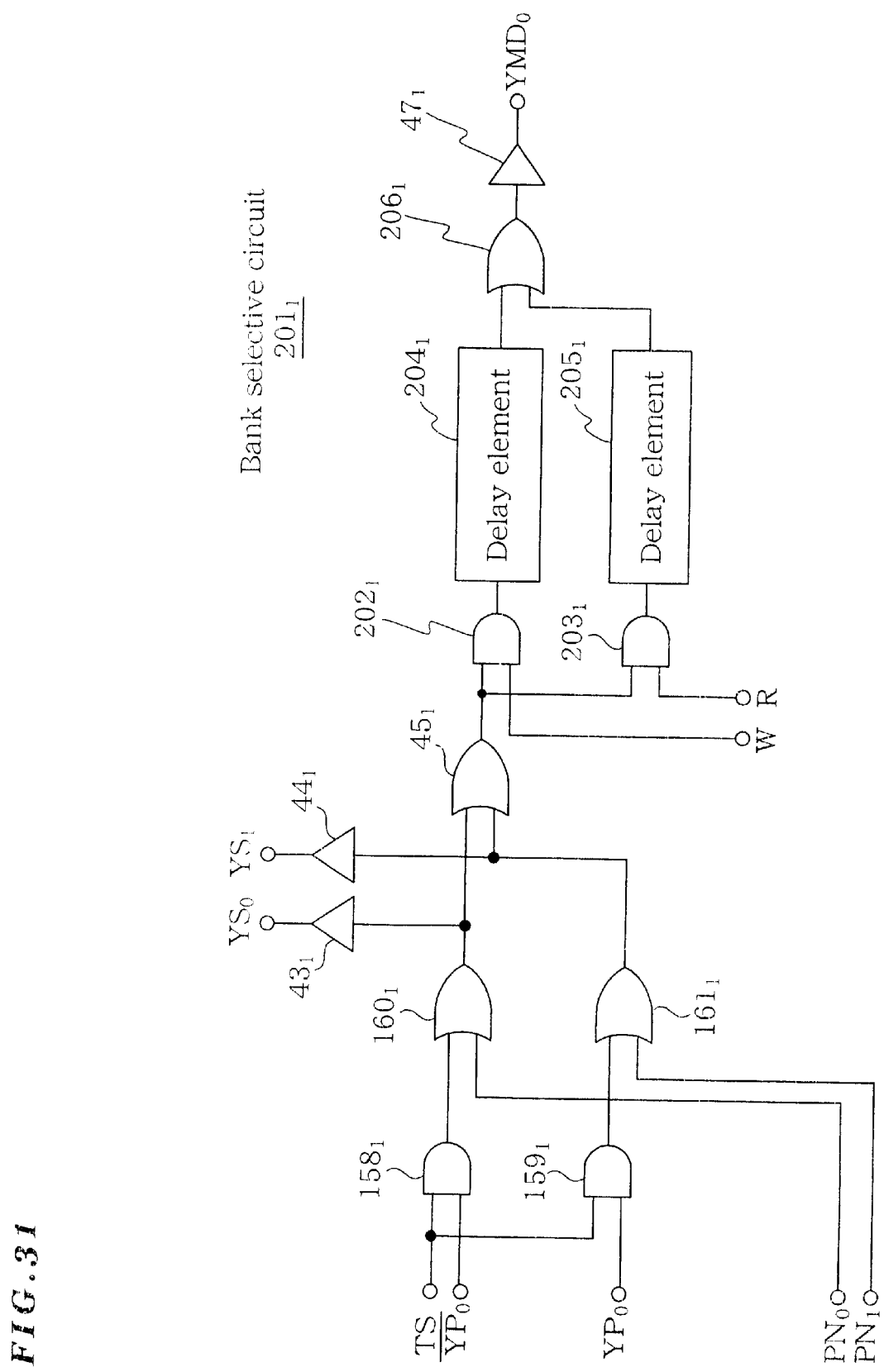
FIG. 31 a block diagram showing an example of the configuration of a bank select circuit configuring a semiconductor storage unit according to Embodiment 11 of the present invention.

Then, Embodiment 11 will be described. FIG. 31 is a circuit diagram showing a configurational example of bank selective circuit $201_1$ of a semiconductor storage unit according to Embodiment 11. In FIG. 31, like symbols are attached to parts corresponding to individual parts of FIG. 25 and a description thereof will be omitted. The bank selective circuit $201_1$ differs from the bank selective circuit $156_1$ shown in FIG. 25 in that an AND gate $202_1$ for making a logical product of an output signal of the OR gate $45_1$ and a write signal W supplied from the controller 157 configuring the peripheral circuit block 155, an AND gate $203_1$ for making a logical product of an output signal of the OR gate $45_1$ and a read signal R supplied from the controller 157 configuring the peripheral circuit block 155, a delay element $204_1$ for delaying an output signal of the AND gate $202_1$ for a predetermined time, a delay element $205_1$ for delaying an output signal of the AND gate $203_1$ for a predetermined time and an OR gate $206_1$ for making a logical sum of an output signal of the delay element $204_1$ and the delay element $205_1$ are anew provided in place of the delay element $46_1$ and in that an output signal of the OR gate $206_1$ is supplied to the input terminal of the buffer $47_1$. The delay amount of the delay element $204_1$ and that of the delay element $205_1$ are set to mutually different values corresponding to the difference of skew lags between the data write time and the data readout time to reduce a skew lag.

Incidentally, other constituents and operations of a semiconductor storage unit according to Embodiment 11 are much the same as those of a semiconductor storage unit according to Embodiment 6 (See FIGS. 2 and 24) and therefore a description thereof will be omitted.

Like this, according to this embodiment, a skew lag at the write time of data and a skew lag at the readout time of data are made separately reducible by the provision of delay elements $204_1$ and $205_1$ in the bank selective circuit $201_1$, thereby facilitating the design on the regulation of skew lags and enabling the write and readout of data to be carried out at high speed.

Heretofore, embodiments of the present invention have been described in details by referring to the drawings, but the specific configurations are not limited to these embodiments and changes and variations in design without departing from the spirit or scope of the following claims are included in the present invention.

In these embodiments, for example, applications of the present invention to nonsynchronous semiconductor storage units were shown, but the present invention is not limited to them and may be applied to a synchronous semiconductor storage unit, needless to say.

Figure 32:
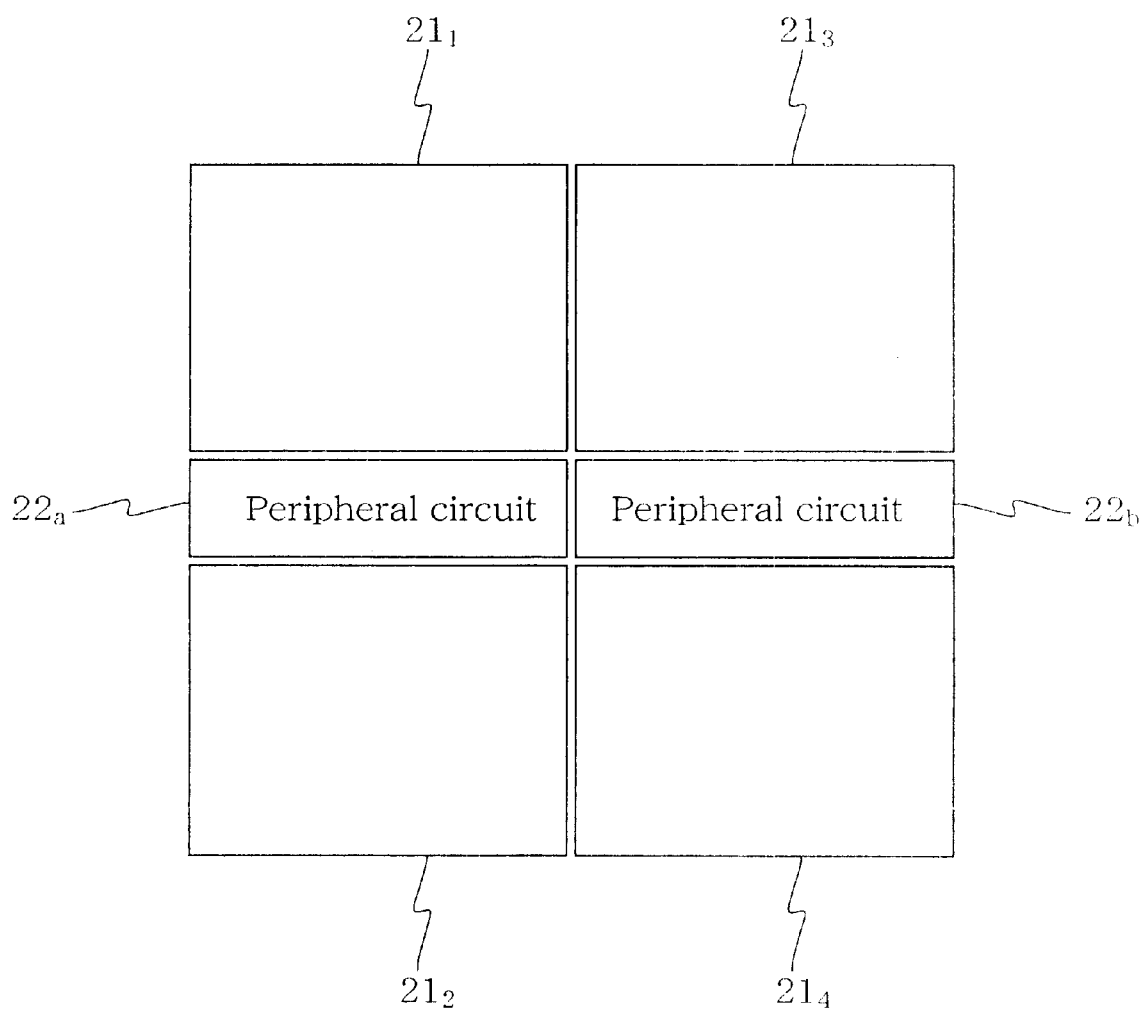
FIG. 32 is a schematic block diagram showing another example of the chip layout of the semiconductor storage unit according to the present invention.

Besides, in these embodiments, the chip layout is described to be the one shown in FIG. 2, but is not limited to this. As shown in FIG. 32, for example, the chip layout may be represented as comprising four functional blocks $21_1$ to $21_4$ and two peripheral circuit blocks $22a$ and $22b$.

Furthermore, in these embodiments, the bank blocks $23_1$ and $23_2$ were described to be related in the plane symmetry about a plane perpendicular to the sheet surface in the portion of the peripheral circuit block $24_1$ in a single functional block $21_1$ as shown in FIG. 2 (1) except for the word drivers $32_1$ and $32_2$ and the word drivers $32_3$ and $33_4$, but the present invention is not limited to this. In a single functional block $21_1$, for example, two bank blocks of the same shape as that of the bank block $23_1$ or the bank block $23_2$ may be arranged on both sides of the peripheral circuit block $24_1$. Also in the chip layout shown in FIG. 2 (2) and FIG. 32, all bank blocks may be identical or different in shape similarly. Still further, the arranging direction of bank blocks 23 and peripheral circuit blocks 24 may be horizontal, a direction turned for 90 degrees of FIG. 2 (2), not vertical as shown in FIG. 2 (2).

Besides, shown in these embodiment is a case where the banks $25_1$ to $25_4$ are respectively divided in two left-to-right, global I/O lines $26_1$ to $26_4$ are correspondingly disposed with I/O amplifiers $28_1$ to $28_4$ provided and precharge global I/O circuits $36_1$ to $36_4$ are respectively provided for individual global I/O lines $26_1$ to $26_4$, but the present invention is not limited to this and the number of divided banks $25_1$ to $25_4$, the number of accompanying global I/O lines $26_1$ to $26_4$, the number of I/O amplifiers $28_1$ to $28_4$, the number of their constituent write amplifiers and data amplifiers and the number of precharge global I/O lines $36_1$ to $36_4$ may be arbitrary. Similarly, the number of divided column decoder groups $35_1$ to $35_4$ and the number of their constituent column decoders may be arbitrary. Furthermore, the number of constituent memory cell arrays for one bank 25 may be also arbitrary. Besides, with respect to individual banks $25_1$ to $25_4$, no detailed description is found in FIGS. 1 and 2, but they may comprise subarrays or subword driver, for example, as disclosed in Japanese Patent Application No. 9-305505.

Furthermore, examples of 3-level convergence of wiring lines are shown in Embodiments 1 to 3, an example of reducing the number of activated memory cells in a bank relative to Embodiment 2 is shown in Embodiment 4, examples of tests by use of test signals for Embodiments 3 and 1 are respectively in Embodiments 5 and 6 and examples of reducing a skew lag for Embodiment 1, Embodiments 2 and 4, Embodiment 3, Embodiment 5 and Embodiment 6 are respectively shown in Embodiments 7 to 11, but the present invention is not limited to this. In other words, an arrangement of reducing the number of memory cells in a bank, activated by use of address signals, according to Embodiment 4 may be applied to Embodiments 1 and 3 and an arrangement of tests by use of test signals according to Embodiment 5 and 6 may be applied to Embodiments 2 and 4.

Besides, in the description of operations for these embodiments, a description was made only of the write of data into the bank $25_1$ and readout of data from the bank $25_2$, the write of data into the bank $25_1$ and readout of data from the bank $25_1$ and the continuous read of data from the bank $25_1$ and $25_2$ as variations of operations, but the present invention is not limited to this. Namely, the present invention is also applicable to the readout of data from the bank $25_1$ and write of data into the bank $25_2$, the continuous write of data into the bank $25_1$ and the bank $25_2$ or inverted operation in the sequence of an access to the bank $25_2$ and an access to the bank $25_1$, a forced access to the latter on account of occurrence of an interruption during the access to the conventional or the like.

Incidentally, in case of occurrence of an interruption, the read/write of the remaining data from/into the access-interrupted bank is disabled.

Furthermore, in Embodiments 7 to 11, examples of read signals R and write signals W being independent with each other are shown, but the present invention is not limited to this and one signal may be the inverted of another and a write burst signal WBT outputted from a controller and its inverted signal may be employed instead, According to one arrangement of the present invention, as described above, the number of wiring lines can be reduced. Thereby, the chip area of a semiconductor storage unit can be further reduced. Besides, according to another arrangement of the present invention, tests such as fault analysis can be made normally in a short time. Furthermore, according to yet another arrangement of the present invention, the number of activated memory cells in a bank can be reduced.

Still further, according to yet another arrangement of the present invention, a skew lag at the time of data write and a skew lag at the time of data readout are respectively reduced separately, the design on the regulation of skews is facilitated and simultaneously the collision of data on a data I/O bus can be prevented. Besides, in particular, the write and read of data during the switching period of control over two banks becomes executable at high speed. Furthermore, the importance is in that the connection to a local I/O line and to a global I/O line is switchable without damages to data.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-331793 (Filed on Nov. 20, 1998) including specification, claims, drawings and summary are incorporated herein by reference in its entirety.

What is claimed is:

1. A semiconductor storage unit comprising:
a plurality of bank blocks including a plurality of banks that are adjacent to each other and have a memory cell array including a plurality of memory cells placed in a matrix form, a plurality of global I/O lines provided in parallel to an arranging direction of said banks and in common therewith for conveying data read out from any of the memory cells in the memory cell array configuring said plurality of banks, or data to be written in any individual one of the plurality of memory cells, a plurality of I/O amplifiers connected to individual ones of the plurality of global I/O lines for amplifying data conveyed by corresponding ones of the plurality of global I/O lines, or data to be conveyed from an individual global I/O line to a corresponding global I/O line, and a plurality of column decoders provided in common with said plurality of banks for respectively outputting a plurality of column selection switches for setting selected ones of a plurality of bit lines corresponding to the memory cell array configuring any one of the plurality of banks at the selected state; and
a plurality of bank selective circuits, provided in common with banks configuring the corresponding bank block for each of said bank blocks which create a column decoder activation signal for activating the corresponding column decoder on the basis of at least one multi-bit bank address signal for selecting any individual one of all banks configuring said bank blocks and an I/O amplifier activation signal for activating at least a corresponding one of the plurality of I/O amplifiers.

2. The semiconductor storage unit as set forth in claim 1, wherein said bank selective circuits creates said column decoder activation signal and said I/O amplifier activation signal in accordance with a bank block selection signal for selecting a corresponding bank block, said column decoder signal being created from a part of a plurality of bits used in configuring said multi-bit bank address signal.

3. The semiconductor storage unit as set forth in claim 1, wherein in place of said column decoder activating signal and said I/O amplifier activation signal, said bank selective circuits output the respective signals making logical sums of the multi-bits corresponding to the banks configuring the bank block of multi-bit column address signals with said column decoder activating signal and said I/O amplifier activation signal.

4. The semiconductor storage unit as set forth in claim 1, wherein said bank blocks each comprises a connection selective circuit with a plurality of local I/O lines provided perpendicularly to said global I/O lines for said individual memory cell array and connected to the corresponding global I/O line so as to convey data read from any of the memory cells or data to be written into any of the memory cells in the corresponding memory cell array that selects the connection between said local I/O lines and their corresponding global I/O lines at predetermined intervals on the basis of said column decoder activating signal.

5. The semiconductor storage unit asset forth in claim 1, wherein said bank selective circuits output said I/O amplifier activation signal after the delay of a predetermined time from the input of said multi-bit bank address signal.

6. The semiconductor storage unit as set forth in claim 5, wherein with the difference of a predetermined time between the write time of data and the readout time of data, said bank selective circuits output said I/O amplifier activation signal.

7. The semiconductor storage unit as set forth in claim 1, wherein said bank selective circuits makes a logical sum of bank selection signals for selecting any one of the banks configuring the corresponding bank block created from said multi-bit bank address signal and creates said I/O amplifier activation signal.

8. The semiconductor storage unit as set forth in claim 7, wherein said bank selective circuits makes a logical sum of bank selection signals for selecting any one of the banks configuring the corresponding bank block created from said multi-bit bank address signal and creates said column decoder activation signal.

9. The semiconductor storage unit as set forth in claim 7, wherein
in place of said column decoder activating signal and said I/O amplifier activation signal, said bank selective circuits output the respective signals making logical sums of the multi-bits corresponding to the banks configuring the bank block of multi-bit column address signals with said column decoder activating signal and said I/O amplifier activation signal.

10. The semiconductor storage unit as set forth in claim 7, wherein said bank blocks each comprises a connection selective circuit with a plurality of local I/O lines provided perpendicularly to said global I/O lines for said individual memory cell array and connected to the corresponding global I/O line so as to convey data read from any of the memory cells or data to be written into any of the memory cells in the corresponding memory cell array that selects the connection between said local I/O lines and their corresponding global I/O lines at predetermined intervals on the basis of said column decoder activating signal.

11. The semiconductor storage unit as set forth in claim 7, wherein said bank selective circuits output said I/O amplifier activation signal after the delay of a predetermined time from the input of said multi-bit bank address signal.

12. The semiconductor storage unit as set forth in claim 11, wherein with the difference of a predetermined time between the write time of data and the readout time of data, said bank selective circuits output said I/O amplifier activation signal.

13. The semiconductor storage unit as set forth in claim 1, wherein said bank selective circuits makes a logical sum of bank selection signals for selecting any one of the banks configuring the corresponding bank block created from said multi-bit bank address signal and creates said column decoder activation signal.

14. The semiconductor storage unit as set forth in claim 13, wherein
in place of said column decoder activating signal and said I/O amplifier activation signal, said bank selective circuits output the respective signals making logical sums of the multi-bits corresponding to the banks configuring the bank block of multi-bit column address signals with said column decoder activating signal and said I/O amplifier activation signal.

15. The semiconductor storage unit as set forth in claim 13, wherein said bank blocks each comprises a connection selective circuit with a plurality of local I/O lines provided perpendicularly to said global I/O lines for said individual memory cell array and connected to the corresponding global I/O line so as to convey data read from any of the memory cells or data to be written into any of the memory cells in the corresponding memory cell array that selects the connection between said local I/O lines and their corresponding global I/O lines at predetermined intervals on the basis of said column decoder activating signal.

16. The semiconductor storage unit as set forth in claim 13, wherein said bank selective circuits output said I/O amplifier activation signal after the delay of a predetermined time from the input of said multi-bit bank address signal.

17. The semiconductor storage unit as set forth in claim 16, wherein with the difference of a predetermined time between the write time of data and the readout time of data, said bank selective circuits output said I/O amplifier activation signal.

18. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits comprises a test circuit that makes a logical product of a test signal for accomplishing a fault analysis or an estimation test with a bank selection signal or a bank block selection signal to create at least one of said I/O amplifier activation signal or said column decoder activation signal and make a logical sum between the respective signals making a logical product of said test signal with the multi-bits corresponding to the banks configuring the bank block of a multi-bit column address signal and the signal making a logical product of the inverted signal of said test signal with said column decoder activation signal to create a second column decoder activation signal for each bank.

19. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits makes a logical sum of bank selection signals for selecting any one of the banks configuring the corresponding bank block created from said multi-bit bank address signal and creates said I/O amplifier activation signal, wherein said bank selective circuits comprises a test circuit that make a logical sum of a test signal for accomplishing a fault analysis or an estimation test with said bank selection signal or a bank block selection signal to create at least one of said I/O amplifier activation signal or said column decoder activation signal and make a logical sum between the respective signals making a logical product of said test signal with the multi-bits corresponding to the banks configuring the bank block of a multi-bit column address signal and the signal making a logical product of the inverted signal of said test signal with said column decoder activation signal to create a second column decoder activation signal for each bank.

20. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits makes a logical sum of bank selection signals for selecting any one of the banks configuring the corresponding bank block created from said multi-bit bank address signal and creates said column decoder activation signal, wherein said bank selective circuits comprises a test circuit that make a logical sum of a test signal for accomplishing a fault analysis or an estimation test with said bank selection signal or a bank block selection signal to create at least one of said I/O amplifier activation signal or said column decoder activation signal and make a logical claim between the respective signals making a logical product of said test signal with the multi-bits corresponding to the banks configuring the bank blocks of a multi-bit column address signal and the signal making a logical product of the inverted signal of said test signal with said column decoder activation signal to create a second column decoder activation signal for each bank.

21. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array confiding said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits make a logical sum between the respective signals making a logical product of a test signal for accomplishing a fault analysis or an estimation test with the multi-bits corresponding to the banks configuring the bank block of a multi-bit column address signal and a bank selection signal or a bank block selection signal to create least one of said I/O amplifier activation signal or said column decoder activation signal.

22. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits makes a logical sum of bank selection signals for selecting any one of the banks configuring the corresponding bank block created from said multi-bit bank address signal and creates said PO amplifier activation signal, wherein said bank selective circuits make a logical sum between the respective signals making a logical product of a test signal for accomplishing a fault analysis or an estimation test with the multi-bits corresponding to the banks configuring the bank block of a multi-bit column address signal and said bank selection signal or a bank block selection signal to create at least one of said I/O amplifier activation signal or said column decoder activation signal.

23. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks confiding said bank blocks and an I/O amplifier activation signal for activating a corresponding I/O amplifier, wherein said bank selective circuits makes a logical sum of bank selection signals for selecting any one of the banks configuring the corresponding bank block created from said multi-bit bank address signal and creates said column decoder activation signal, wherein said bank selective circuits make a logical sum between the respective signals making a logical product of a test signal for accomplishing a fault analysis or an estimation test with the multi-bits corresponding to the banks configuring the bank block of a multi-bit column address signal and said bank selection signal or a bank block selection signal to create at least one of said I/O amplifier activation signal or said column decoder activation signal.

24. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, further comprising: an initialization circuit, provided corresponding to said global I/O lines, for short-circuiting and initializing the corresponding global I/O line on the basis of said column decoder activating signal at the time of switchover from the readout of data from a certain bank to the readout of data from another bank in a continuous readout case of data from a plurality of banks configuring one and the same bank block.

25. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an I/O amplifier activation signal for activating a corresponding I/O amplifier, wherein said bank selective circuits makes a logical sum of bank selection signals for selecting any one of the banks configuring the corresponding bank block created from said multi-bit bank address signal and creates said I/O amplifier activation signal, further comprising: an initialization circuit, provided corresponding to said global I/O lines for short-circuiting and initializing the corresponding global I/O line on the basis of said column decoder activating signal at the time of switchover from the readout of data from a certain bank to the readout of data from another bank in a continuous readout case of data from a plurality of banks configuring one and the same bank block.

26. A semiconductor storage unit comprising:

a plurality of bank blocks including a plurality of banks that are adjacent to each other and have a memory cell array including a plurality of memory cells placed in a matrix form, a plurality of global I/O lines provided in parallel to the arranging direction of said banks and in common therewith for conveying data read out from any of the memory cells in the memory array configuring said banks or data to be written in any of the memory cells, a plurality of I/O amplifiers connected to individual global I/O lines for amplifying data conveyed by corresponding global I/O lines or data to be conveyed from one global I/O line to a corresponding global I/O line, and a plurality of column decoders provided in common with said banks for respectively outputting a plurality of column selection switches for setting the bit lines corresponding to the memory cell array configuring any of the banks at the selected state; and a plurality of bank selective circuits, provided in common with banks configuring the corresponding bank block for each of said bank blocks which create a column decoder activation signal for activating the corresponding column decoder on the basis of multi-bit bank address signal for selecting any one of all banks configuring said bank blocks and an PO amplifier activation signal for activating a corresponding I/O amplifier, wherein said bank selective circuits makes a logical sum of bank selection signals for selecting any one of the banks configuring the corresponding bank block created from said multi-bit bank address signal and creates said column decoder activation signal, further comprising: an initialization circuit, provided corresponding to said global I/O line for short-circuiting and initializing the corresponding global I/O line on the basis of said column decoder activation signal at the time of switchover from the readout of data from a certain bank to the readout of data from another bank in a continuous readout case of data from a plurality of banks configuring one and the same block.

* * * * *